(12) United States Patent
Nishida et al.

(10) Patent No.: US 6,518,625 B1
(45) Date of Patent: *Feb. 11, 2003

(54) SEMICONDUCTOR DEVICE

(75) Inventors: Yukio Nishida, Hyogo (JP); Satoshi Shimizu, Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 621 days.

(21) Appl. No.: 08/990,754

(22) Filed: Dec. 15, 1997

(30) Foreign Application Priority Data

Jun. 18, 1997 (JP) .............................................. 9-161488

(51) Int. Cl.[7] .............................................. H01L 29/76
(52) U.S. Cl. ........................ 257/344; 257/408; 257/345
(58) Field of Search ................................. 257/344, 345, 257/336, 337, 408, 409; 438/301, 302, 303, 304, 305, 306

(56) References Cited

U.S. PATENT DOCUMENTS

| | | | | |
|---|---|---|---|---|
| 4,597,824 A | * | 7/1986 | Shinada et al. ............. | 257/336 |
| 4,949,136 A | | 8/1990 | Jain | |
| 5,320,974 A | * | 6/1994 | Hori et al. .................. | 438/302 |
| 5,340,760 A | * | 8/1994 | Komori et al. ............. | 438/305 |
| 5,428,240 A | * | 6/1995 | Lur ............................. | 257/408 |
| 5,623,154 A | * | 4/1997 | Murakami et al. .......... | 257/345 |
| 5,757,045 A | * | 5/1998 | Tsai et al. ................... | 257/336 |
| 5,793,089 A | * | 8/1998 | Fulford, Jr. et al. ........ | 257/408 |

FOREIGN PATENT DOCUMENTS

| | | |
|---|---|---|
| JP | 6-53233 | 2/1994 |
| JP | 7-249761 | 9/1995 |
| JP | 7-263690 | 10/1995 |

* cited by examiner

*Primary Examiner*—Tom Thomas
*Assistant Examiner*—Ori Nadav
(74) *Attorney, Agent, or Firm*—McDermott, Will & Emery

(57) ABSTRACT

An n-type impurity layer is formed on a boundary portion between a source/drain and a field oxide film in a portion deeper than the source/drain. Even if a metal silicide layer such as a Co silicide layer extends into a portion under the field oxide film or an end portion of the field oxide film is eroded, therefore, the metal silicide layer is not directly connected to a well, a channel cut injection layer or a channel injection layer and the distance between a pn junction formed by the source/drain and the well and an end portion of the metal silicide layer is not reduced, whereby reliability of an element operation is improved such that a leakage current is suppressed while maintaining the depth of the source/drain. Thus obtained are a semiconductor device and a method of fabricating the same which can attain a high-speed operation without increasing the depth of the source/drain while maintaining a sufficient contact width and can reduce a junction leakage current with no deterioration of the element characteristics following refinement.

7 Claims, 30 Drawing Sheets

SEMICONDUCTOR DEVICE

BACKGROUND OF THE INVENTION

1. Field of the Invention

The present invention relates to a semiconductor device and a method of fabricating the same, and more particularly, it relates to a semiconductor device which is reduced in resistance by a salicide structure and a method of fabricating the same.

2. Description of the Background Art

In recent years, LSIs are refined due to the development of designs of integrated circuits and process techniques to enable fabrication of high-density integrated circuits, while high-speed operations are strongly required particularly in logic circuits. Reduction of resistance is effective means for attaining a high-speed operation, and reduction of contact resistance is attained by a salicide (self-aligned silicide) structure provided with low-resistance layers on contact parts of a source/drain and a gate electrode.

FIG. 55 is a sectional view of an element showing a conventional semiconductor device of a salicide structure. A p well 103 is formed on a surface of a semiconductor substrate 101. A field oxide film 102 is formed on an isolation region of the semiconductor substrate 101, so that a MOS (metal oxide semiconductor) transistor is formed in an active region which is enclosed with the field oxide film 102.

This MOS transistor has a pair of n-type extension layers 109, a pair of sources/drains 1010, a gate insulator film 106, and a gate electrode 107. The pair of n-type extension layers 109 are formed on the surface of the semiconductor substrate 101 at a prescribed distance, and the sources/drains 1010 are also formed on the surface of the semiconductor substrate 101 to be adjacent to the n-type extension layers 109. The n-type extension layers 109 and the sources/drains 1010 form an LDD (lightly doped drain) structure. The gate electrode 107 is formed on a region held between the pair of n-type extension layers 109 through the gate insulator film 106, and side surfaces of the gate electrode 107 are covered with side walls 108.

Metal silicide layers 1011 are formed on the gate electrode 107 and the sources/drains 1010, to be in contact therewith respectively.

A channel cut injection layer 104 is formed to be in contact with the lower surface of the field oxide film 102 in the isolation region and positioned at a prescribed depth from the surface of the semiconductor substrate 101 in the active region. Further, a channel injection layer 105 is formed in the active region on a shallower position than the channel cut injection layer 104.

An interlayer isolation film 1016 is formed to cover the MOS transistor, and provided with contact holes reaching the metal silicide layers 1011. Contacts 1017 are formed to fill up the contact holes.

As shown in FIG. 55, the metal silicide layers 1011 are formed between the contacts 1017 and the sources/drains 1010, thereby reducing the resistance. The metal silicide layers 1011 may be prepared from a metal such as Co, Ni, Ti, W or Pt.

In the conventional semiconductor device, however, it is so difficult to completely;control the shape of each metal silicide layer 1011 that the same may extend into a portion under the field oxide film 102 along the boundary between the field oxide film 102 and each source/drain 1010, as shown in FIG. 56. This phenomenon remarkably takes place particularly when the metal silicide layer 1011 is prepared from a metal such as Co or Ni serving as a diffusion species when reacting with silicon.

Thus, the distance between a pn junction formed by each source/drain 1010 and the p well 103 and an end portion of the metal silicide layer 1011 may be reduced, or the metal silicide layer 1011 may project beyond the source/drain 1010, to result in direct connection between the metal silicide layer 1011 and the p well 103, the channel cut injection layer 104 or the channel injection layer 105 formed in the semiconductor substrate 101.

When a metal film is formed after formation of an isolation insulator film, an end portion of the field oxide film 102 may be eroded by wet etching performed before formation of the metal film for removing a natural oxide film, as shown in FIG. 57.

When the end portion of the field oxide film 102 is eroded, a surface part of the semiconductor substrate 101 may be exposed on this portion, to result in direct connection between each metal silicide layer 1011 and the p well 103, the channel cut injection layer 104 or the channel injection layer 105 formed in the semiconductor substrate 101, or reduction of: the distance between the pn junction formed by each source/drain 101 and the p well 103 and the end portion of the metal silicide layer 1011.

Also when trench isolation is employed, a metal silicide layer 1011 may extend into a portion under an end portion of a buried oxide film 1018 as shown in FIG. 58 or the end portion of the buried oxide film 1018 may be eroded as shown in FIG. 59, if the metal silicide layer 1011 is prepared from Co or Ni. Thus, the distance between a pn junction formed by a source/drain 1010 and a p well 103 and an end portion of the metal silicide layer 1011 may be reduced or the metal suicide layer 1011 may project beyond the source/drain 1010, to result in direct connection between the metal silicide layer 1011 and the p well 103, a channel cut injection layer 104 or a channel injection layer 105 formed in the semiconductor substrate 101.

If the metal silicide layer 1011 projects beyond the source/drain 1010 to be directly connected with the p well 103, the channel cut injection layer 104 or the channel injection layer 105, a leakage current flows between the source/drain 1010 and the p well 103 upon application of a voltage, to extremely reduce the reliability of the element.

Also when the distance between the pn junction formed by the source/drain 1010 and the p well 103 and the metal silicide layer 1011 is reduced a depletion layer grows due to voltage application, and hence the metal silicide layer 1011 is disadvantageously electrically connected with the p well 103 to increase the leakage current and reduce the reliability of the element.

To this end, low-concentration n-type impurity layers 1091 are formed to attain reduction of the leakage current, as shown in FIG. 60. This technique is disclosed in U.S. Pat. No. 4,949,136, for example.

In such a structure, however, punch-through disadvantageously takes place if the low-concentration n-type impurity layers 1091 are deeply formed for preventing projection of metal silicide layers 1011 on end portions of a field oxide film 102.

In this structure, further, punch-through readily takes place if side walls 108 and 1081 are reduced in thickness. If the side walls 108 and 1081 are increased in thickness, on the other hand, exposed surface parts of sources/drains 1010 are so reduced that the resistance is disadvantageously increased due to insufficient contact.

SUMMARY OF THE INVENTION

An object of the present invention is to provide a semiconductor device which can reduce a junction leakage current while maintaining a sufficient contact width without increasing the depth of a source/drain, for attaining a high-speed operation with no deterioration of its element characteristics following refinement, and a method of fabricating the same.

A semiconductor device according to the present invention comprises a first conductivity type semiconductor substrate, an isolation insulator film which is formed on an isolation region of a major surface of the semiconductor substrate, a second conductivity type source and a second conductivity type drain which are formed at an active region enclosed with the isolation region on the major surface of the semiconductor substrate, a gate electrode which is formed on a major surface of the active region through a gate insulator film, metal compound layers which are formed on surfaces of the source, the drain and the gate electrode respectively, and second conductivity type first impurity layers which are formed on boundary portions between the source and the drain and the isolation region to be deeper than the source and the drain.

The inventive semiconductor device having the aforementioned structure attains the following effect:

Each first impurity layer of the same conductivity type as the source/drain is formed on the boundary portion between the source/drain and the field oxide film in a portion deeper than the source/drain in the semiconductor device according to the present invention, whereby the semiconductor substrate is connected with no metal compound layer even if any metal compound layer extends into a portion under the isolation insulator film or an end portion of the isolation insulator film is eroded, and the reliability of the element operation is improved such that a leakage current is suppressed while maintaining the depth of the source/drain.

In the aforementioned aspect, the semiconductor device preferably further comprises a first conductivity type second impurity layer having an impurity concentration peak, which is formed to be deeper than the first impurity layers and to be in contact with the bottom surface of the isolation insulator film.

The second impurity layer of the same conductivity type as the semiconductor substrate is formed to be in contact with the bottom surface of the isolation insulator film, whereby formation of a parasitic transistor can be prevented.

In the aforementioned aspect, the second impurity layer is preferably formed only under the isolation insulator film.

The second impurity layer is formed only under the isolation insulator film, whereby the area of the second impurity layer is reduced to reduce the junction capacity to attain a high-speed operation, while the second impurity layer is prevented from influencing a threshold voltage, whereby the reliability of the element is further improved.

In the aforementioned aspect, the semiconductor device preferably further comprises side wall insulator films which are formed on side: surfaces of the gate electrode, a pair of second conductivity type third impurity layers which are formed under the respective side wall insulator films at the major surface of the active region to be shallower than the source and the drain, and first conductivity type fourth impurity layers which are formed to enclose the third impurity layers respectively.

The first conductivity type fourth impurity layers are formed to enclose the second conductivity type third impurity layers, whereby punch-through is suppressed, increase of the junction capacity and the junction leakage current is also suppressed and a load is reduced, to enable a high-speed circuit operation.

In the aforementioned aspect, the isolation insulator film is at least either a field oxide film or a buried oxide film filling up a trench provided at the major surface of the semiconductor substrate, and the metal compound layers are Co silicide layers.

The impurity layer of the same conductivity type as the source/drain is formed on the boundary portion between the source/drain and the isolation insulator film in a portion deeper than the source/drain, whereby the semiconductor substrate is connected with no metal silicide layer even if any metal silicide layer such as a Co silicide layer or an Ni silicide layer extends into a portion under the field oxide film or the buried oxide film, and the reliability of the element operation is improved such that the leakage current is suppressed while maintaining the depth of the source/drain.

In the aforementioned aspect, it is preferable that the second conductivity type is an n type, the first conductivity type is a p type, the source/drain and the third impurity layers are made of arsenic, and the first impurity layers are made of phosphorus.

The leakage current is further suppressed since n-type impurity layers are deeply formed with phosphorus which is easy to diffuse, while punch-through is suppressed since the source/drain and an n-type extension layer are shallowly formed with arsenic which is hard to diffuse.

According to another aspect of the present invention, a method of fabricating a semiconductor device comprises steps of forming an isolation insulator film on an isolation region of a major surface of a first conductivity type semiconductor substrate, forming a gate electrode on a major surface of an active region enclosed with the insolation region through a gate insulator film, forming a source and a drain at the major surface of the semiconductor substrate, epitaxially growing silicon layers on surfaces of the gate electrode, the source and the drain, forming first impurity layers on boundary portions between the source and the drain and the isolation region to be deeper than the source and the drain by injecting a second impurity, and forming metal compound layers on the surfaces of the gate electrode, the source and the drain.

The first impurity layers are formed under end portions of the isolation insulator film in a self-aligned manner by the silicon layers formed on the surfaces of the gate electrode and the source/drain in a self-aligned manner and the isolation insulator film having a large thickness on a central portion and a small thickness on the end portions. Thus, it is possible to obtain a method of fabricating a semiconductor device which is improved in reliability of its element operation through simplified steps.

In the aforementioned aspect, the method preferably further comprises a step of forming a second impurity layer having an impurity concentration peak to be deeper than the first impurity layers and to be in contact with the bottom surface of the isolation insulator film by injecting a first conductivity type impurity into the overall surface.

The second impurity layer, of the same conductivity type as the semiconductor substrate is formed in a self-aligned manner to be in contact with the bottom surface of the isolation insulator film. Thus, it is possible to obtain a method of fabricating a semiconductor device suppressing formation of a parasitic transistor through simplified steps.

In the aforementioned aspect, the step of forming the isolation insulator film preferably includes steps of forming a trench at the major surface of the semiconductor substrate through a mask of a silicon nitride film, forming an insulator film on the overall surface to fill up the trench, and etching back the insulator film and the silicon nitride film, and the method preferably further comprises a step of forming a second impurity layer having an impurity concentration peak on the bottom surface of the trench by injecting a first conductivity type impurity following the step of forming the trench.

Thus, the area of the second impurity layer is reduced to reduce the junction capacity, whereby it is possible to obtain a method of fabricating a semiconductor device which can attain a high-speed operation. In addition, the second impurity layer is prevented from influencing a threshold voltage, whereby it is possible to obtain a method of fabricating a semiconductor device which is further improved in element reliability.

In the aforementioned aspect, the method preferably further comprises steps of forming a pair of second impurity layers at the major surface of the semiconductor substrate at a prescribed space by injecting a second conductivity type impurity into the overall surface after forming the gate electrode, forming first conductivity type third impurity layers to enclose the second impurity layers respectively, forming side walls on side surfaces of the gate electrode, and forming a source and a drain to be deeper than the second impurity layers by injecting a second conductivity type impurity into the overall surface.

The first conductivity type third impurity layers are formed to enclose the second conductivity type second impurity layers, whereby punch-through is suppressed, increase of the junction capacity and the junction leakage current is suppressed and the load is reduced. Thus, it is possible to obtain a method of fabricating a semiconductor device enabling a high-speed circuit operation.

According to still another aspect of the present invention, a method of fabricating a semiconductor device comprises steps of forming a silicon nitride film on an active region of a major surface of a first conductivity type semiconductor substrate, forming an isolation insulator film on an isolation region through the silicon nitride film serving as a mask, forming a gate electrode on the major surface of the semiconductor substrate through a gate insulator film by etching a gate electrode forming region of the silicon nitride film, forming second conductivity type first impurity layers by injecting a second conductivity type impurity, removing the silicon nitride film, forming a source and a drain at the major surface of the semiconductor substrate, and forming metal compound layers on surfaces of the gate electrode and the source and the drain, and the first impurity layers are formed on boundary portions between the source and the drain and the isolation region to be deeper than the source and the drain.

The first impurity layers are formed under end portions of the isolation insulator film in a self-aligned manner by the silicon nitride film formed for forming the isolation insulator film, whereby it is possible to obtain a method of fabricating a semiconductor device which is improved in reliability of its element operation through simplified steps.

In the aforementioned aspect, the method preferably further comprises a step of forming a second impurity layer having an impurity concentration peak to be deeper than the first impurity layers and to be in contact with the bottom surface of the isolation insulator film by injecting a first conductivity type impurity into the overall surface.

The second impurity layer of the same conductivity type as the semiconductor substrate is formed in a self-aligned manner to be in contact with the bottom surface of the isolation insulator film, whereby it is possible to obtain a method of fabricating a semiconductor device suppressing formation of a parasitic transistor through simplified steps.

In the aforementioned aspect, the step of forming the isolation insulator film preferably has steps of forming a trench at the major surface of the semiconductor substrate through the silicon nitride film serving as a mask, forming an insulator film on the overall surface to fill up the trench, and etching back the insulator film and the silicon nitride film, and the method preferably further comprises a step of forming a second impurity layer having an impurity concentration peak at the bottom surface of the trench by injecting a first conductivity type impurity following the step of forming the trench.

Thus, the area of the second impurity layer is reduced to reduce the junction capacity and it is possible to obtain a method of fabricating a semiconductor device which can attain a high-speed operation. In addition, the second impurity layer is prevented from influencing a threshold voltage, whereby it is possible to obtain a method of fabricating a semiconductor device further improved in element reliability.

In the aforementioned aspect, the method preferably further comprises steps of forming a pair of second impurity layers at the major surface of the semiconductor substrate at a prescribed space by injecting a second conductivity type impurity into the overall surface after forming the gate electrode, forming first conductivity type third impurity layers to enclose the second impurity layers respectively, forming side walls on side surfaces of the gate electrode, and forming a source and a drain to be deeper than the second impurity layers by injecting a second conductivity type impurity into the overall surface.

The first conductivity type third impurity layers are formed to enclose the second conductivity type second impurity layers, whereby punch-through is suppressed, increase of the junction capacity and the junction leakage current is suppressed and the load is reduced, and it is possible to obtain a method of fabricating a semiconductor device enabling a high-speed circuit operation.

In the aforementioned aspect, the method preferably further comprises a step of forming a second impurity layer having an impurity concentration peak by etching the gate electrode forming region of the silicon nitride film and injecting a first conductivity type impurity into the overall surface.

A channel injection layer is formed not under the source/drain but only under the gate electrode in a self-aligned manner, whereby increase of the junction capacity and the junction leakage current is suppressed and the load is reduced, to enable a high-speed circuit operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
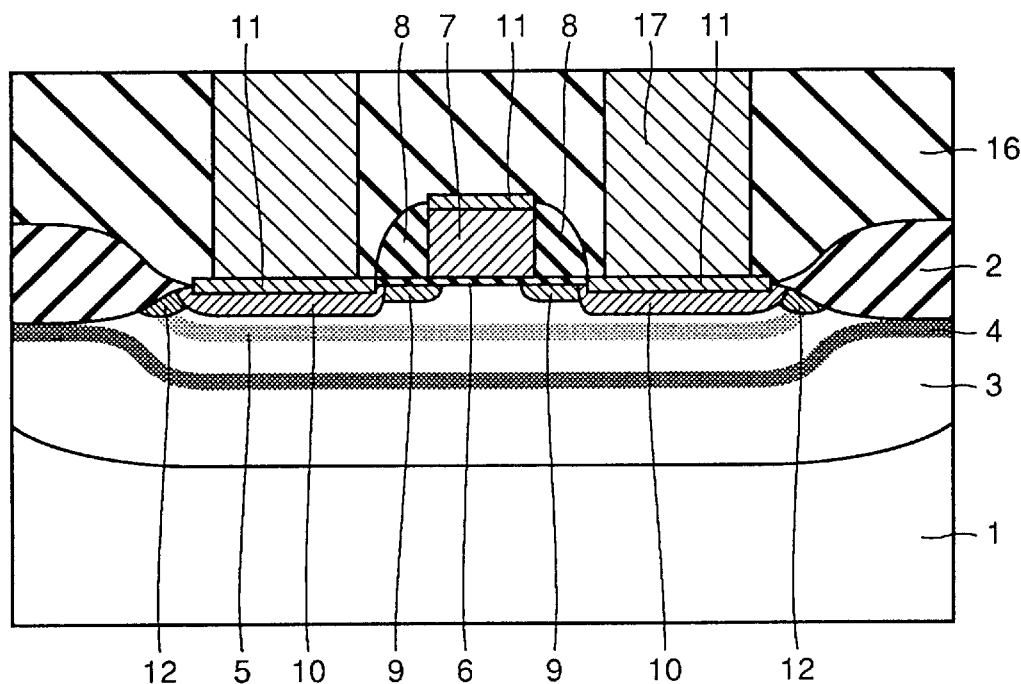
FIG. 1 is a sectional view showing an element of a semiconductor device according to an embodiment 1 of the present invention.

Referring to FIG. 1, a p well 3 is formed on a surface of a semiconductor substrate 1. A field oxide film 2 is formed on an isolation region of the semiconductor substrate 1, so that a MOS transistor is formed in an active region enclosed with the field oxide film 2. The MOS transistor is provided with a pair of n-type extension layers 9, a pair of sources/drains 10, a gate insulator film 6, and a gate electrode 7. The pair of n-type extension layers 9 are formed on the surface of the semiconductor substrate 1 at a prescribed distance, and the sources/drains 10 are also formed on the surface of the semiconductor substrate 1 to be adjacent to the n-type extension layers 9. The n-type extension layers 9 and the sources/drains 10 form an LDD structure. The gate electrode 7 is formed on a region enclosed with the pair of n-type extension layers 9 through the gate insulator film 6, and side surfaces of the gate electrode 8 are covered with side walls 8.

Metal silicide layers such as Co silicide layers 11, for example, are formed on the gate electrode 7 and the sources/drains 10, to be in contact therewith.

A channel cut injection layer 4 is formed to be in contact with the lower surface of the field oxide film 2 in the isolation region and positioned at a prescribed depth from the surface of the semiconductor substrate 1 in the active region. Further, a channel injection layer 5 is formed in the active region on a shallower position than the channel cut injection layer 4.

An interlayer isolation film 16 is formed to cover the MOS transistor, and provided with contact holes reaching the metal silicide layers 11. Contacts 17 are formed to fill up the contact holes.

The semiconductor device according to this embodiment having the aforementioned structure is further provided with n-type impurity layers 12. The n-type impurity layers 12 are formed to be adjacent to the sources/drains 10 and to be in contact with lower surfaces of end portions of the field oxide film 2.

FIG. 1 shows an nMOS transistor element. The boron concentration of the p well 3 is about $1\times10^{17}$ to $1\times10^{18}/cm^3$, the boron peak concentrations of the channel cut injection layer 4 and the channel injection layer 5 are about $1\times10^{17}$ to $1\times10^{18}/cm^3$ and about $1\times10^{17}$ to $1\times10^{18}/cm^3$ respectively, the arsenic concentrations of the n-type extension layers 9 and the sources/drains 10 are about $1\times10^{18}$ to $1\times10^{19}/cm^3$ and about $1\times10^{21}$ to $1\times10^{22}/cm^3$ respectively, and the phosphorus concentration of the n-type impurity layers 12 is about $1\times10^{18}$ to $1\times10^{19}/cm^3$.

Figure 2:
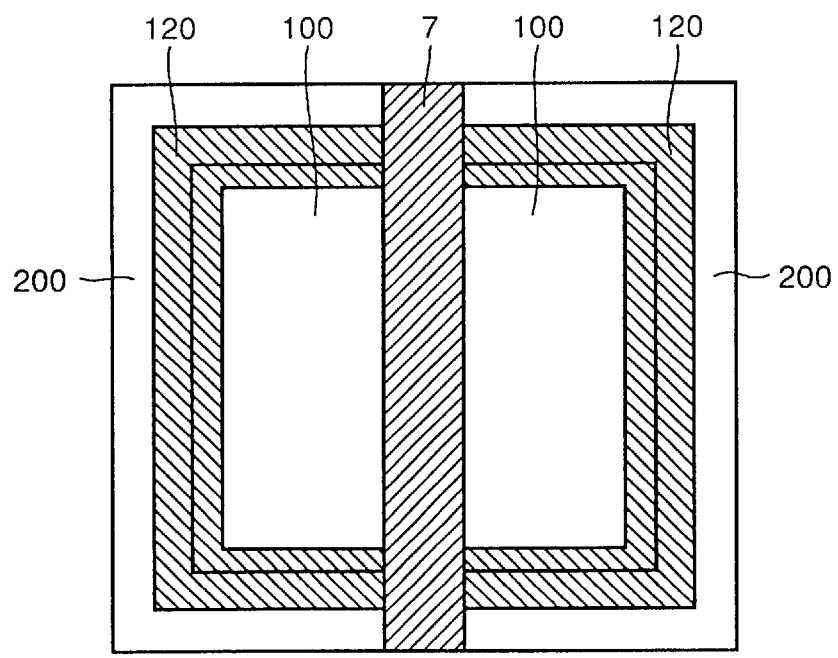
FIG. 2 is a simplified plan view showing the element of the semiconductor device according to the embodiment 1 of the present invention.

Referring to FIG. 2, impurity layers 120 are formed on boundary portions between an active region 100 and isolation insulator films 200. The n-type impurity layers 12 shown in FIG. 1 are formed not under the gate electrode 7, but on the impurity layers 120. Referring again to FIG. 1, the operation is now described.

A gate voltage, a source voltage, a drain voltage and a substrate voltage are applied to the gate electrode 7, the first and second ones of the sources/drains 10 and the p well 3 respectively, thereby forming a channel between the sources/drains 10 to feed a current. While depletion layers extend between the sources/drains 10 and the n-type impurity layers 12 and the p well 3 at this time, these depletion layers are not connected to the Co silicide layers 11 due to the n-type impurity layers 12 formed on end portions of the Co silicide layers 11 closer to the isolation region.

The silicide layers 11 may be prepared from Ni, Ti, W or Pt, in place of Co. While the n-type impurities may be prepared from any of arsenic, phosphorus and antimony, the sources/drains 10 and the n-type extension layers 9 are prepared from arsenic which is hard to diffuse, and the n-type impurity layers 12 are prepared from phosphorus which is easy to diffuse. Thus, the sources/drains 10 and the n-type extension layers 9 can be shallowly formed for suppressing punch-through, while the n-type impurity layers 12 can be deeply formed for further suppressing a leakage current.

Figure 3:
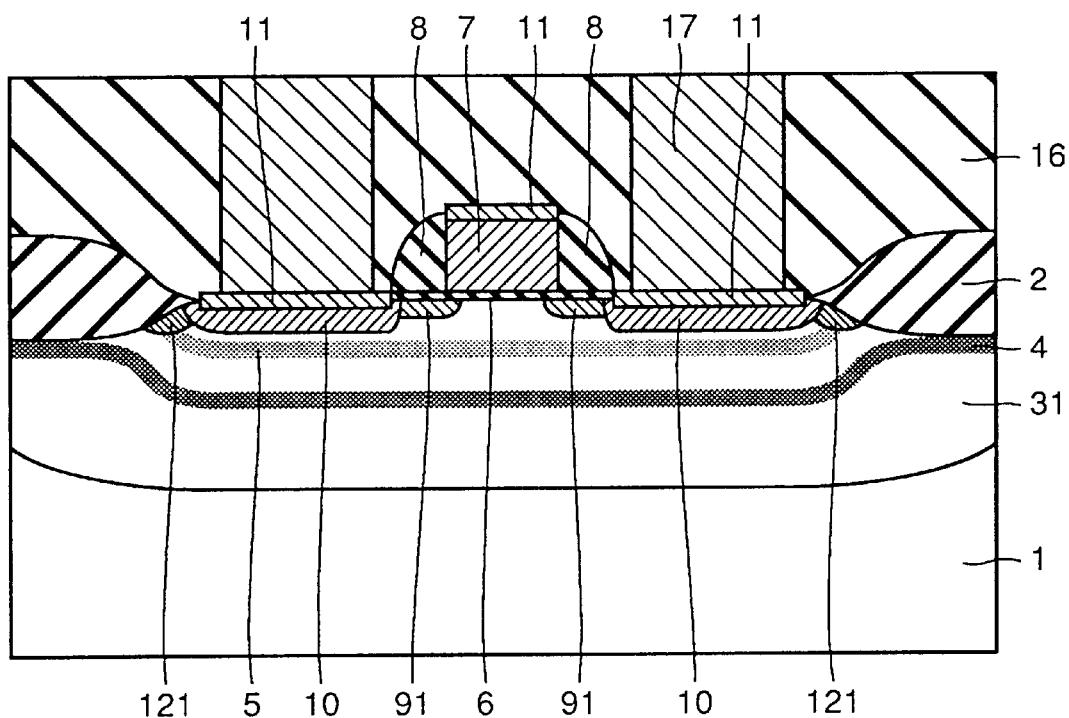
FIG. 3 is a sectional view showing another element of the semiconductor device according to the embodiment 1 of the present invention.

FIG. 3 shows a pMOS transistor element. Namely, the conductivity types of respective parts shown in FIG. 3 are reversed as compared with the nMOS transistor element shown in FIG. 1. The arsenic concentration of an n well 31 is about $1\times10^{17}$ to $1\times10^{18}/cm^3$, the arsenic peak concentrations of a channel cut injection layer 4 and a channel injection layer 5 are about $1\times10^{17}$ to $1\times10^{18}/cm^3$ and about $1\times10^{17}$ to $1\times10^{18}/cm^3$ respectively, the boron concentrations of p-type extension layers 91 and sources/drains 10 are about $1\times10^{18}$ to $1\times10^{19}/cm^3$ and about $1\times10^{21}$ to $1\times10^{22}/cm$ respectively, and the boron concentration of p-type impurity layers 121 is about $1\times10^{18}$ to $1\times10^{19}/cm^3$.

The Co silicide layers 11 may be prepared from Ni, Ti, W or Pt in place of Co, while the p-type impurities may be prepared from any of boron, boron fluoride and indium.

Also in the pMOS transistor, voltages are applied to form a channel between the sources/drains 10 for feeding a current, similarly to the nMOS transistor. In this case, depletion layers extend between the sources/drains 10 and the p-type impurity layers 121 and the n well 31. On end portions of the Co silicide layers 11 closer to an isolation region, however, the depletion layers are not connected to the Co silicide layers 11, due to the formation of the p-type impurity layers 121.

According to this semiconductor device, the n-type impurity layers 12 or the p-type impurity layers 121 are formed on the boundary portions between the sources/drains 10 and the field oxide film 2 in portions deeper than the sources/drains 10. Even if the metal silicide layers such as the Co silicide layers 11 extend into portions under the field oxide film 2 or end portions of the field oxide film 2 are eroded, therefore, the metal silicide layers 11 are not directly connected to the p well 3 or the n well 31, the channel cut injection layer 4 or the channel injection layer 5, and the distances between pn junctions formed by the sources/drains 10 and the p well 3 or the n well 31 and end portions of the metal silicide layers 11 are not reduced. Thus, reliability in element operation is improved such that the leakage current is suppressed while maintaining the depths of the sources/drains 10.

FIGS. 4, 5, 6, 7 and 8 are sectional views showing steps of a method of fabricating the semiconductor device according to the embodiment 1.

Figure 4:
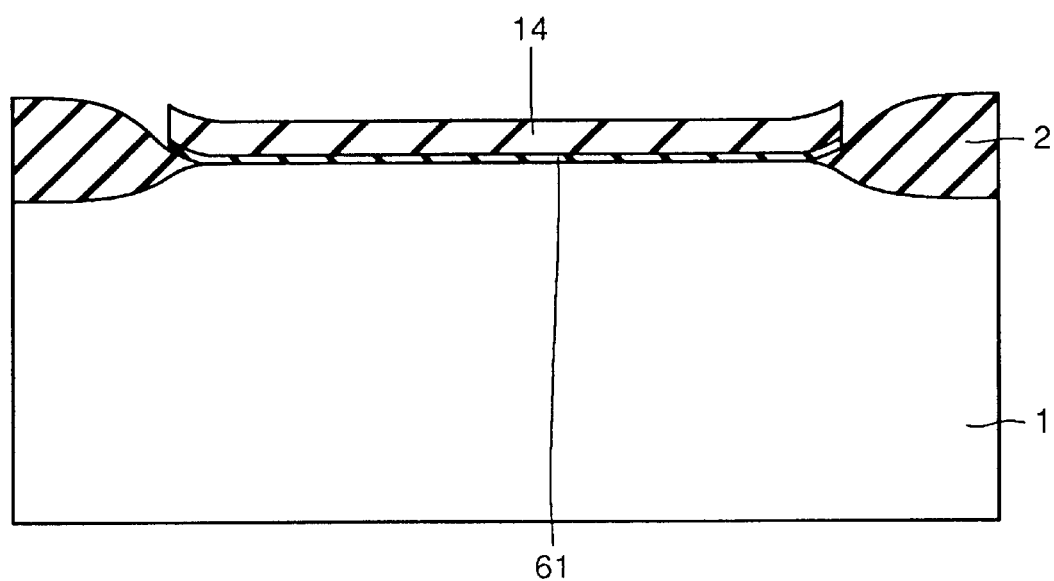
FIGS. 4 to 8 are sectional views of the element showing steps of a method of fabricating the semiconductor device according to the embodiment 1 of the present invention.

As shown in FIG. 4, an oxide film 61 of about 200 Å and a silicon nitride film 14 of about 3000 Å are formed on the surface of the semiconductor substrate 1, the isolation region is etched, and thereafter thermal oxidation is performed for forming the field oxide film 2 in a thickness of 3000 to 5000 Å.

In this case, the oxide film 61 may be replaced with a silicon nitride oxide (SiON) film, or a polysilicon film may be further formed on the oxide film 61. After etching of the silicon nitride film 14 and the oxide film 61, an exposed part of the active region of the semiconductor substrate 1 may be etched by about 1000 Å for thereafter forming the field oxide film 2 through thermal oxidation.

Figure 5:
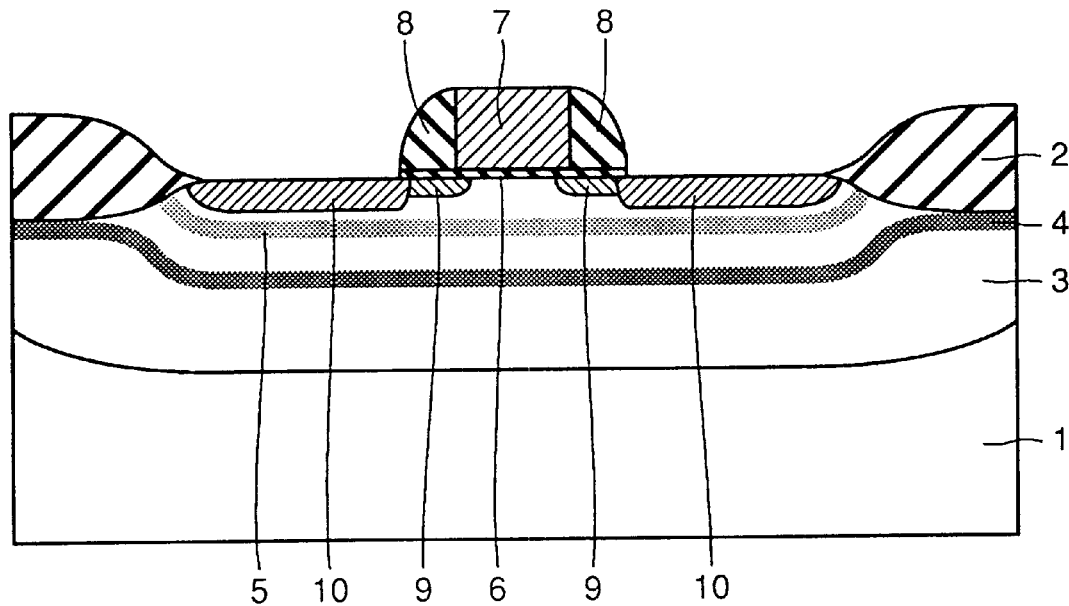

As shown in FIG. 5, the oxide film 61 and the silicon nitride film 14 are removed, and boron which is a p-type impurity, for example, is vertically ion-implanted into the active region enclosed with the field oxide film 2 at about 250 keV and in about $1\times10^{13}$ to $1\times10^{14}/cm^2$ for forming the p well 3. Thereafter boron is vertically ion-implanted into the overall surface at about 100 keV and in about $1\times10^{12}$ to $1\times10^{13}/cm^2$ for forming the channel cut injection layer 4, and boron is further vertically ion-implanted into the overall surface in about $1\times10^{12}$ to $1\times10^{13}/cm^2$ for forming the channel injection layer 5.

After formation of the gate insulator film 6 and the gate electrode 7, arsenic is obliquely rotationally ion-implanted at 45° at about 10 to 40 keV and in about $1\times10^{13}$ to $1\times10^{14}/cm^2$, for forming the n-type extension layers 9. Thereafter an oxide film is deposited and etched back by RIE (reactive ion etching), for forming the side walls 8. Then, arsenic is vertically ion-implanted at about 20 to 60 keV and in about $1\times10^{15}$ to $1\times10^{16}/cm^2$, for forming the sources/drains 10.

Figure 6:
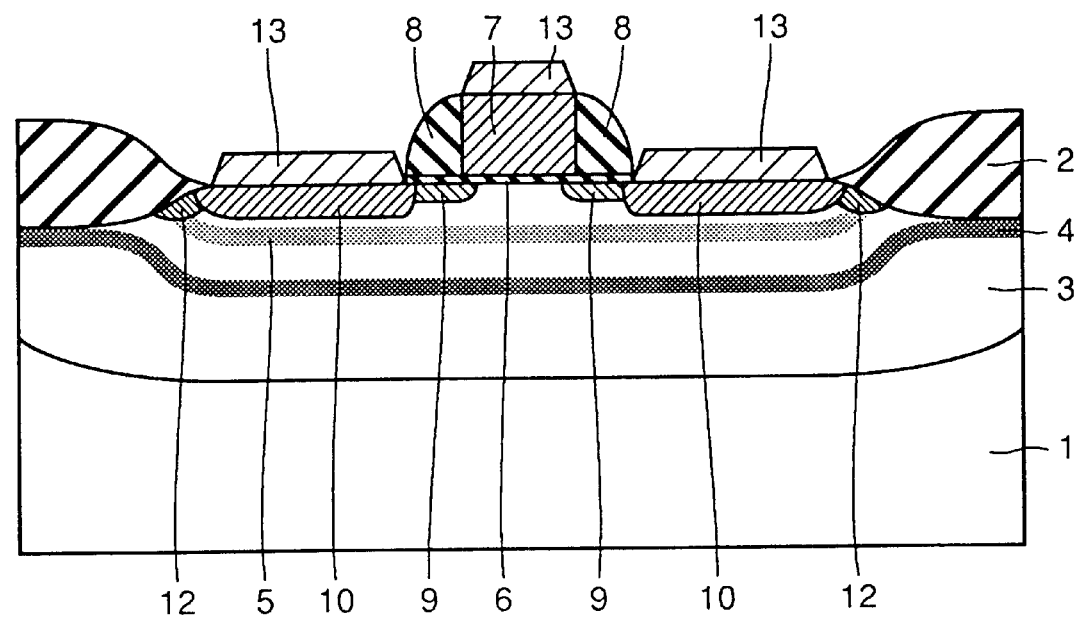
Figure 7:
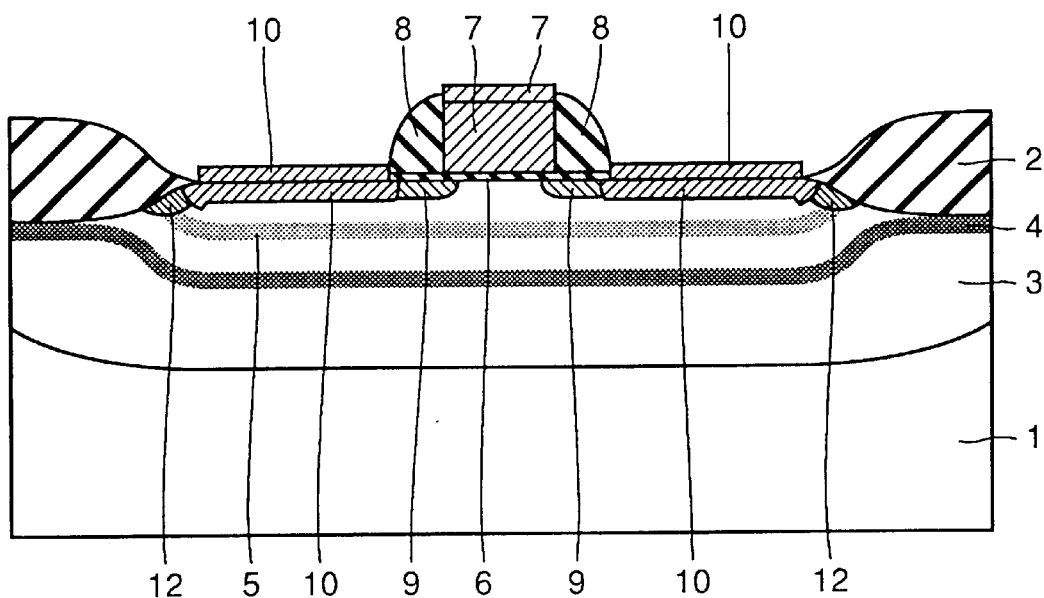

Then, silicon layers 13 of about 1000 Å are formed by selective epitaxial growth on the gate electrode 7 and the sources/drains 10 exposing silicon on surfaces thereof in this stage, as shown in FIG. 6. The epitaxial growth is preferably made in a facet structure as shown in FIG. 6 for forming the n-type impurity layers 12, while the same may alternatively be made in the vertical direction.

Further, phosphorus is obliquely rotationally injected into the overall surface at 45° at about 10 to 40 keV and in about $1\times10^{13}$ to $1\times10^{4}/cm^2$, for forming the n-type impurity layers 12 on the boundary portions between the active region and the field oxide film 2 except the portions under the gate electrode 7. Thereafter the silicon layers 13 are removed by etching. The sources/drains 10 may be formed after this step.

Alternatively, the silicon layers 13 may be left unremoved if the thicknesses thereof are about 300 Å, as shown in FIG.

7. In this case, the ion implantation for forming the sources/drains 10 is performed after formation of the silicon layers 13. Thus, the silicon layers 13 formed on the surfaces of the sources/drains 10 define parts of the sources/drains 10, and that on the surface of the gate electrode 7 defines a part of the gate electrode 7.

Figure 8:
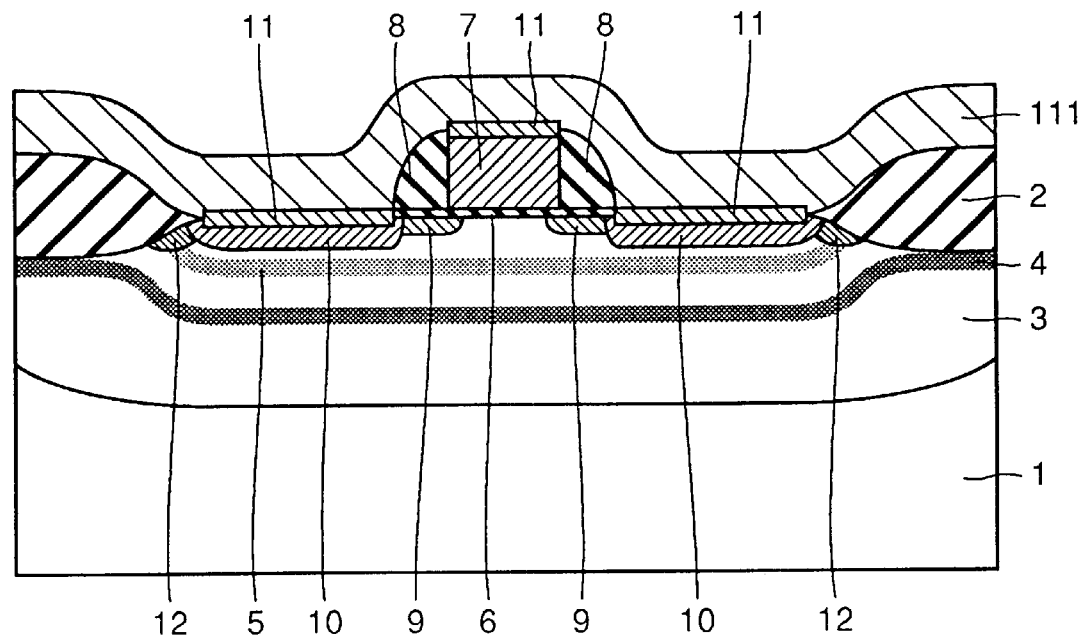

As shown in FIG. 8, a Co film 111 of about 50 to 200 Å is formed on the overall surface by sputtering or CVD, and heat treated at 400 to 500° C. for 30 seconds to 2 minutes in a nitrogen atmosphere by RTA (rapid thermal annealing) or the like. Thus, the Co silicide layers 11 are formed on the surfaces of the gate electrode 7 and the sources/drains 10. The silicide layers 11 may be prepared from Ni, Ti, W or Pt, in place of Co.

Thereafter unreacted parts of the Co film 111 are removed by wet etching with mixed acid peroxyhydrate ($HNO_3$/$CH_3COOH$/$P_4O_{10}$/$H_2O_2$) or hydrochloric acid peroxyhydrate ($HCl$/$H_2O_2$), and RTA is performed at 700 to 900° C. for about 30 seconds to 2 minutes. Thus, the semiconductor device provided with the n-type impurity layers 12 only on the end portions of the field oxide film 2 is obtained as shown in FIG. 1.

Also in case of the pMOS transistor, phosphorus which is an n-type impurity is vertically ion-implanted into the active region enclosed with the field oxide film 2 of 3000 to 5000 Å in thickness at about 1.2 MeV in an injection concentration of about $1 \times 10^{13}$ to $1 \times 10^{14}$/$cm^2$ for forming the n well 31. Thereafter phosphorus is vertically ion-implanted into the overall surface at about 350 keV and in about $1 \times 10^{12}$ to $1 \times 10^{13}$/$cm^2$ for forming the channel cut injection layer 4, and phosphorus is further vertically ion-implanted into the overall surface at about 40 to 200 keV and in about $1 \times 10^{12}$ to $1 \times 10^{3}$/$cm^2$ for forming the channel injection layer 5.

Then, the gate insulator film 6 and the gate electrode 7 are formed, and thereafter boron fluoride is obliquely rotationally ion-implanted at 7° at about 5 to 40 keV and in about $1 \times 10^{14}$ to $1 \times 10^{15}$/$cm^2$, for forming the p-type extension layers 91. Thereafter the side walls 8 are formed similarly to the case of the nMOS transistor, and boron fluoride is vertically ion-implanted at about 10 to 50 keV and in about $1 \times 10^{15}$ to $1 \times 10^{16}$/$cm^2$, for forming the sources/drains 10.

Further, silicon layers 13 are formed similarly to the case of the nMOS transistor, and thereafter boron is vertically ion-implanted into the overall surface at about 5 to 40 keV and in about $1 \times 10^{14}$ to $1 \times 10^{15}$/$cm^2$, for forming the p-type impurity layers 121 on the boundary portions between the active region and the field oxide film 2 except portions under the gate electrode 7. Thereafter the silicon layers 13 are removed by etching.

Then, the Co silicide layers 11 are formed similarly to the case of the nMOS transistor, thereby forming the semiconductor device shown in FIG. 3. The order of the removal of the silicon layers 13 and the formation of the sources/drains 10 is similar to that in case of the nMOS transistor.

In each of the pMOS and nMOS transistors, the injection order for the channel injection layer 5 and the channel cut injection layer 4 may be reversed.

In each of the pMOS and nMOS transistors, the impurity concentrations of the channel injection layer 5 and the channel cut injection layer 4 have peaks with respect to the direction of depth from the surface of the substrate 1. In the active region, the impurity concentration peak of the channel injection layer 5 is formed in a depth of about 0.15 μm from the surface of the substrate 1.

If the pMOS and nMOS transistors are mixed with each other, masks are employed for injecting the impurities at need.

According to the aforementioned method of fabricating a semiconductor device, the n-type impurity layers 12 or the p-type impurity layers 121 are formed in a self-aligned manner on the surface of the semiconductor substrate 1 under the end portions of the field oxide film 2 by the silicon layers 13 formed in a self-aligned manner on the surfaces of the gate electrode 7 and the sources/drains 10 and the field oxide film 2 having a large thickness on its central portion and a small thickness on its end portions. Thus, it is possible to obtain a method of fabricating a semiconductor device which is improved in reliability of its element operation through simplified steps.

In the boundary portions between the sources/drains 10 and the field oxide film 2, the n-type impurity layers 12 or the p-type impurity layers 121 are formed in portions deeper than the source/drains 10. Even if the metal silicide layers such as the Co silicide layers 11 extend into portions under the field oxide film 2 or the end portions of the field oxide film 2 are eroded, therefore, the metal silicide layers 11 are not directly connected to the p well 3, the n well 31, the channel cut injection layer 4 or the channel injection layer 5, and the distances between the pn junctions formed by the sources/drains 10 and the p well 3 or the n well 31 and the end portions of the metal silicide layers 11 are not reduced. Thus, it is possible to obtain a method of fabricating a semiconductor device which is improved in reliability of its element operation such that a leakage current is suppressed while maintaining the depths of the sources/drains 10.

FIGS. 9, 10, 11, 12 and 13 are sectional views showing steps of another method of fabricating the semiconductor device according to the embodiment 1.

First, an oxide film 61 of about 200 Å and a silicon nitride film 14 of about 1000 Å are formed on the surface of the active region of the semiconductor substrate 1, and thermal oxidation is performed for forming the field oxide film 2 of 3000 to 5000 Å in thickness.

Figure 9:
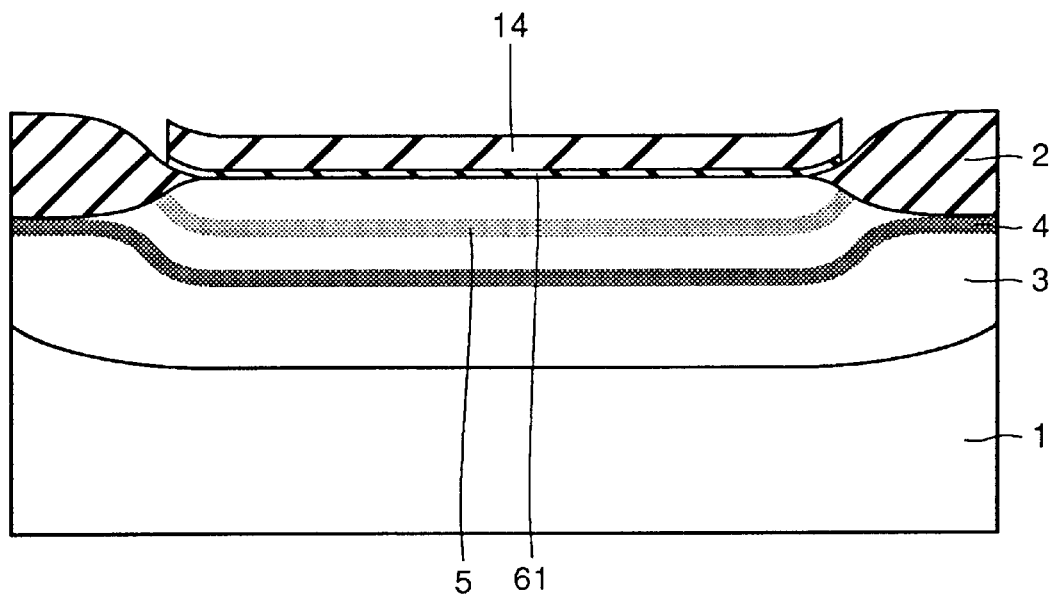
FIGS. 9 to 14 are sectional views of the element showing steps of another method of fabricating the semiconductor device according to the embodiment 1 of the present invention.

Then, boron which is a p-type impurity is vertically ion-implanted into the active region enclosed with the field oxide film 2 through the silicon nitride film 14 at about 300 kev and in an injection concentration of about $1 \times 10^{13}$ to $1 \times 10^{14}$/$cm^2$ for forming the p well 3, as shown in FIG. 9. Thereafter boron is vertically ion-implanted into the overall surface at about 100 keV and in about $1 \times 10^{12}$ to $1 \times 10^{13}$/$cm^2$ for forming the channel cut injection layer 4, and boron is further vertically ion-implanted into the overall surface at about 60 to 110 keV and in about $1 \times 10^{12}$ to $1 \times 10^{13}$/$cm^2$, for forming the channel injection layer 5.

The boron range distances in the field oxide film 2 and the silicon nitride film 14 are in the ratio of 3:4, and hence the thicknesses of these films 2 and 14 may be so adjusted that the channel cut injection layer 5 is formed immediately under the field oxide film 2 in the isolation region and in a deeper portion in the active region.

Figure 10:
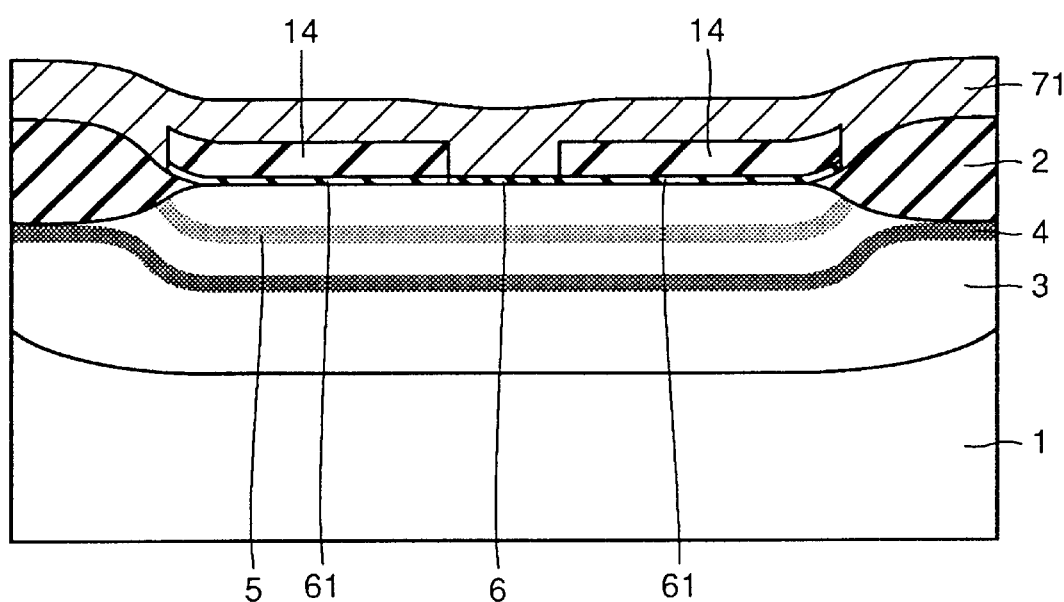

As shown in FIG. 10, portions other than a gate electrode forming region are masked to partially remove the silicon nitride film 14 and the oxide film 61 from the gate electrode forming region, the mask is removed, thereafter the gate insulator film 6 is formed by thermal oxidation, and a polysilicon layer 71 is formed on the overall surface.

Figure 11:
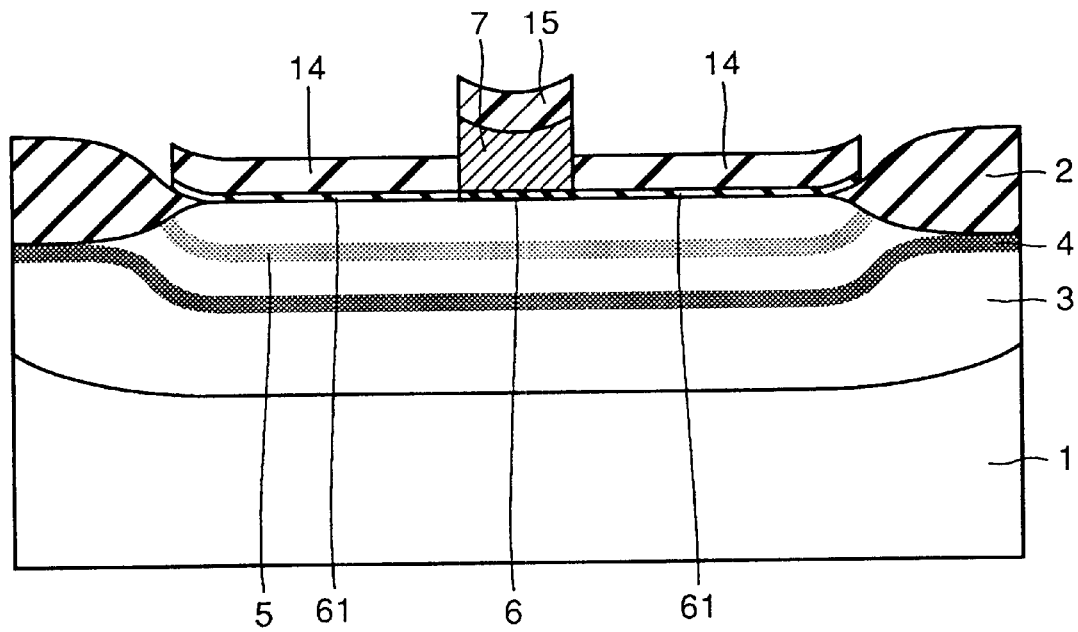

Thereafter etching is performed through a resist film 15 formed on the gate electrode forming region for serving as a mask, thereby forming the gate electrode 7, as shown in FIG. 11. Thereafter the resist film 15 is removed.

Figure 12:
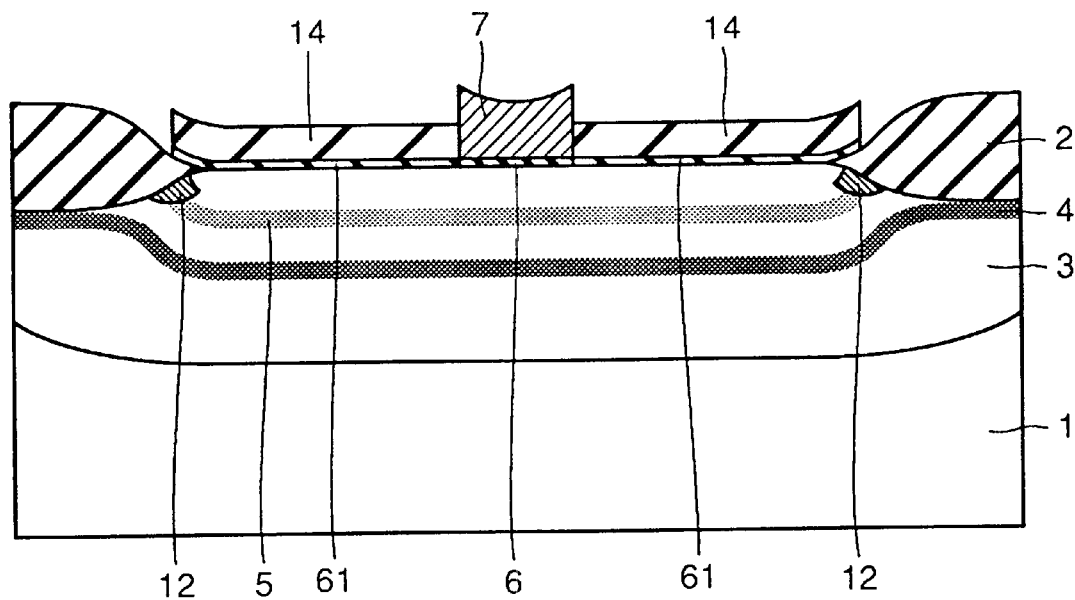

As shown in FIG. 12, phosphorus is obliquely rotationally injected into the overall surface at 45° at about 10 to 40 keV and in about $1 \times 10^{13}$ to $1 \times 10^{14}$/$cm^2$ for forming the n-type impurity layers 12 on the boundary portions of the active region and the field oxide film 2 except the portions under the gate electrode 7. Thereafter the silicon nitride film 14 is removed by etching.

Then, arsenic is obliquely rotationally ion-implanted at 45° at about 10 to 40 keV and in about $1\times10^{13}$ to $1\times10^{14}/cm^2$, for forming the n-type extension layers 9. Thereafter an oxide film is deposited by CVD and etched back by RIE (reactive ion etching) for forming the side walls 8, and arsenic is vertically ion-implanted at about 20 to 60 keV and in about $1\times10^{15}$ to $1\times10^{16}/cm^2$ for forming the sources/drains 10.

Figure 13:
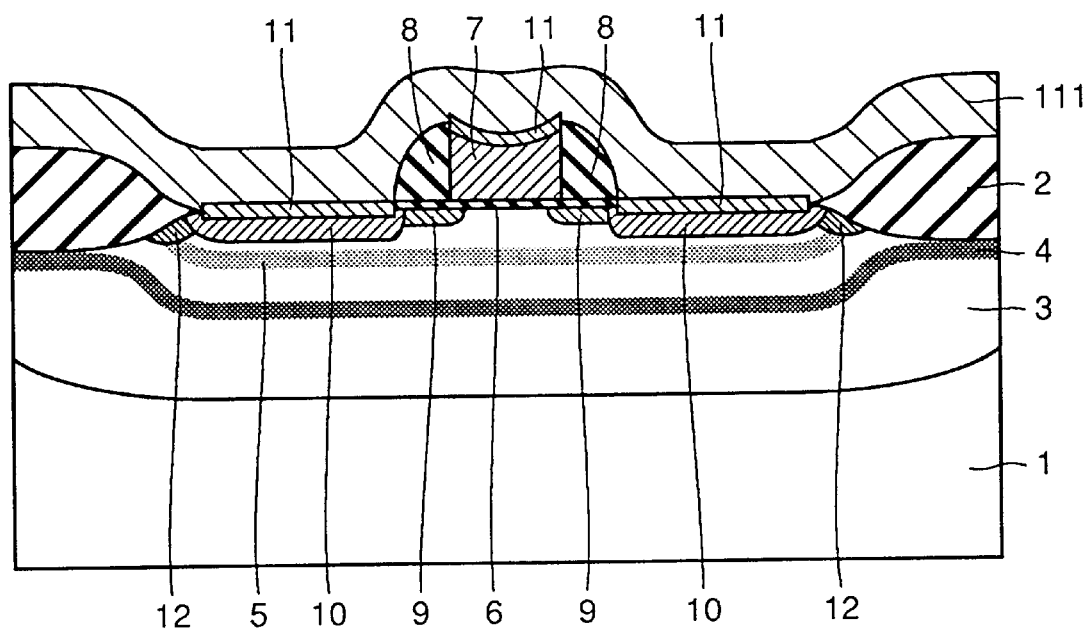
Figure 14:
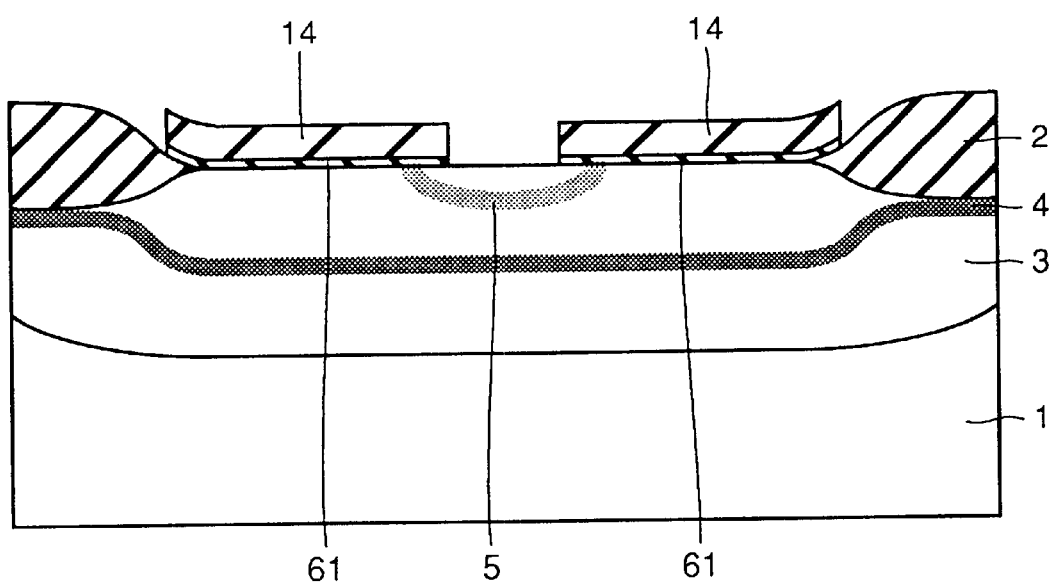

As shown in FIG. 13, a Co film 111 of about 50 to 200 Å is formed on the overall surface by sputtering or CVD, and thereafter a heat treatment is performed in a nitrogen atmosphere by RTA (rapid thermal annealing) or the like at 400 to 500° C. for about 30 seconds to 2 minutes, thereby forming the Co silicide layers 11 on the surfaces of the gate electrode 7 and the sources/drains 10. The silicide layers 11 may be prepared from Ni, Ti, W or Pt, in place of Co.

Thereafter unreacted parts of the Co film 111 are removed by wet etching with mixed acid peroxyhydrate ($HNO_3/CH_3COOH/P_4O_{10}/H_2O_2$) or hydrochloric acid peroxyhydrate ($HCl/H_2O_2$), and RTA is performed at 700 to 900° C. for about 30 seconds to 2 minutes. Thus, the semiconductor device provided with the n-type impurity layers 12 only on the end portions of the field oxide film 2 is obtained as shown in FIG. 1.

Also in case of the pMOS transistor, thermal oxidation is performed through masks of an oxide film 61 of about 200 Å and a silicon nitride film 14 of about 1000 Å for forming the field oxide film 2 of 3000 to 5000 Å in thickness.

Then, phosphorus which is an n-type impurity is vertically ion-implanted into the active region enclosed with the field oxide film 2 at about 1.3 MeV and in about $1\times10^{13}$ to $1\times10^{14}/cm^2$ through the silicon nitride film 14, for forming the n well 31. Thereafter phosphorus is vertically ion-implanted into the overall surface at about 350 keV and in about $1\times10^{12}$ to $1\times10^{13}/cm^2$ for forming the channel cut injection layer 4. Further, phosphorus is vertically ion-implanted into the overall surface at about 200 keV and in about $1\times10^{12}$ to $1\times10^{13}/cm^2$ for forming the channel injection layer 5.

Then, the gate insulator film 6 and the gate electrode 7 are formed, and boron is vertically ion-implanted into the overall surface at about 5 to 40 keV and in about $1\times10^{14}$ to $1\times10^{15}/cm^2$, for forming the p-type impurity layers 121 on the boundary portions between the active region and the field oxide film 2 except the portions under the gate electrode 7. Thereafter the silicon nitride film 14 is removed by etching.

Thereafter boron fluoride is obliquely rotationally ion-implanted at 7° at about 5 to 40 keV and in about $1\times10^{14}$ to $1\times10^{15}/cm^2$, for forming the p-type extension layers 91. Thereafter the side walls 8 are formed similarly to the case of the nMOS transistor, and boron fluoride is vertically ion-implanted at about 10 to 50 keV and in about $1\times10^{15}$ to $1\times10^{16}/cm^2$, for forming the sources/drains 10.

The Co silicide layers 11 are formed similarly to the case of the nMOS transistor, thereby forming the semiconductor device shown in FIG. 3.

In each of the pMOS and nMOS transistors, the injection order for the channel injection layer 5 and the channel cut injection layer 4 may be reversed.

In each of the pMOS and nMOS transistors, the channel injection layer 5 may be formed after partially removing the silicon nitride film 14 and the oxide film 61 for forming the gate electrode 7 and before forming the gate insulator film 6.

In this case, boron is rotationally ion-implanted at 7° at about 50 keV and in $1\times10^{12}$ to $1\times10^{13}/cm^2$ in the case of the nMOS transistor, at about 100 to 180 keV and in $1\times10^{12}$ to $1\times10^{13}/cm^2$ for a surface channel type pMOS transistor, or at about 10 to 20 keV and in $1\times10^{12}$ to $1\times10^{13}/cm^2$ for a buried channel type pMOS transistor.

Thus, the channel injection layer 5 is formed not under the sources/drains 10 but only under the gate electrode 7 in a self-aligned manner, whereby increase of the junction capacity and the junction leakage current is suppressed and the load is reduced, to enable a high-speed circuit operation.

In each of the pMOS and nMOS transistors, the impurity concentrations of the channel injection layer 5 and the channel cut injection layer 4 have peaks with respect to the direction of depth from the surface of the substrate 1. In the active region, the impurity concentration peak of the channel injection layer 5 is formed in a depth of about 0.15 μm from the surface of the substrate 1.

According to this method of fabricating a semiconductor device, the n-type impurity layers 12 or the p-type impurity layers 121 are formed in a self-aligned manner on the surface of the semiconductor substrate 1 under the end portions of the field oxide film 2 by the silicon nitride film 14 formed for forming the field oxide film 2, whereby it is possible to obtain a method of fabricating a semiconductor device which is improved in reliability of its element operation through simplified steps.

In the boundary portions between the sources/drains 10 and the field oxide film 2, the n-type impurity layers 12 or the p-type impurity layers 121 are formed in portions deeper than the source/drains 10. Even if the metal silicide layers such as the Co silicide layers 11 extend into portions under the field oxide film 2 or the end portions of the field oxide film 2 are eroded, therefore, the metal silicide layers 11 are not directly connected to the p well 3 or the n well 31, the channel cut injection layer 4 or the channel injection layer 5, and the distances between the pn junctions formed by the sources/drains 10 and the p well 3 or the n well 31 and the end portions of the metal silicide layers 11 are not reduced. Thus, it is possible to obtain a method of fabricating a semiconductor device which is improved in reliability of its element operation such that a leakage current is suppressed while maintaining the depths of the sources/drains 10.

While each transistor is enclosed with the isolation insulator film in the embodiment 1, a plurality of transistors may alternatively be present in the active region enclosed with the isolation region.

Embodiment 2

Figure 15:
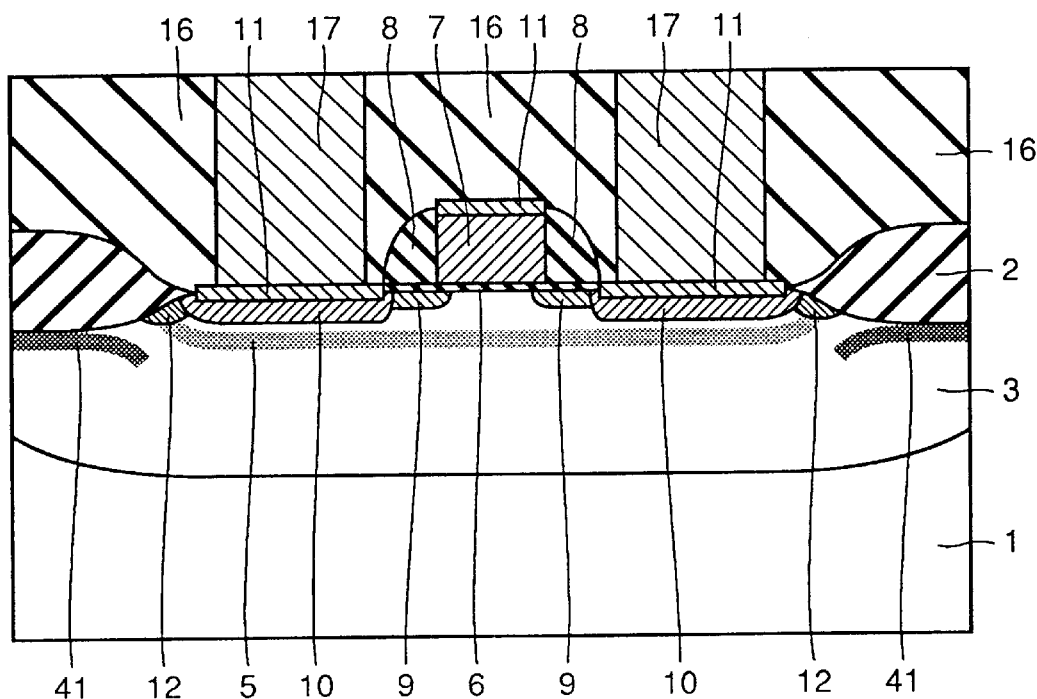
FIG. 15 is a sectional view showing an element of a semiconductor device according to an embodiment 2 of the present invention.

FIG. 15 shows an nMOS transistor element. This semiconductor device is different from that shown in FIG. 1 in a point that a channel cut injection layer 41 is formed not in an active region but only under a field oxide film 2. The channel cut injection layer 41 has a boron peak concentration of about $1\times10^{17}$ to $1\times10^{18}/cm^3$.

Also in case of a pMOS transistor, the semiconductor device is different from that of the embodiment 1 in a point that a channel cut injection layer 41 is formed not in an active region but only under a field oxide film 2, and the channel cut injection layer 41 has a phosphorus peak concentration of about $1\times10^{17}$ to $1\times10^{18}/cm^3$.

According to this semiconductor device, n-type impurity layers 12 or p-type impurity layers 121 are formed on boundary portions between sources/drains 10 and the field oxide film 2 in portions deeper than the sources/drains 10. Even if metal silicide layers such as Co silicide layers 11 extend into portions under the field oxide film 2 or end portions of the field oxide film 2 are eroded, therefore, the metal silicide layers 11 are not directly connected to a p well 3 or an n well 31, the channel cut injection layer 41 or a channel injection layer 5, and the distances between pn junctions formed by the sources/drains 10 and the p well 3 or the n well 31 and end portions of the metal silicide layers 11 are not reduced. Thus, reliability of the element operation is improved such that a leakage current is suppressed while maintaining the depths of the sources/drains 10.

The channel cut injection layer 41 which is formed only under the field oxide film 2 is reduced in area to reduce the junction capacity, whereby a high-speed operation can be effectively attained. Further, the channel cut injection layer 41 is prevented from influencing a threshold voltage, whereby the element reliability is further improved.

Figure 16:
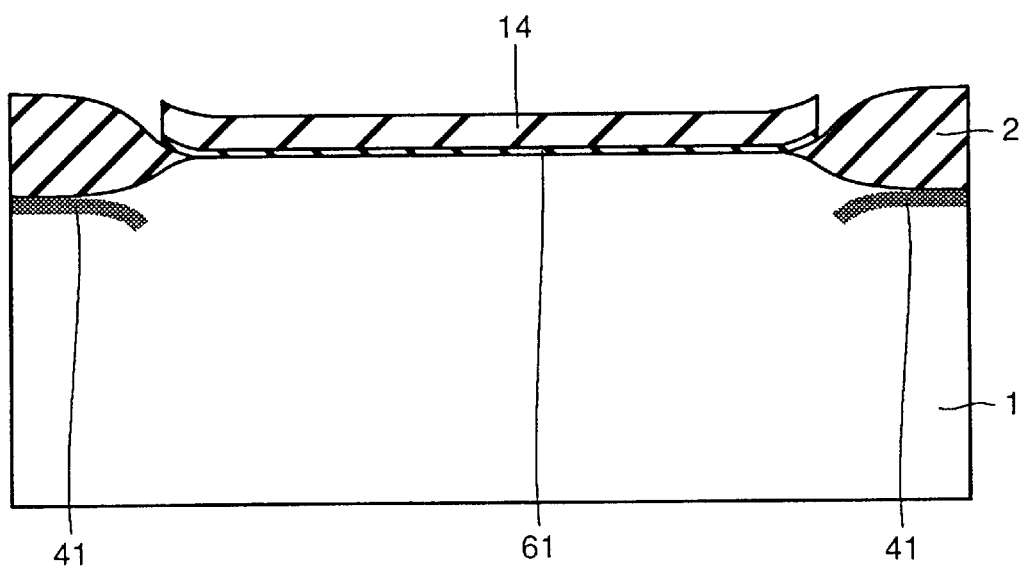
FIG. 16 is a sectional view of the element showing a step of a method of fabricating the semiconductor device according to the embodiment 2 of the present invention.

FIG. 16 is a sectional view showing the element in a step of a method of fabricating the semiconductor device according to the embodiment 2.

First, the field oxide film 2 is formed through masks of an oxide film 61 of about 200 Å and a silicon nitride film 14 of about 1000 Å similarly to the embodiment 1, and thereafter boron is vertically ion-injected into the overall surface at about 100 keV and in about $1 \times 10^{12}$ to $1 \times 10^{13}/cm^2$ for forming the channel cut injection layer 41 in case of the nMOS transistor, as shown in FIG. 16.

Thereafter the oxide film 61 and the silicon nitride film 14 are removed, and the p well 3, the channel injection layer 5, a gate insulator film 6, a gate electrode 7, n-type extension layers 9, side walls 8 and the sources/drains 10 are formed similarly to the embodiment 1.

Then, silicon layers 13 of about 1000 Å are formed by selective epitaxial growth on the gate electrode 7 and the sources/drains 10 exposing silicon on surfaces thereof, and employed as masks for forming the n-type impurity layers 12, similarly to the embodiment 1. Then the silicon layers 13 are removed by etching, and thereafter the Co silicide layers 11 are formed.

Also in case of the pMOS transistor, the semiconductor device is fabricated similarly to the case of the nMOS transistor. In this case, the channel cut injection layer 41 is formed by vertically ion-implanting phosphorus at about 350 keV and in about $1 \times 10^{12}$ to $1 \times 10^{13}/cm^2$.

Similarly to the embodiment 1, the sources/drains 10 may be formed after removing the silicon layers 13 by etching. Further, the silicon layers 13 may be left unremoved if the thicknesses thereof are about 300 Å. In this case, the ion implantation for forming the sources/drains 10 is performed after formation of the silicon layers 13. Thus, the silicon layers 13 formed on the surfaces of the sources/drains 10 define parts of the sources/drains 10, and that on the surface of the gate electrode 7 defines a part of the gate electrode 7.

In each of the PMOS and nMOS transistors, the impurity concentration of the channel injection layer 5 has a peak with respect to the direction of depth from the surface of the substrate 1. In the active region, the impurity concentration peak of the channel injection layer 5 is formed in a depth of about 0.15 μm from the surface of the substrate 1.

According to this method of fabricating a semiconductor device, the n-type impurity layers 12 or the p-type impurity layers 121 are formed in a self-aligned manner on the surface of the semiconductor substrate 1 under the end portions of the field oxide film 2 by the silicon layers 13 formed in a self-aligned manner on the surfaces of the gate electrode 7 and the sources/drains 10 and the field oxide film 2 having a large thickness on its central portion and a small thickness on its end portions. Thus, it is possible to obtain a method of fabricating a semiconductor device which is improved in reliability of its element operation through simplified steps.

Further, the n-type impurity layers 12 or the p-type impurity layers 121 are formed on the boundary portions between the sources/drains 10 and the field oxide film 2 in portions deeper than the sources/drains 10. Even if the metal silicide layers such as the Co silicide layers 11 extend into portions under the field oxide film 2 or end portions of the field oxide film 2 are eroded, therefore, the metal silicide layers 11 are not directly connected to the p well 3 or the n well 31, the channel cut injection layer 41 or the channel injection layer 5, and the distances between pn junctions formed by the sources/drains 10 and the p well 3 or the n well 31 and end portions of the metal silicide layers 11 are not reduced. Thus, it is possible to obtain a method of fabricating a semiconductor device which is improved in reliability of its element operation such that the leakage current is suppressed while maintaining the depths of the sources/drains 10.

Further, the area of the channel cut injection layer 41 is reduced to reduce the junction capacity, whereby it is possible to obtain a method of fabricating a semiconductor device which can attain a high-speed operation. In addition, the channel cut injection layer 41 is prevented from influencing a threshold voltage, whereby it is possible to obtain a method of fabricating a semiconductor device which is further improved in element reliability.

Figure 17:
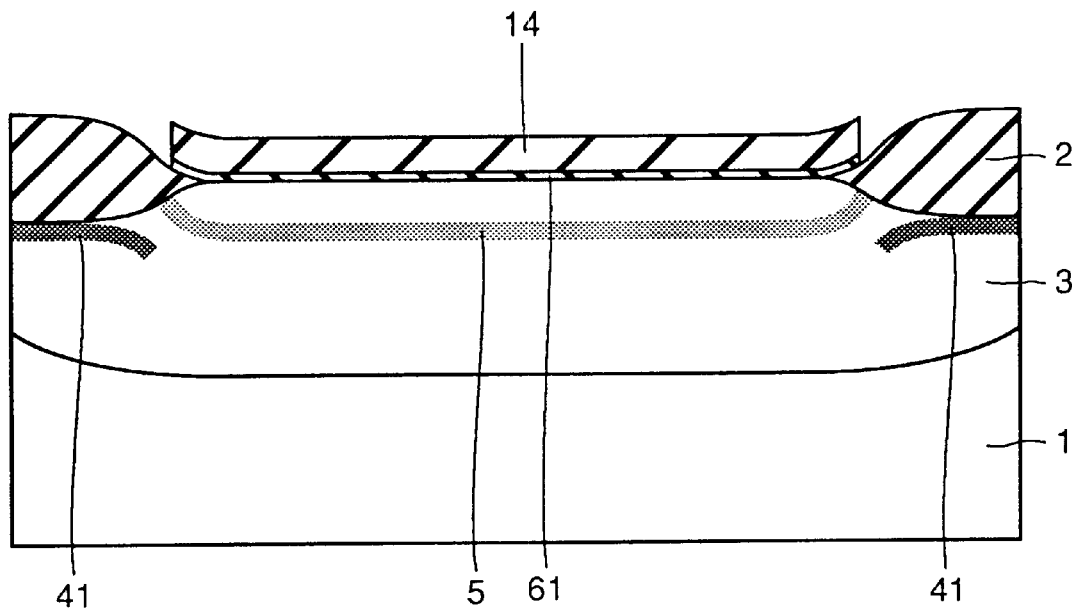
FIGS. 17 and 18 are sectional views of the element showing steps of another method of fabricating the semiconductor device according to the embodiment 2 of the present invention.
Figure 18:
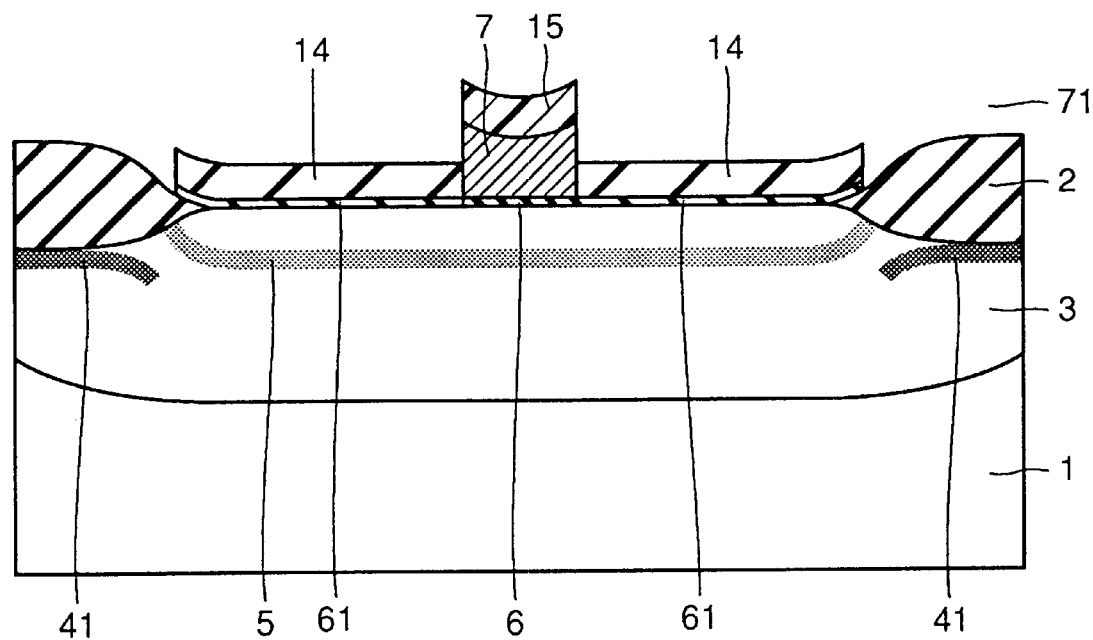

FIGS. 17 and 18 are sectional views of the element showing steps of another method of fabricating the semiconductor device according to the embodiment 2.

First, the field oxide film 2 is formed similarly to the embodiment 1, and thereafter boron is vertically ion-implanted into the overall surface at about 100 keV and in about $1 \times 10^{12}$ to $1 \times 10^{13}/cm^2$ through masks of an oxide film 61 of about 200 Å and a silicon nitride film 14 of about 3000 Å for forming the channel cut injection layer 41 in case of the nMOS transistor, as shown in FIG. 17.

Then, the silicon nitride film 14 is anisotropically etched to about 1000 Å at a sufficient selection ratio to the oxide film 61, and the p well and the channel injection layer 5 are formed in the active region enclosed with the field oxide film 2, similarly to the embodiment 1.

As shown in FIG. 18, the silicon nitride film 14 and the oxide film 61 are partially removed from a gate electrode forming region, the gate insulator film 6 is formed by thermal oxidation, a polysilicon layer 71 is formed on the overall surface, and thereafter the gate electrode 7 is formed on the gate electrode forming region by etching through a resist film 15 serving as a mask, similarly to the embodiment 1.

The resist film 15 is removed, and thereafter the n-type impurity layers 12 are formed on the boundary portions between the active region and the field oxide film 2 except portions under the gate electrode 7, similarly to the embodiment 1. Thereafter the silicon nitride film 14 is removed by etching.

Then, the n-type extension layers 9, the side walls 8, the sources/drains 10 and the Co silicide layers 11 are formed similarly to the embodiment 1.

Also in case of the pMOS transistor, the semiconductor device is fabricated similarly to the case of the nMOS transistor. In this case, the channel cut injection layer 41 is formed by vertically ion-implanting phosphorus at about 350 keV and in about $1 \times 10^{12}$ to $1 \times 10^{13}/cm^2$.

In each of the pMOS and nMOS transistors, the impurity concentration of the channel injection layer 5 has a peak with respect to the direction of depth from the surface of the substrate 1. In the active region, the impurity concentration peak of the channel injection layer 5 is formed in a depth of about 0.15 μm from the surface of the substrate 1.

In each of the pMOS and nMOS transistors, the channel injection layer 5 may be formed after partially removing the silicon nitride film 14 and the oxide film 61 for forming the gate electrode 7 and before forming the gate insulator film 6, similarly to the embodiment 1.

In this case, boron is rotationally ion-implanted at 7° at about 50 keV and in $1\times10^{12}$ to $1\times10^{13}/cm^2$ in the case of the nMOS transistor, at about 100 to 180 keV and in $1\times10^{12}$ to $1\times10^{13}/cm^2$ for a surface channel type pMOS transistor, or at about 10 to 20 keV and in $1\times10^{12}$ to $1\times10^{13}/cm^2$ for a buried channel type pMOS transistor.

Thus, the channel injection layer 5 is formed not under the sources/drains 10 but only under the gate electrode 7 in a self-aligned manner, whereby increase of the junction capacity and the junction leakage current is suppressed and the load is reduced, to enable a high-speed circuit operation.

According to this method of fabricating a semiconductor device, the n-type impurity layers 12 or the p-type impurity layers 121 are formed in a self-aligned manner on the surface of the semiconductor substrate 1 under the end portions of the field oxide film 2 by the silicon nitride film 14 formed for forming the field oxide film 2. Thus, it is possible to obtain a method of fabricating a semiconductor device which is improved in reliability of its element operation through simplified steps.

Further, the n-type impurity layers 12 or the p-type impurity layers 121 are formed on the boundary portions between the sources/drains 10 and the field oxide film 2 in portions deeper than the sources/drains 10. Even if the metal silicide layers such as the Co silicide layers 11 extend into portions under the field oxide film 2 or end portions of the field oxide film 2 are eroded, therefore, the metal silicide layers 11 are not directly connected to the p well 3 or the n well 31, the channel cut injection layer 4 or the channel injection layer 5, and the distances between pn junctions formed by the sources/drains 10 and the p well 3 or the n well 31 and end portions of the metal silicide layers 11 are not reduced. Thus, it is possible to obtain a method of fabricating a semiconductor device which is improved in reliability of its element operation such that the leakage current is suppressed while maintaining the depths of the sources/drains 10.

In addition, the area of the channel cut injection layer 4 is reduced to reduce the junction capacity, whereby it is possible to obtain a method of fabricating a semiconductor device which can attain a high-speed operation. Further, the channel cut injection layer 41 is prevented from influencing a threshold voltage, whereby it is possible to obtain a method of fabricating a semiconductor device which is further improved in element reliability.

While each transistor is enclosed with the isolation insulator film in the embodiment 2, a plurality of transistors may alternatively be present in the active region enclosed with an isolation region.

Embodiment 3

Figure 19:
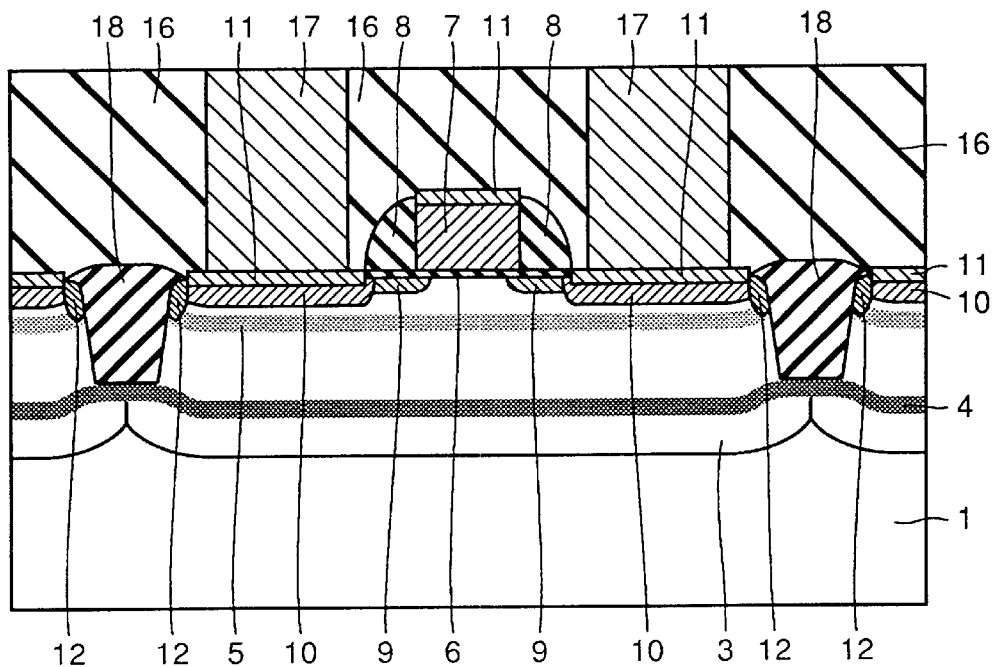
FIG. 19 is a sectional view showing an element of a semiconductor device according to an embodiment 3 of the present invention.

FIG. 19 shows an nMOS transistor element, which is provided with a trench isolator in place of a field oxide film. This trench isolator is formed by a trench provided on a surface of a semiconductor substrate 1 and a buried oxide film 18 filling up the trench. In this structure, n-type impurity layers 12 are provided to be in contact with an upper end portion of the buried oxide film 18. The boron concentration of a p well 3 is about $1\times10^{17}$ to $1\times10^{18}/cm^3$, the boron peak concentrations of a channel cut injection layer 4 and a channel injection layer 5 are about $1\times10^{17}$ to $1\times10^{18}/cm^3$ and about $1\times10^{17}$ to $1\times10^{18}/cm^{13}$ respectively, the arsenic concentrations of n-type extension layers 9 and sources/drains 10 are about $1\times10^{18}$ to $1\times10^{19}/cm^3$ and about $1\times10^{21}$ to $1\times10^{22}/cm^3$ respectively, and the phosphorus concentration of the n-type impurity layers 12 is about $1\times10^{18}$ to $1\times10^{19}/cm^3$.

A gate voltage, a source voltage, a drain voltage and a substrate voltage are applied to the gate electrode 7, the first and second ones of the sources/drains 10 and the p well 3 respectively, thereby forming a channel between the sources/drains 10 to feed a current. While depletion layers extend between the sources/drains 10 and the n-type impurity layers 12 and the p well 3 at this time, these depletion layers are not connected to the Co silicide layers 11 due to the n-type impurity layers 12 formed on end portions of the Co silicide layers 11 closer to an isolation region.

The silicide layers 11 may be prepared from Ni, Ti, W or Pt, in place of Co. While the n-type impurities may be prepared from any of arsenic, phosphorus and antimony, the sources/drains 10 and the n-type extension layers 9 are prepared from arsenic which is hard to diffuse, and the n-type impurity layers 12 are prepared from phosphorus which is easy to diffuse. Thus, the sources/drains 10 and the n-type extension layers 9 can be shallowly formed for suppressing punch-through, while the n-type impurity layers 12 can be deeply formed for further suppressing a leakage current.

Figure 20:
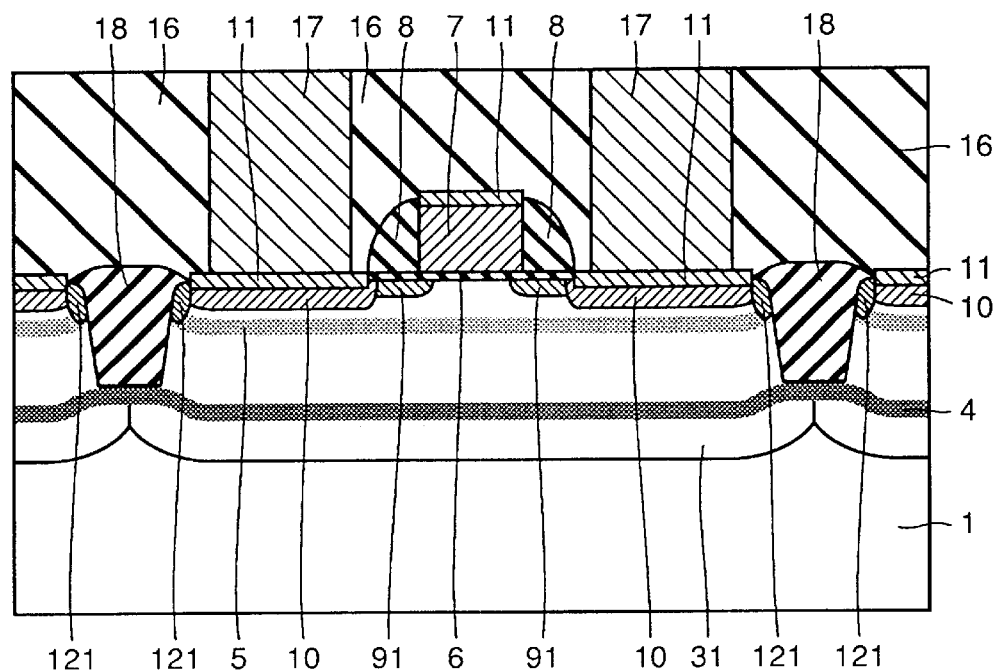
FIG. 20 is a sectional view showing another element of the semiconductor device according to the embodiment 3 of the present invention.

FIG. 20 shows the case of a pMOS transistor element. The arsenic concentration of an n well 31 is about $1\times10^{17}$ to $1\times10^{18}/cm^3$, the arsenic peak concentrations of a channel cut injection layer 4 and a channel injection layer 5 are about $1\times10^{17}$ to $1\times10^{18}/cm^3$ and about $1\times10^{17}$ to $1\times10^{18}/cm^3$ respectively, the boron concentrations of p-type extension layers 91 and sources/drains 10 are about $1\times10^{18}$ to $1\times10^{19}/cm^3$ and about $1\times10^{21}$ to $1\times10^{22}/cm^3$ respectively, and the boron concentration of p-type impurity layers 121 is about $1\times10^{18}$ to $1\times10^{19}/cm^3$.

Co silicide layers 11 may be prepared from Ni, Ti, W or Pt in place of Co, while the p-type impurities may be prepared from any of boron, boron fluoride and indium.

Also in the pMOS transistor, voltages are applied to form a channel between the sources/drains 10 for feeding a current, similarly to the nMOS transistor. In this case, depletion layers extend between the sources/drains 10 and the p-type impurity layers 121 and the n well 31. On end portions of the Co silicide layers 11 closer to an isolation region, however, the depletion layers are not connected to the Co silicide layers 11, due to the formation of the p-type impurity layers 121.

According to this semiconductor device, the n-type impurity layers 12 or the p-type impurity layers 121 are formed on the boundary portions between the sources/drains 10 and the buried oxide film 18 in portions deeper than the sources/drains 10. Even if the metal silicide layers such as the Co silicide layers 11 extend into portions under the buried oxide film 18 or end portions of the buried oxide film 18 are eroded, therefore, the metal silicide layers 11 are not directly connected to the p well 3 or the n well 31, the channel cut injection layer 4 or the channel injection layer 5, and the distances between pn junctions formed by the sources/drains 10 and the p well 3 or the n well 31 and end portions of the metal silicide layers 11 are not reduced. Thus, reliability in element operation is improved such that the leakage current is suppressed while maintaining the depths of the sources/drains 10.

Figure 21:
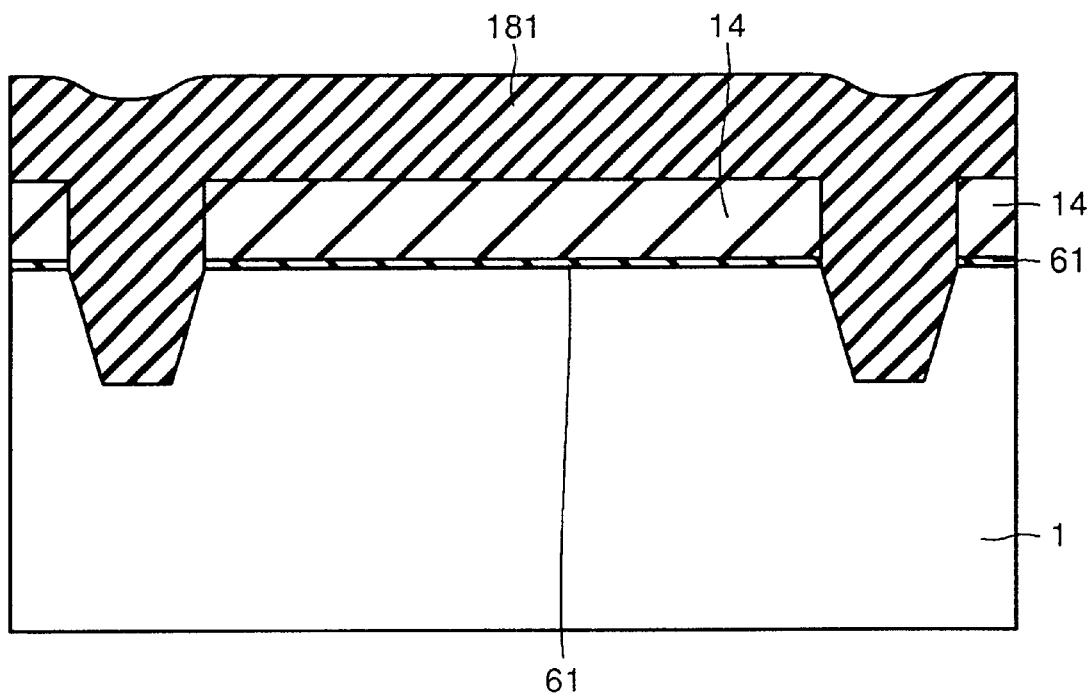
FIGS. 21 to 23 are sectional views of the element showing steps of a method of fabricating the semiconductor device according to the embodiment 3 of the present invention.
Figure 22:
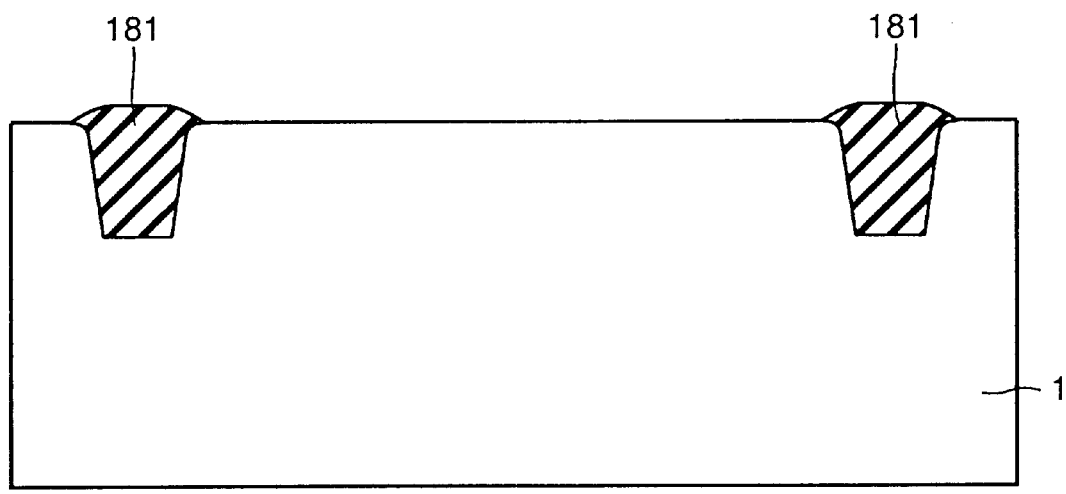
Figure 23:
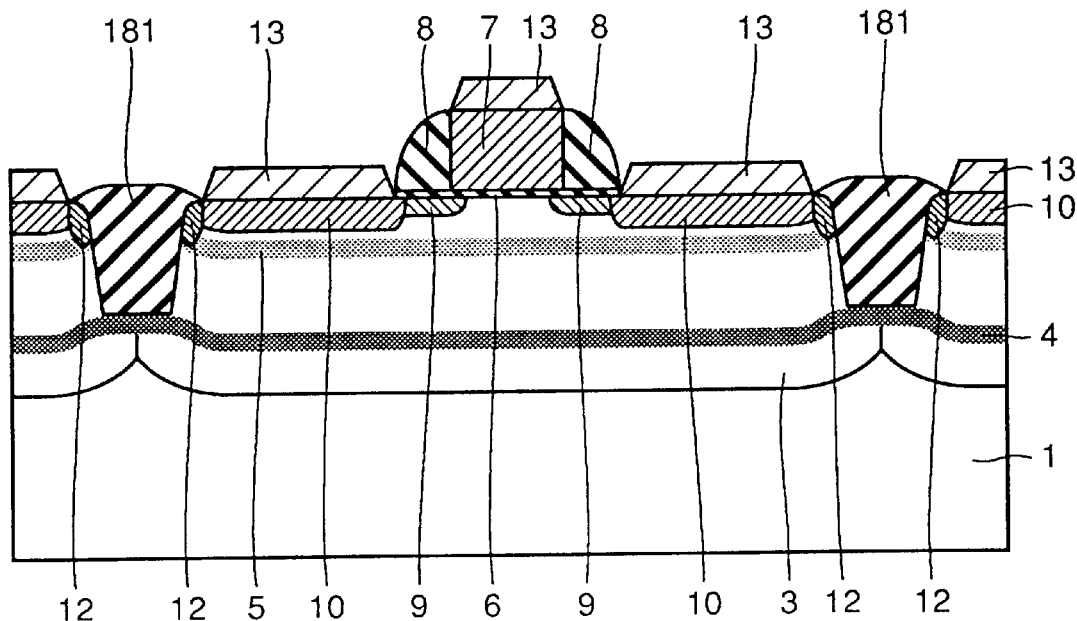

FIGS. 21, 22 and 23 are sectional views showing steps of a method of fabricating the semiconductor device according to the embodiment 3.

First, an oxide film 61 of about 300 Å and a silicon nitride film 14 of about 2000 Å are formed on a surface of an active region of the semiconductor substrate 1, and removed by dry etching through a mask for opening the isolation region, as shown in FIG. 21. Thereafter an exposed part of the semiconductor substrate 1 is dry-etched from its surface, for forming a trench of 3000 Å in depth.

Then, a TEOS oxide film 181 is formed on the overall surface in a thickness of about 7000 Å, and etched back by CMP (chemical mechanical polishing) for forming the buried oxide film 18, as shown in FIG. 22.

As shown in FIG. 23, the p well 3, the channel injection layer 5, the gate insulator film 6, the gate electrode 7, the n-type extension layers 9, the side walls 8 and the sources/drains 10 are formed similarly to the embodiment 1, and silicon layers 13 of about 1000 Å are formed by selective epitaxial growth on the gate electrode 7 and the sources/drains 10 exposing silicon on the surface thereof, and employed as masks for forming the n-type impurity layers 12. Thereafter the silicon layers 13 are removed by etching, and the Co silicide layers 11 are formed.

Similarly to the embodiment 1, the sources/drains 10 may be formed after removing the silicon layers 13 by etching. Further, the silicon layers 13 may be left unremoved if the thicknesses thereof are about 300 Å. In this case, the ion implantation for forming the sources/drains 10 is performed after formation of the silicon layers 13. Thus, the silicon layers 13 formed on the surfaces of the sources/drains 10 define parts of the sources/drains 10, and that on the surface of the gate electrode 7 defines a part of the gate electrode 7.

The pMOS transistor is formed similarly to the nMOS transistor. In each of the pMOS and nMOS transistors, the injection order for the channel injection layer 5 and the channel cut injection layer 4 may be reversed.

According to this method of fabricating a semiconductor device, the n-type impurity layers 12 or the p-type impurity layers 121 are formed in a self-aligned manner on the surface of the semiconductor substrate 1 under the end portions of the buried oxide film 18 by the silicon layers 13 formed in a self-aligned manner on the surfaces of the gate electrode 7 and the sources/drains 10 and the buried oxide film 18 having a large thickness on its central portion and a small thickness on its end portions. Thus, it is possible to obtain a method of fabricating a semiconductor device which is improved in reliability of its element operation through simplified steps.

Further, the n-type impurity layers 12 or the p-type impurity layers 121 are formed on the boundary portions between the sources/drains 10 and the buried oxide film 19 in portions deeper than the sources/drains 10. Even if the metal silicide layers such as the Co silicide layers 11 extend into portions under the buried oxide film 18 or end portions of the field oxide film 2 are eroded, therefore, the metal silicide layers 11 are not directly connected to the p well 3 or the n well 31, the channel cut injection layer 4 or the channel injection layer 5, and the distances between pn junctions formed by the sources/drains 10 and the p well 3 or the n well 31 and end portions of the metal silicide layers 11 are not reduced. Thus, it is possible to obtain a method of fabricating a semiconductor device which is improved in reliability of its element operation such that the leakage current is suppressed while maintaining the depths of the sources/drains 10.

FIGS. 24, 25, 26 and 27 are sectional views showing steps of another method of fabricating the semiconductor device according to the embodiment 3.

Figure 24:
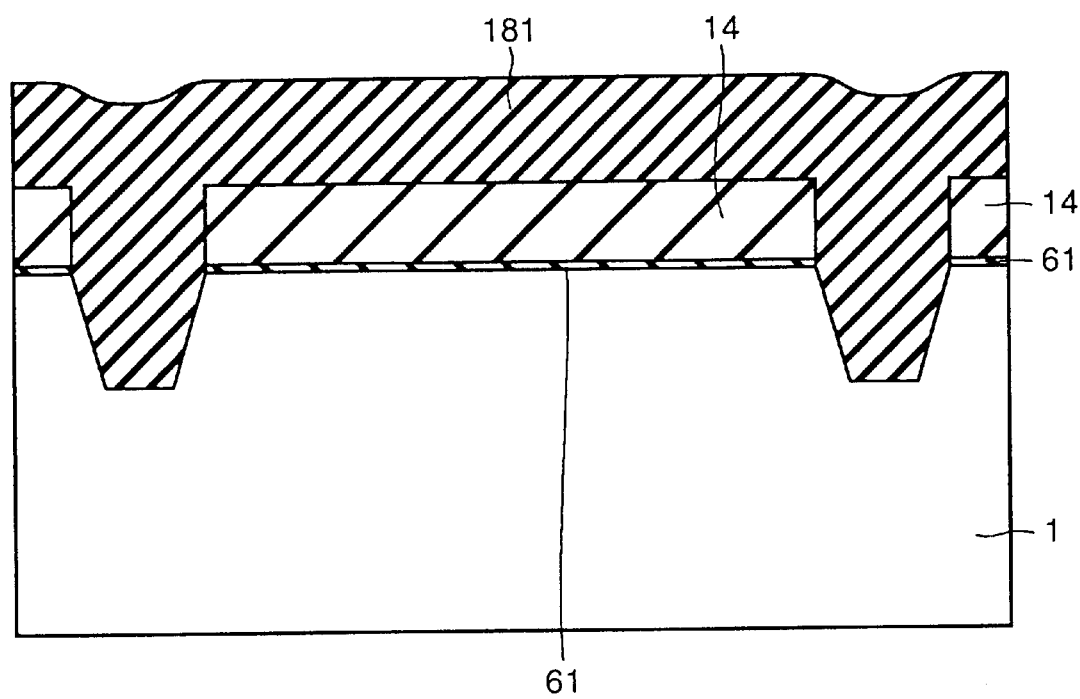
FIGS. 24 to 27 are sectional views of the element showing steps of another method of fabricating the semiconductor device according to the embodiment 3 of the present invention.
Figure 25:
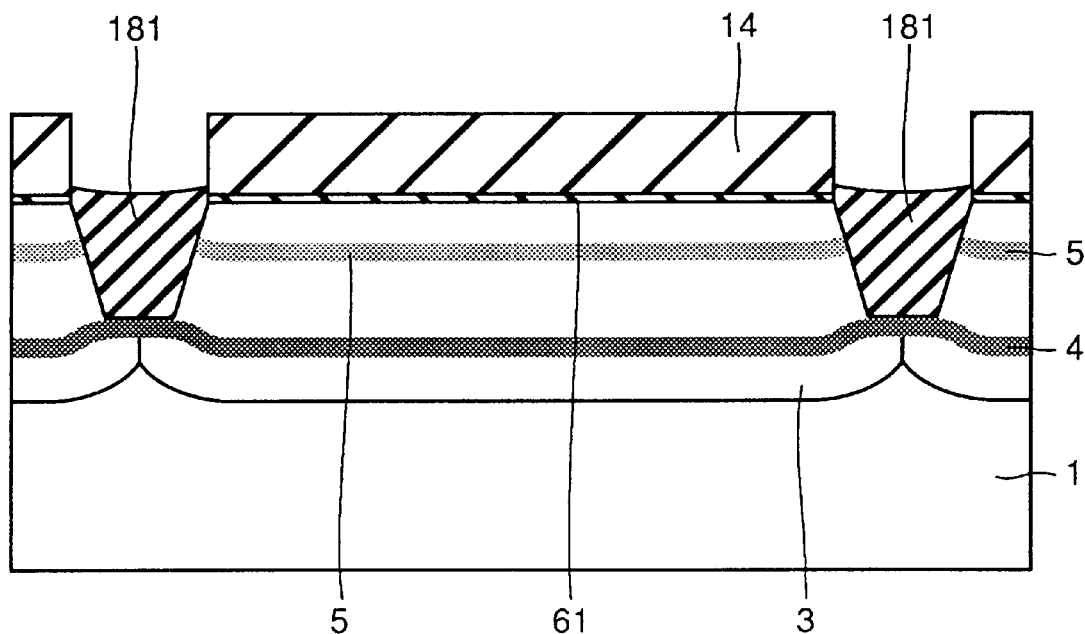

As shown in FIG. 24, an oxide film 61 of about 300 Å and a silicon nitride film 14 of about 2000 Å are formed on the surface of the active region of the semiconductor substrate 1, and partially removed by dry etching through a mask for opening an isolation region. Thereafter an exposed part of the semiconductor substrate 1 is dry-etched from its surface, for forming a trench of about 3000 Å in depth. Then, a TEOS oxide film 181 is formed on the overall surface in a thickness of about 7000 Å.

Then, the TEOS oxide film 181 is etched back by CMP (chemical mechanical polishing) to expose the surface of the silicon nitride film 14, and thereafter the p well 3, the channel cut injection layer 4 and the channel injection layer 5 are formed by vertically ion-implanting boron at about 300 keV and in about $1\times10^{13}$ to $1\times10^{14}$/cm$^2$, at about 100 keV and in about $1\times10^{12}$ to $1\times10^{13}$/cm$^2$ and at about 60 to 110 keV and in about $1\times10^{12}$ to $1\times10^{13}$/cm$^2$ respectively. The silicon nitride film 14 which is stronger in stress than the TEOS oxide film 181 is hard to polish.

Figure 26:
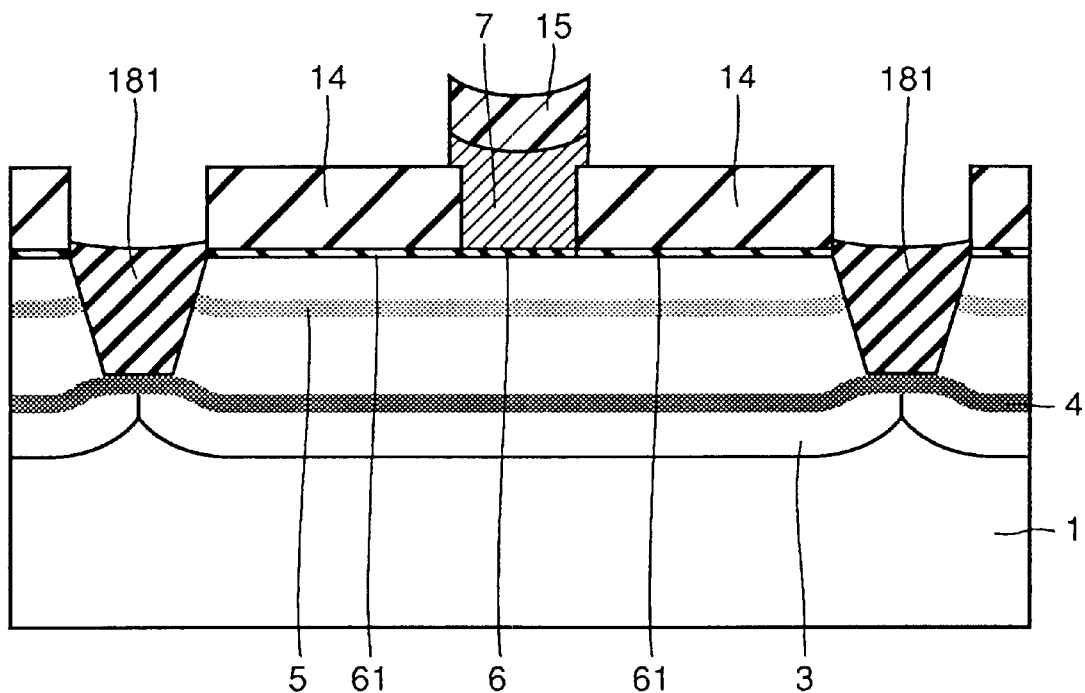

As shown in FIG. 26, the silicon nitride film 14 and the oxide film 61 are partially removed from the gate electrode forming region while masking the remaining parts and then the mask is removed, similarly to the embodiment 1. Thereafter the gate insulator film 6 is formed by thermal oxidation, and a polysilicon layer 71 is formed on the overall surface and etched through a resist film 15 serving as a mask formed on the gate electrode forming region, for forming the gate electrode 7. Thereafter the resist film 15 is removed.

Figure 27:
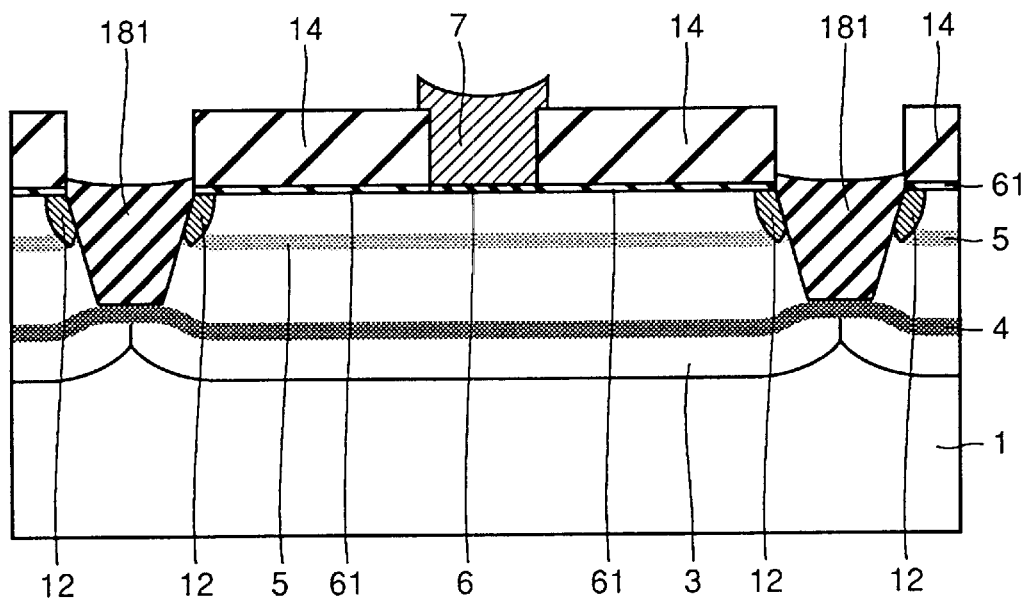

As shown in FIG. 27, the oxide film 61 is etched with a material having a high selection ratio to the silicon nitride film 14, and phosphorus is obliquely rotationally injected into the overall surface at 45° at about 10 to 40 keV and in about $1\times10^{13}$ to $1\times10^{14}$/cm$^2$, for forming the n-type impurity layers 12 on the boundary portions between the active region and the buried oxide film 18 except portions under the gate electrode 7. The silicon nitride film 14 is removed, and thereafter the oxide film 61 and an upper portion of the TEOS oxide film 181 are removed by etching.

The gate insulator film 6, the gate electrode 7, the n-type extension layers 9, the side walls 8 and the sources/drains 10 are formed similarly to the embodiment 1, and thereafter the Co silicide layers 11 are formed.

Also in case of the pMOS transistor, the semiconductor device is fabricated similarly to the case of the nMOS transistor, and boron is obliquely rotationally ion-implanted at 45° at about 5 to 10 keV and in about $1\times10^{12}$ to $1\times10^{13}$/cm$^2$ for forming the p-type impurity layers 121.

In each of the pMOS and nMOS transistors, the impurity concentrations of the channel injection layer 5 and the channel cut injection layer 4 have peaks with respect to the direction of depth from the surface of the substrate 1. In the active region, the impurity concentration peak of the channel injection layer 5 is formed in a depth of about 0.15 µm from the surface of the substrate 1.

In each of the pMOS and nMOS transistors, the channel injection layer 5 may be formed after partially removing the silicon nitride film 14 and the oxide film 61 for forming the gate electrode 7, similarly to the embodiment 1.

In this case, boron is rotationally ion-implanted at 7° at about 50 keV and in $1\times10^{12}$ to $1\times10^{13}$/cm$^2$ in the case of the nMOS transistor, at about 100 to 180 keV and in $1\times10^{12}$ to $1\times10^{13}$/cm$^2$ for a surface channel type pMOS transistor, or at about 10 to 20 keV and in $1\times10^{12}$ to $1\times10^{13}$/cm$^2$ for a buried channel type pMOS transistor.

Thus, the channel injection layer 5 is formed not under the sources/drains 10 but only under the gate electrode 7 in a self-aligned manner, whereby increase of the junction capacity and the junction leakage current is suppressed and the load is reduced, to enable a high-speed circuit operation.

According to this method of fabricating a semiconductor device, the n-type impurity layers 12 or the p-type impurity layers 121 are formed in a self-aligned manner on the surface of the semiconductor substrate 1 under the end portions of the buried oxide film 18 by the silicon nitride film 14 and the oxide film 61 formed for forming the buried oxide film 18. Thus, it is possible to obtain a method of fabricating a semiconductor device which is improved in reliability of its element operation through simplified steps.

Further, the n-type impurity layers 12 or the p-type impurity layers 121 are formed on the boundary portions between the sources/drains 10 and the buried oxide film 18 in portions deeper than the sources/drains 10. Even if the metal silicide layers such as the Co silicide layers 11 extend into portions under the buried oxide film 18 or end portions of the buried oxide film 18 are eroded, therefore, the metal silicide layers 11 are not directly connected to the p well 3 or the n well 31, the channel cut injection layer 4 or the channel injection layer 5, and the distances between pn junctions formed by the sources/drains 10 and the p well 3 or the n well 31 and end portions of the metal silicide layers 11 are not reduced. Thus, it is possible to obtain a method of fabricating a semiconductor device which is improved in reliability of its element operation such that the leakage current is suppressed while maintaining the depths of the sources/drains 10.

While each transistor is enclosed with the isolation insulator film in the embodiment 3, a plurality of transistors may alternatively be present in the active region enclosed with the isolation region.

Embodiment 4

Figure 28:
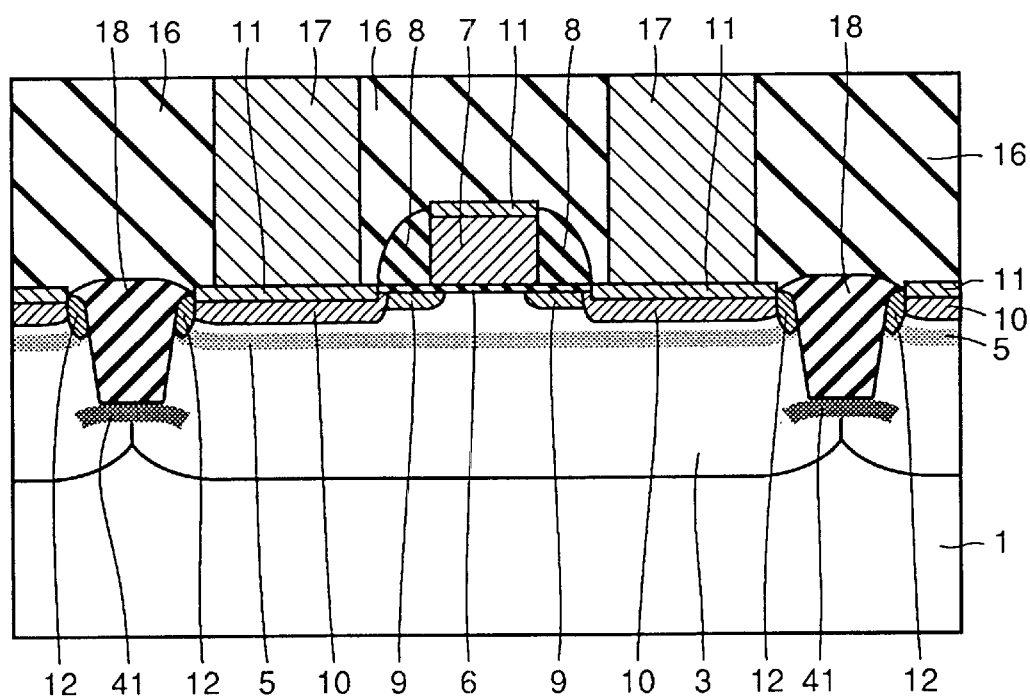
FIG. 28 is a sectional view showing an element of a semiconductor device according to an embodiment 4 of the present invention.

FIG. 28 shows an nMOS transistor element. This semiconductor device is different from that shown in FIG. 19 in a point that a channel cut injection layer 41 is formed not in an active region but only under a buried oxide film 18. This channel cut injection layer 41 has a boron peak concentration of about $1 \times 10^{17}$ to $1 \times 10^{18}/cm^3$.

Also in case of a PMOS transistor, the semiconductor device is different from that of the embodiment 3 in a point that a channel cut injection layer 41 is formed not in an active region but only under a buried oxide film 18, and the channel cut injection layer 41 has an arsenic peak concentration of about $1 \times 10^{17}$ to $1 \times 10^{18}/cm^3$.

According to this semiconductor device, n-type impurity layers 12 or p-type impurity layers 121 are formed on the boundary portions between sources/drains 10 and the buried oxide film 18 in portions deeper than the sources/drains 10. Even if metal silicide layers such as Co silicide layers 11 extend into portions under the buried oxide film 18 or end portions of the buried oxide film 18 are eroded, therefore, the metal silicide layers 11 are not directly connected to a p well 3 or an n well 31 or a channel injection layer 5, and the distances between pn junctions formed by the sources/drains 10 and the p well 3 or the n well 31 and end portions of the metal silicide layers 11 are not reduced. Thus, reliability in element operation is improved such that a leakage current is suppressed while maintaining the depths of the sources/drains 10.

Further, the area of the channel cut injection layer 41 formed only under the buried oxide film 18 is further reduced to reduce the junction capacity, whereby a high-speed operation can be effectively attained. In addition, the channel cut injection layer 41 is prevented from influencing a threshold voltage, whereby the reliability of the element is further improved.

Figure 29:
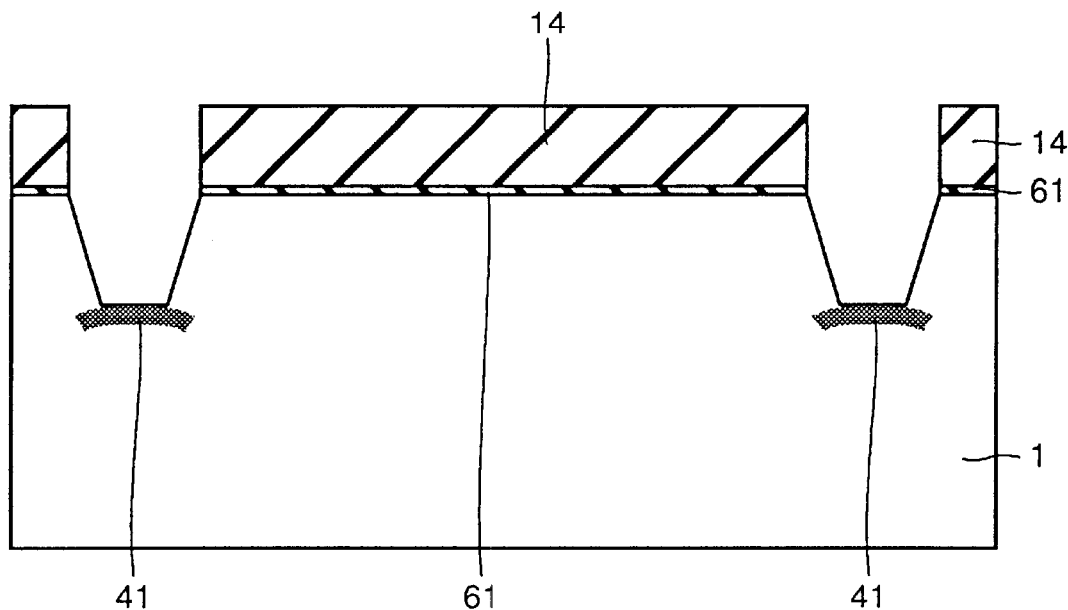
FIGS. 29 to 32 are sectional views of the element showing steps of a method of fabricating the semiconductor device according to the embodiment 4 of the present invention.
Figure 30:
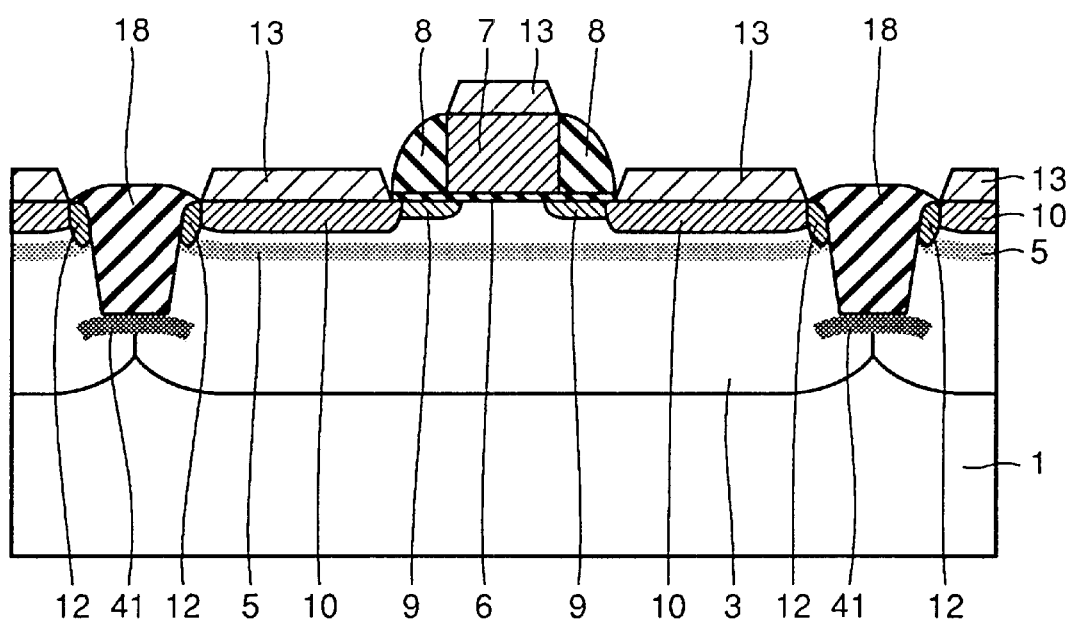

FIGS. 29 and 30 are sectional views showing steps of a method of fabricating the semiconductor device according to the embodiment 4.

First, an oxide film 61 of about 300 Å and a silicon nitride film 14 of about 2000 Å are formed on an active region of a semiconductor substrate 1, and partially removed by dry etching through a mask for opening an isolation region, similarly to the embodiment 3. Thereafter an exposed part of the semiconductor substrate 1 is dry-etched from its surface, for forming a trench of 3000 Å in depth.

Then, boron is vertically ion-implanted into the overall surface at about 5 to 10 keV and in about $1 \times 10^{12}$ to $1 \times 10^{13}/cm^2$ in case of the nMOS transistor, for forming the channel cut injection layer 41, as shown in FIG. 29. Thereafter the buried oxide film 18 is formed similarly to the embodiment 3.

As shown in FIG. 30, the p well 3, the channel injection layer 5, a gate insulator film 6, a gate electrode 7, n-type extension layers 9, side walls 8 and the sources/drains 10 are formed and thereafter silicon layers 13 of about 1000 Å are formed by selective epitaxial growth on the gate electrode 7 and the sources/drains 10 exposing silicon on surfaces thereof, and employed as masks for forming the n-type impurity layers 12, similarly to the embodiment 3. Thereafter the silicon layers 13 are removed by etching, and the Co silicide layers 11 are formed.

Also in case of the pMOS transistor, the semiconductor device is fabricated similarly to the case of the nMOS transistor. In this ace, phosphorus is vertically ion-implanted at about 5 to 10 keV and in about $1 \times 10^{12}$ to $1 \times 10^{13}/cm^2$ for forming the channel cut injection layer 41.

Similarly to the embodiment 3, the sources/drains 10 may be formed after removing the silicon layers 13 by etching. Further, the silicon layers 13 may be left unremoved if the thicknesses thereof are about 300 Å. In this case, the ion implantation for forming the sources/drains 10 is performed after formation of the silicon layers 13. Thus, the silicon layers 13 formed on the surfaces of the sources/drains 10 define parts of the sources/drains 10, and that on the surface of the gate electrode 7 defines a part of the gate electrode 7.

In each of the pMOS and nMOS transistors, the impurity concentration of the channel injection layer 5 has a peak with respect to the direction of depth from the surface of the substrate 1. In the active region, the impurity concentration peak of the channel injection layer is formed in a depth of about 0.15 μm from the surface of the substrate 1.

According to this method of fabricating a semiconductor device, the n-type impurity layers 12 or the p-type impurity layers 121 are formed in a self-aligned manner on the surface of the semiconductor substrate 1 under the end portions of the buried oxide film 18 by the silicon layers 13 formed in a self-aligned manner on the surfaces of the gate electrode 7 and the sources/drains 10 and the buried oxide film 18 having a large thickness on its central portion and a small thickness on its end portions. Thus, it is possible to obtain a method of fabricating a semiconductor device which is improved in reliability of its element operation through simplified steps.

Further, the n-type impurity layers 12 or the p-type impurity layers 121 are formed on the boundary portions between sources/drains 10 and the buried oxide film 18 in portions deeper than the sources/drains 10. Even if the metal silicide layers such as the Co silicide layers 11 extend into portions under the buried oxide film 18 or end portions of the buried oxide film 18 are eroded, therefore, the metal silicide layers 11 are not directly connected to the p well 3 or the n well 31 or the channel injection layer 5, and the distances between pn junctions formed by the sources/drains 10 and the p well 3 or the n well 31 and end portions of the metal silicide layers 11 are not reduced. Thus, it is possible to obtain a method of fabricating a semiconductor device which is improved in reliability of its element operation such that the leakage current is suppressed while maintaining the depths of the sources/drains 10.

In addition, the area of the channel cut injection layer 41 is reduced to reduce the junction capacity, whereby it is possible to obtain a method of fabricating a semiconductor device which can attain a high-speed operation. Further, the channel cut injection layer 41 is prevented from influencing a threshold voltage, whereby it is possible to obtain a method of fabricating a semiconductor device further improved in element reliability.

Figure 31:
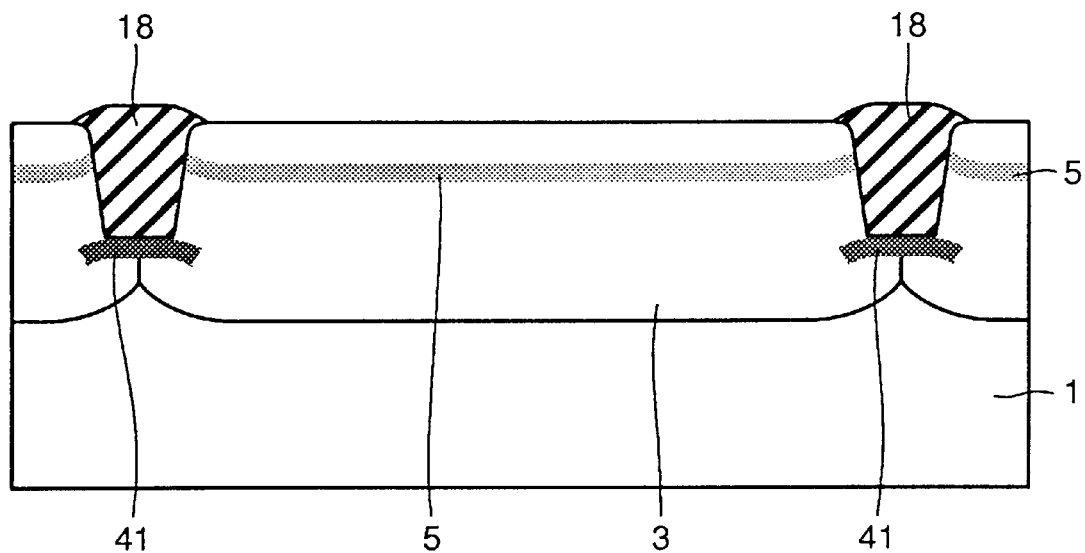
Figure 32:
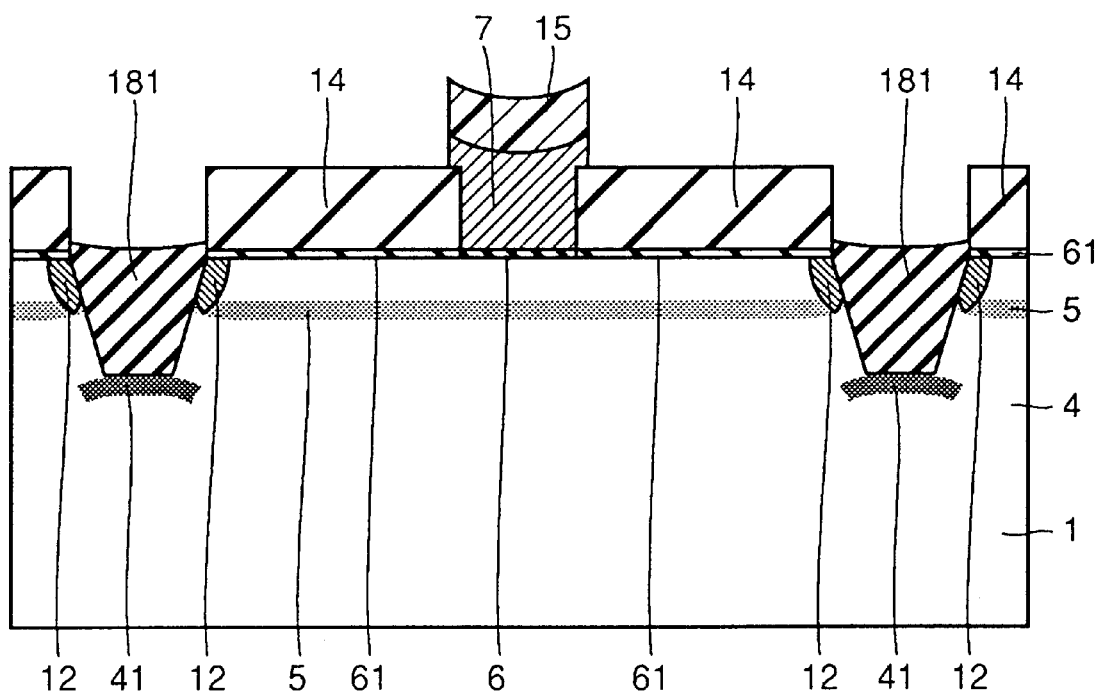

FIGS. 31 and 32 are sectional views showing steps of another method of fabricating the semiconductor device according to the embodiment 4.

As shown in FIG. 31, an oxide film 61 of about 300 Å and a silicon nitride film 14 of about 2000 Å are formed on the surface of the active region of the semiconductor substrate 1 and partially removed by dry etching through a mask for opening an isolation region, similarly to the embodiment 3. An exposed part of the semiconductor substrate 1 is dry-etched from its surface, for forming a trench of 3000 Å in depth. Thereafter boron is vertically ion-implanted into the overall surface at about 5 to 10 keV and in $1\times10^{12}$ to $1\times10^{13}/cm^2$, for forming the channel cut injection layer 41. A TEOS oxide film 181 is formed on the overall surface in a thickness of about 7000 Å.

Then, the TEOS oxide film 181 is etched back to expose a surface of the silicon nitride film 14, and thereafter the p well 3 and the channel injection layer 5 are formed, similarly to the embodiment 3.

As shown in FIG. 32, the silicon nitride film 14 and the oxide film 61 are partially removed from the gate electrode forming region while masking the remaining parts and then the mask is removed. Thereafter the gate insulator film 6 is formed by thermal oxidation, and a polysilicon layer 71 is formed on the overall surface and etched through a resist film 15 serving as a mask formed on the gate electrode forming region, for forming the gate electrode 7. Thereafter the resist film 15 is removed. Similarly to the embodiment 3, the oxide film 61 is etched with a material having a high selection ratio to the silicon nitride film 14, for forming the n-type impurity layers 12 on the boundary portions between the active region and the buried oxide film 18 except portions under the gate electrode 7. The silicon nitride film 14 is removed, and thereafter the oxide film 61 and an upper portion of the TEOS oxide film 181 are removed by etching, for forming the buried oxide film 18.

Similarly to the embodiment 3, the p well 3, the gate insulator film 6, the gate electrode 7, the n-type extension layers 9, the side walls 8 and the sources/drains 10 are formed, and thereafter the Co silicide layers 11 are formed.

Also in case of the PMOS transistor, the semiconductor device is fabricated similarly to the case of the nMOS transistor. In this case, boron is vertically ion-implanted at 45° at about 5 to 10 keV and in $1\times10^{12}$ to $1\times10^{13}/cm^2$ for forming the p-type impurity layers.

In each of the pMOS and nMOS transistors, the channel injection layer 5 may be formed after partially removing the silicon nitride film 14 and the oxide film 61 for forming the gate electrode 7 and before forming the gate insulator film 6, similarly to the embodiment 3.

In this case, boron is rotationally ion-implanted at 7° at about 50 keV and in $1\times10^{12}$ to $1\times10^{13}/cm^2$ in the case of the nMOS transistor, at about 100 to 180 keV and in $1\times10^{12}$ to $1\times10^{13}/cm^2$ for a surface channel type pMOS transistor, or at about 10 to 20 keV and in $1\times10^{12}$ to $1\times10^{13}/cm^2$ for a buried channel type PMOS transistor.

Thus, the channel injection layer 5 is formed not under the sources/drains 10 but only under the gate electrode 7 in a self-aligned manner, whereby increase of the junction capacity and the junction leakage current is suppressed and the load is reduced, to enable a high-speed circuit operation.

According to this method of fabricating a semiconductor device, the n-type impurity layers 12 or the p-type impurity layers 121 are formed in a self-aligned manner on the surface of the semiconductor substrate 1 under the end portions of the buried oxide film 18 by the silicon nitride film 14 formed for forming the buried oxide film 18. Thus, it is possible to obtain a method of fabricating a semiconductor device which is improved in reliability of its element operation through simplified steps.

Further, the n-type impurity layers 12 or the p-type impurity layers 121 are formed on the boundary portions between sources/drains 10 and the buried oxide film 18 in portions deeper than the sources/drains 10. Even if the metal silicide layers such as the Co silicide layers 11 extend into portions under the buried oxide film 18 or end portions of the buried oxide film 18 are eroded, therefore, the metal silicide layers 11 are not directly connected to the p well 3 or the n well 31 or the channel injection layer 5, the distances between pn junctions formed by the sources/drains 10 and the p well 3 or the n well 31 and end portions of the metal silicide layers 11 are not reduced, and it is possible to obtain a method of fabricating a semiconductor device which is improved in reliability of its element operation such that the leakage current is suppressed while maintaining the depths of the sources/drains 10.

In addition, the area of the channel cut injection layer 41 is reduced to reduce the junction capacity, whereby it is possible to obtain a method of fabricating a semiconductor device which can attain a high-speed operation. Further, the channel cut injection layer 41 is prevented from influencing a threshold voltage, whereby it is possible to obtain a method of fabricating a semiconductor device further improved in element reliability.

While each transistor is enclosed with the isolation insulator film in the embodiment 4, a plurality of transistors may alternatively be present in the active region enclosed with the isolation region.

Embodiment 5

Figure 33:
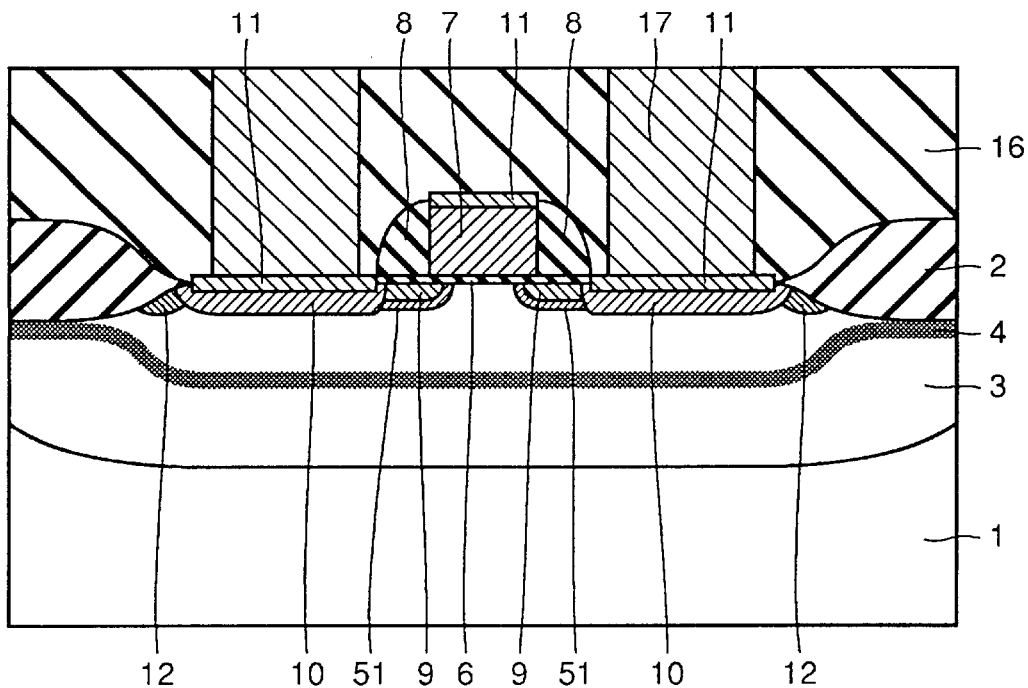
FIG. 33 is a sectional view showing an element of a semiconductor device according to an embodiment 5 of the present invention.
Figure 34:
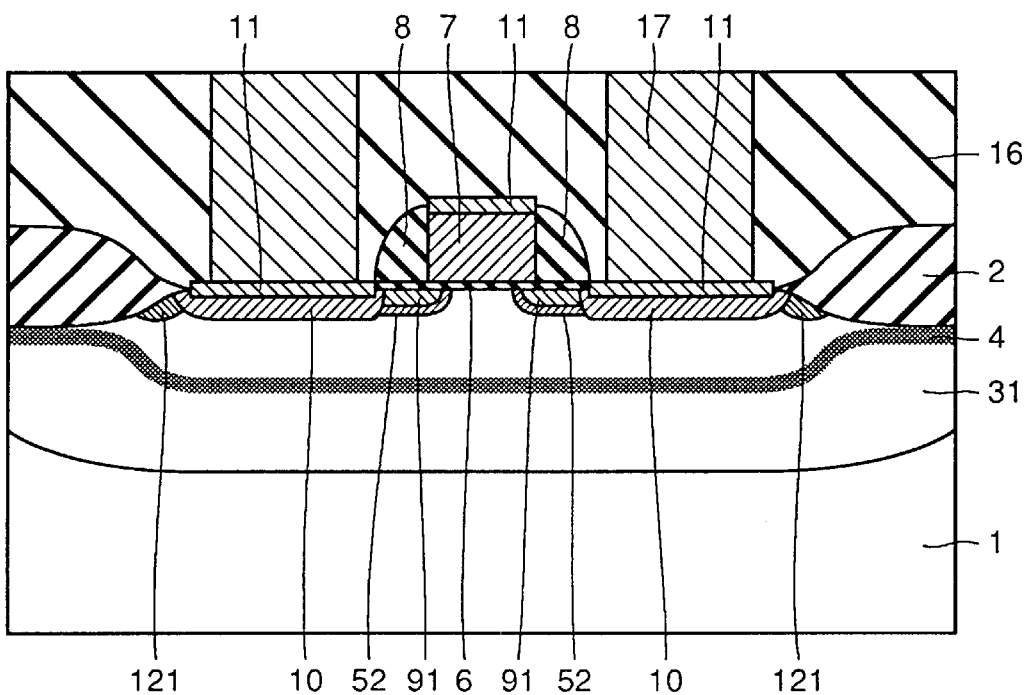
FIG. 34 is a sectional view showing another element of the semiconductor device according to the embodiment 5 of the present invention.

A structure shown in FIG. 33 is obtained by additionally providing p-type impurity layers 51 on the structure shown in FIG. 1. The p-type impurity layers 51 are in contact with n-type extension layers 9 for enclosing the same, and further in contact with sources/drains 10. The p-type impurity layers 51 are formed to be shallower than the sources/drains 10. On the other hand, FIG. 34 shows the structure of a pMOS transistor element having parts which are reversed in conductivity type to those in FIG. 33. Thus, the structure shown in FIG. 34 is provided with n-type impurity layers 52, in place of the p-type impurity layers 51.

FIG. 33 shows an nMOS transistor element, and the boron concentration of a p well 3 is about $1\times10^{17}$ to $1\times10^{18}/cm^3$, the boron peak concentration of a channel cut injection layer 4 is about $1\times10^{17}$ to $1\times10^{18}/cm^3$, the boron concentration of the p-type impurity layers 51 is about $1\times10^{17}$ to $1\times10^{18}/cm^3$, the arsenic concentrations of the n-type extension layers 9 and the sources/drains 10 are about $1\times10^{18}$ to $1\times10^{19}/cm^3$ and about $1\times10^{21}$ to $1\times10^{22}/cm^3$ respectively, and the phosphorus concentration of n-type impurity layers 12 is about $1\times10^{18}$ to $1\times10^{19}/cm^3$.

A gate voltage, a source voltage, a drain voltage and a substrate voltage are applied to a gate electrode 7, the first and second ones of the sources/drains 10 and the p well 3 respectively, thereby forming a channel between the sources/drains 10 to feed a current. While depletion layers extend between source/drains 10 and the n-type impurity layers 12 and the p well 3 at this time, these depletion layers are not connected to Co silicide layers 11 due to the n-type impurity layers 12 formed on end portions of the Co silicide layers 11 closer to an isolation region.

The silicide layers 11 may be prepared from Ni, Ti, W or Pt, in place of Co. While the n-type impurities may be prepared from any of arsenic, phosphorus and antimony, the sources/drains 10 and the n-type extension layers 9 are prepared from arsenic which is hard to diffuse, and the n-type impurity layers 12 are prepared from phosphorus which is easy to diffuse. Thus, the sources/drains 10 and the n-type extension layers 9 can be shallowly formed for suppressing punch-through, while the n-type impurity layers 12 can be deeply formed for further suppressing a leakage current.

FIG. 34 shows the pMOS transistor element, and the arsenic concentration of an n well 31 is about $1 \times 10^{17}$ to $1 \times 10^{18}/cm^3$, the arsenic peak concentration of a channel cut injection layer 4 is about $1 \times 10^{17}$ to $1 \times 10^{18}/cm^3$, the arsenic concentration of the n-type impurity layers 52 is about $1 \times 10^{17}$ to $1 \times 10^{18}/cm^3$, the boron concentrations of p-type extension layers 91 and sources/drains 10 are about $1 \times 10^{18}$ to $1 \times 10^{19}/cm^3$ and about $1 \times 10^{21}$ to $1 \times 10^{22}/cm^3$ respectively, and the boron concentration of p-type impurity layers 121 is about $1 \times 10^{18}$ to $1 \times 10^{19}/cm^3$.

Also in the pMOS transistor, voltages are applied to form a channel between the sources/drains 10 for feeding a current, similarly to the nMOS transistor. In this case, depletion layers extend between the sources/drains 10 and the p-type impurity layers 121 and the n well 31. On end portions of the Co silicide layers 11 closer to an isolation region, however, the depletion layers are not connected to the Co silicide layers 11, due to the formation of the p-type impurity layers 121.

The material for the Co silicide layers 11 may be prepared from Ni, Ti, W or Pt in place of Co, while the p-type impurities may be prepared from any of boron, boron fluoride and indium.

In each of the nMOS and pMOS transistors, a channel injection layer having a concentration about half that in the embodiment 1 may be provided.

According to this semiconductor device, the n-type impurity layers 12 or the p-type impurity layers 121 are formed on the boundary portions between the sources/drains 10 and a field oxide film 2 in portions deeper than the sources/drains 10. Even if the metal silicide layers such as the Co silicide layers 11 extend into portions under the field oxide film 2 or end portions of the field oxide film 2 are eroded, therefore, the metal silicide layers 11 are not directly connected to the p well 3 or the n well 31 or the channel cut injection layer 4, and the distances between pn junctions formed by the sources/drains 10 and the p well 3 or the n well 31 and end portions of the metal silicide layers 11 are not reduced. Thus, reliability in element operation is improved such that the leakage current is suppressed while maintaining the depths of the sources/drains 10.

Further, the p-type impurity layers 51 or the n-type impurity layers 52 are formed to enclose the n-type extension layers 9 or the p-type extension layers 91. Thus, punch-through is suppressed, and the semiconductor device may be provided with no or only a low-concentration channel injection layer. Thus, increase of the junction capacity and the junction leakage current is suppressed and the load is reduced, to effectively enable a high-speed circuit operation.

Figure 35:
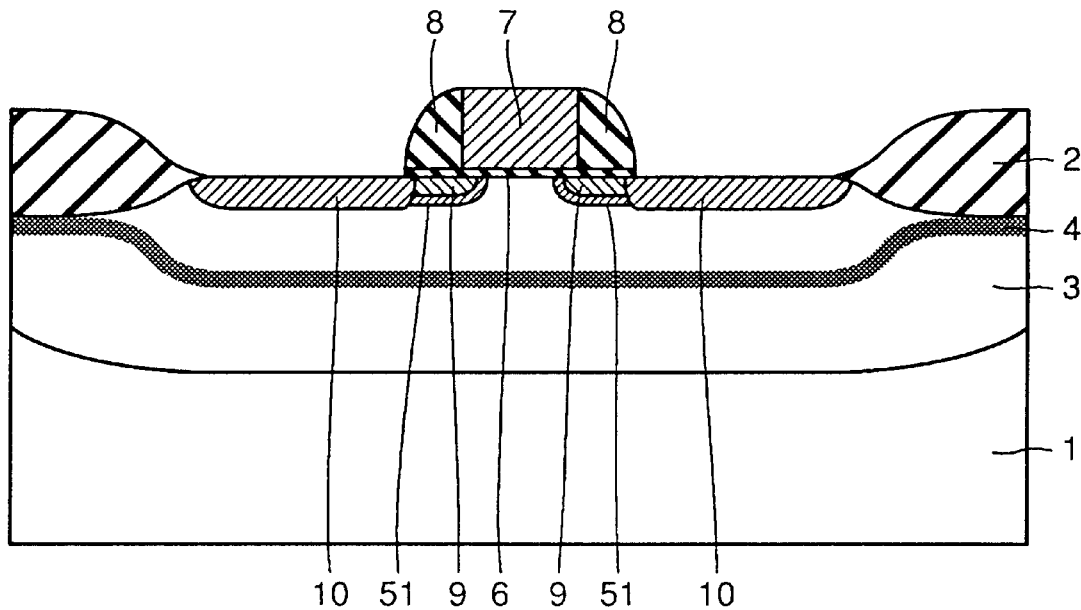
FIGS. 35 and 36 are sectional views of the element showing steps of a method of fabricating the semiconductor device according to the embodiment 5 of the present invention.
Figure 36:
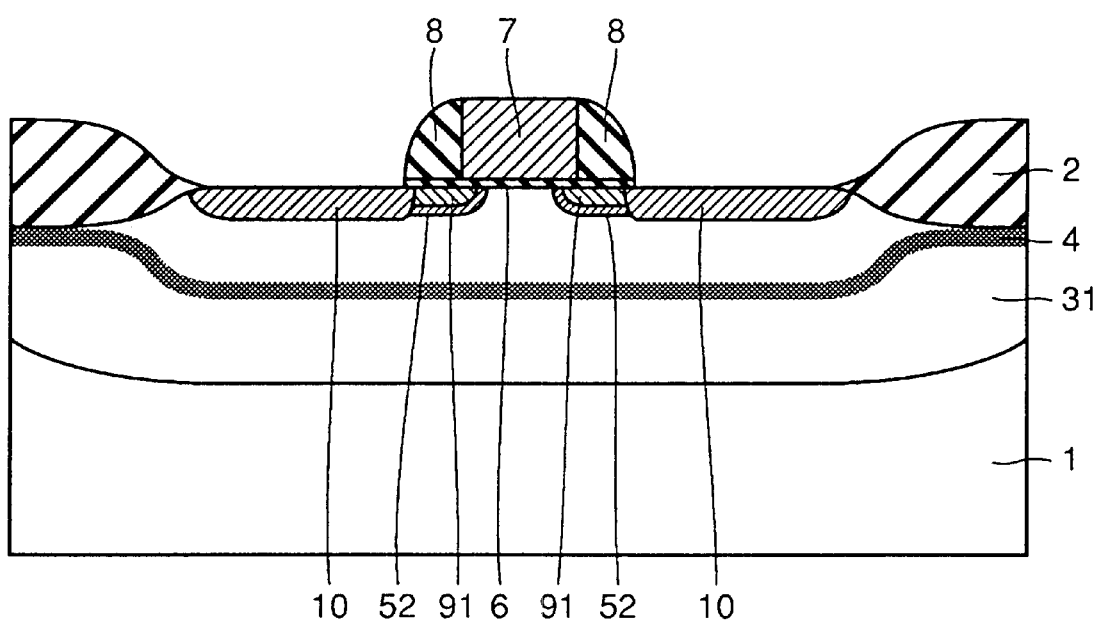

FIGS. 35 and 36 are sectional views showing steps of a method of fabricating the semiconductor device according to the embodiment 5.

Similarly to the embodiment 1, the field oxide film 2 is formed through masks of an oxide film 61 of about 200 Å and a silicon nitride film 14 of about 3000 Å, and thereafter the p well 3 is formed.

In this case, the oxide film 61 may be replaced with a silicon nitride oxide film, or a polysilicon film may be further formed on the oxide film 61. After etching of the silicon nitride film 14 and the oxide film 61, an exposed part of the active region of the semiconductor substrate 1 may be etched by about 1000 Å for thereafter forming the field oxide film 2.

Then, a gate insulator film 6, a gate electrode 7 and the n-type extension layers 9 are formed similarly to the embodiment 1, and boron is rotationally ion-implanted at 45° at about 5 to 30 keV and in about $1 \times 10^{13}$ to $1 \times 10^{14}/cm^2$ for forming the p-type impurity layers 51, and thereafter side walls 8 and the sources/drains 10 are formed, as shown in FIG. 35. The p-type impurity layers 51 and the n-type extension layers 9 may be formed in reversed order.

Similarly to the embodiment 1, silicon layers 13 of about 1000 Å are formed by selective epitaxial growth on the gate electrode 7 and the sources/drains 10 exposing silicon on surfaces thereof, and employed as masks for forming the n-type impurity layers 12. Then the silicon layers 13 are removed by etching, and thereafter the Co silicide layers 11 are formed.

Also in case of the PMOS transistor, a field oxide film 2 and the n well 31 are formed, thereafter the gate insulator film 6, the gate electrode 7 and the p-type extension layers 91 are formed, phosphorus is rotationally ion-implanted at 7° at about 5 to 60 keV and in about $1 \times 10^{13}$ to $1 \times 10^{14}/cm^2$ for forming the n-type impurity layers 52, and thereafter the side walls 8 and the sources/drains 10 are formed, similarly to the nMOS transistor. The n-type impurity layers 52 and the p-type extension layers 91 may be formed in reversed order.

Similarly to the embodiment 1, the sources/drains 10 may be formed after removing the silicon layers 13 by etching. Further, the silicon layers 13 may be left unremoved if the thicknesses thereof are about 300 Å. In this case, the ion implantation for forming the sources/drains 10 is performed after formation of the silicon layers 13. Thus, the silicon layers 13 formed on the surfaces of the sources/drains 10 define parts of the sources/drains 10, and that on the surface of the gate electrode 7 defines a part of the gate electrode 7.

Each of the nMOS and pMOS transistors may be provided with a channel injection layer 5 having an impurity concentration about half that in the embodiment 1 in an injection concentration about half that in the embodiment 1, and the impurity concentrations of the channel injection layer 5 and the channel cut injection layer 4 have peaks with respect to the direction of depth from the surface of the substrate 1.

According to this method of fabricating a semiconductor device, the n-type impurity layers 12 or the p-type impurity layers 121 are formed in a self-aligned manner on the surface of the semiconductor substrate 1 under the end portions of the field oxide film 2 by the silicon layers 13 formed in a self-aligned manner on the surfaces of the gate electrode 7 and the sources/drains 10 and the field oxide film 2 having a large thickness on its central portion and a small thickness on its end portions. Thus, it is possible to obtain a method of fabricating a semiconductor device which is improved in reliability of its element operation through simplified steps.

Further, the n-type impurity layers 12 or the p-type impurity layers 121 are formed on the boundary portions between the sources/drains 10 and the field oxide film 2 in portions deeper than the sources/drains 10. Even if the metal silicide layers such as the Co silicide layers 11 extend into portions under the field oxide film 2 or end portions of the field oxide film 2 are eroded, therefore, the metal silicide layers 11 are not directly connected to the p well 3 or the n well 31 or the channel cut injection layer 4, and the distances between pn junctions formed by the sources/drains 10 and the p well 3 or the n well 31 and end portions of the metal silicide layers 11 are not reduced, whereby it is possible to obtain a method of fabricating a semiconductor device which is improved in reliability of its element operation such that the leakage current is suppressed while maintaining the depths of the sources/drains 10.

Further, the p-type impurity layers 51 or the n-type impurity layers 52 are formed to enclose the n-type extension layers 9 or the p-type extension layers 91, whereby punch-through is suppressed, and the semiconductor device may be provided with no or only a low-concentration channel injection layer. Thus, increase of the junction capacity and the junction leakage current is suppressed and the load is reduced, whereby it is possible to effectively obtain a method of fabricating a semiconductor device enabling a high-speed circuit operation.

Figure 37:
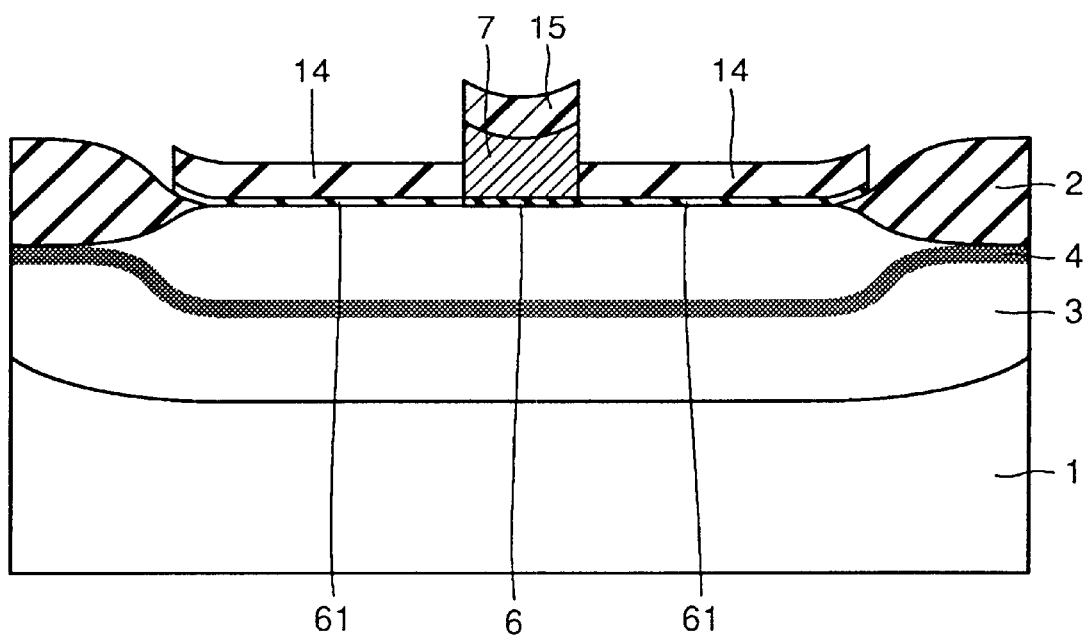
FIGS. 37 to 39 are sectional views of the element showing steps of another method of fabricating the semiconductor device according to the embodiment 5 of the present invention.
Figure 38:
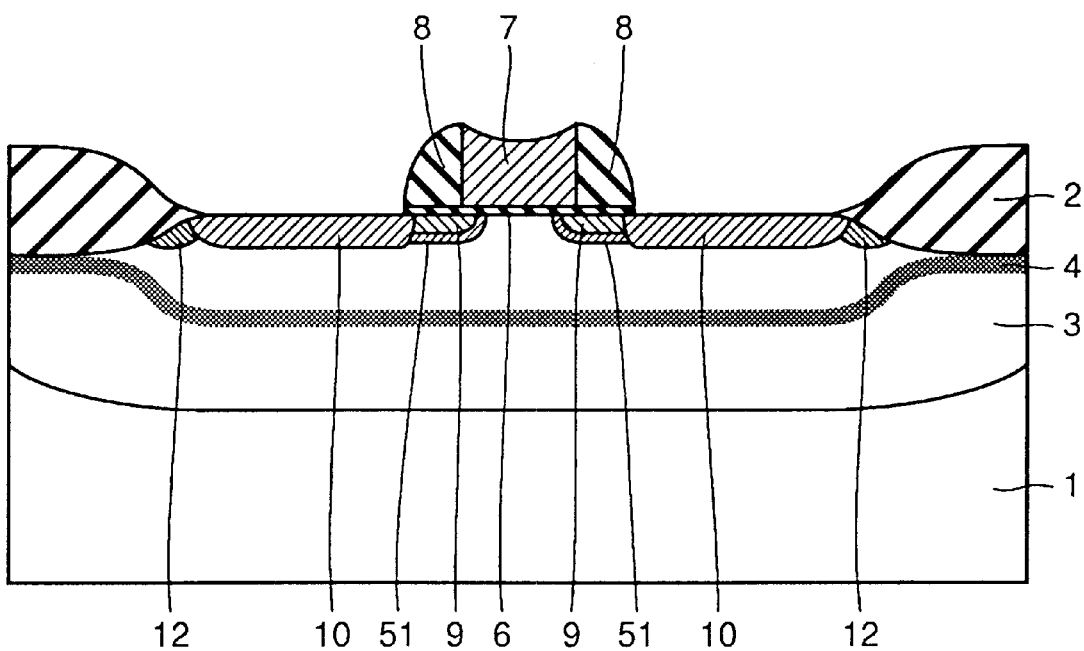
Figure 39:
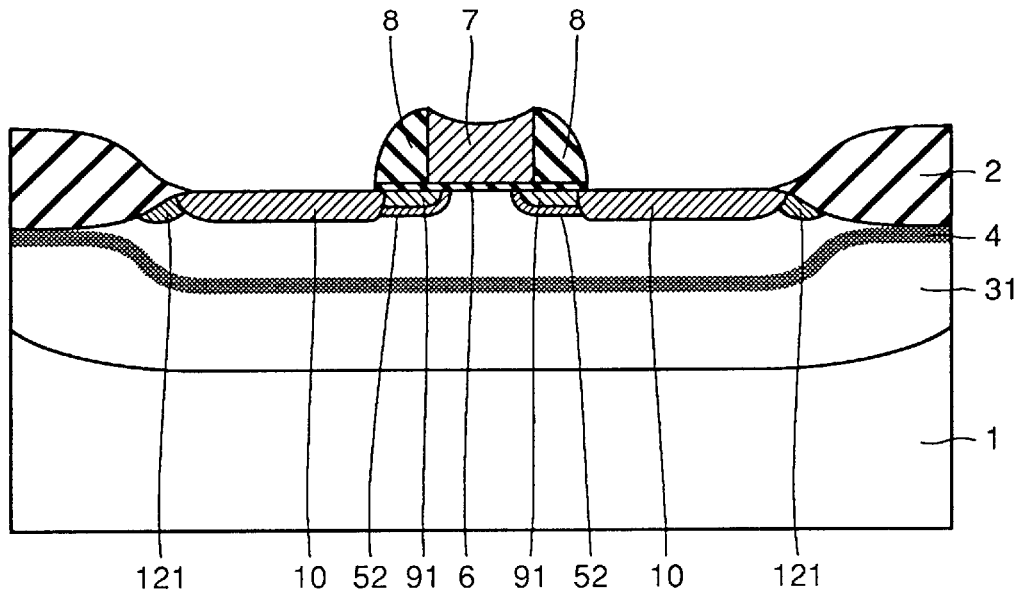

FIGS. 37, 38 and 39 are sectional views showing the element in steps of another method of fabricating the semiconductor device according to the embodiment 5.

Similarly to the embodiment 1, the field oxide film 2 is formed through masks of an oxide film 61 of about 200 Å and a silicon nitride film 14 of about 1000 Å, and thereafter the p well 3 and the channel cut injection layer 4 are formed in the active region enclosed with the field oxide film 2.

As shown in FIG. 37, the silicon nitride film 14 and the oxide film 61 are partially removed from a gate electrode forming region similarly to the embodiment 1, the gate insulator film 6 is formed by thermal oxidation, and a polysilicon layer 71 is formed on the overall surface. The polysilicon layer 71 is etched through a resist film 15 serving as a mask formed on the gate electrode forming region, for forming the gate electrode 7.

The resist film 15 is removed, and thereafter the n-type impurity layers 12 are formed on the boundary portions between the active region and the field oxide film 2 except portions under the gate electrode 7, similarly to the embodiment 1. Thereafter the silicon nitride film 14 is removed by etching.

The n-type extension layers 9 are formed similarly to the embodiment 1, thereafter boron is rotationally ion-implanted at 45° at about 5 to 30 keV and in about $1 \times 10^{13}$ to $1 \times 10^{14}/cm^2$ for forming the p-type impurity layers 51, and the side walls 8, the sources/drains 10 and the Co silicide layers 11 are formed as shown in FIG. 38. The p-type impurity layers 51 and the n-type extension layers 9 may be formed in reversed order.

Also in case of the pMOS transistor, the field oxide film 2 and the n well 31 are formed similarly to the embodiment 1, as shown in FIG. 39. Then the gate insulator film 6, the gate electrode 7 and the p-type extension layers 91 are formed, phosphorus is rotationally ion-implanted at 7° at about 5 to 60 keV and in about $1 \times 10^{13}$ to $1 \times 10^{14}/cm^2$ for forming the n-type impurity layers 52, and thereafter the side walls 8 and the sources/drains 10 are formed. The n-type impurity layers 52 and the p-type extension layers 91 may be formed in reversed order.

Each of the nMOS and pMOS transistors may be provided with a channel injection layer 5 having an impurity concentration about half that in the embodiment 1 in an injection concentration about half that in the embodiment 1, and the impurity concentrations of the channel injection layer 5 and the channel cut injection layer 4 have peaks with respect to the direction of depth from the surface of the substrate 1.

According to this method of fabricating a semiconductor device, the n-type impurity layers 12 or the p-type impurity layers 121 are formed in a self-aligned manner on the surface of the semiconductor substrate 1 under the end portions of the field oxide film 2 by the silicon nitride film 14 formed for forming the field oxide film 2. Thus, it is possible to obtain a method of fabricating a semiconductor device which is improved in reliability of its element operation through simplified steps.

Further, the n-type impurity layers 12 or the p-type impurity layers 121 are formed on the boundary portions between the sources/drains 10 and the field oxide film 2 in portions deeper than the sources/drains 10. Even if the metal silicide layers such as the Co silicide layers 11 extend into portions under the field oxide film 2 or end portions of the field oxide film 2 are eroded, therefore, the metal silicide layers 11 are not directly connected to the p well 3 or the n well 31 or the channel cut injection layer 4, and the distances between pn junctions formed by the sources/drains 10 and the p well 3 or the n well 31 and end portions of the metal silicide layers 11 are not reduced, whereby it is possible to obtain a method of fabricating a semiconductor device which is improved in reliability of its element operation such that the leakage current is suppressed while maintaining the depths of the sources/drains 10.

In addition, the p-type impurity layers 51 or the n-type impurity layers 52 are formed to enclose the n-type extension layers 9 or the p-type extension layers 91, whereby punch-through is suppressed, and the semiconductor device may be provided with no or only a low-concentration channel injection layer. Thus, increase of the junction capacity and the junction leakage current is suppressed and the load is reduced, whereby it is possible to effectively obtain a method of fabricating a semiconductor device enabling a high-speed circuit operation.

While each transistor is enclosed with the isolation insulator film in the embodiment 5, a plurality of transistors may alternatively be present in the active region enclosed with the isolation region.

Embodiment 6

Figure 40:
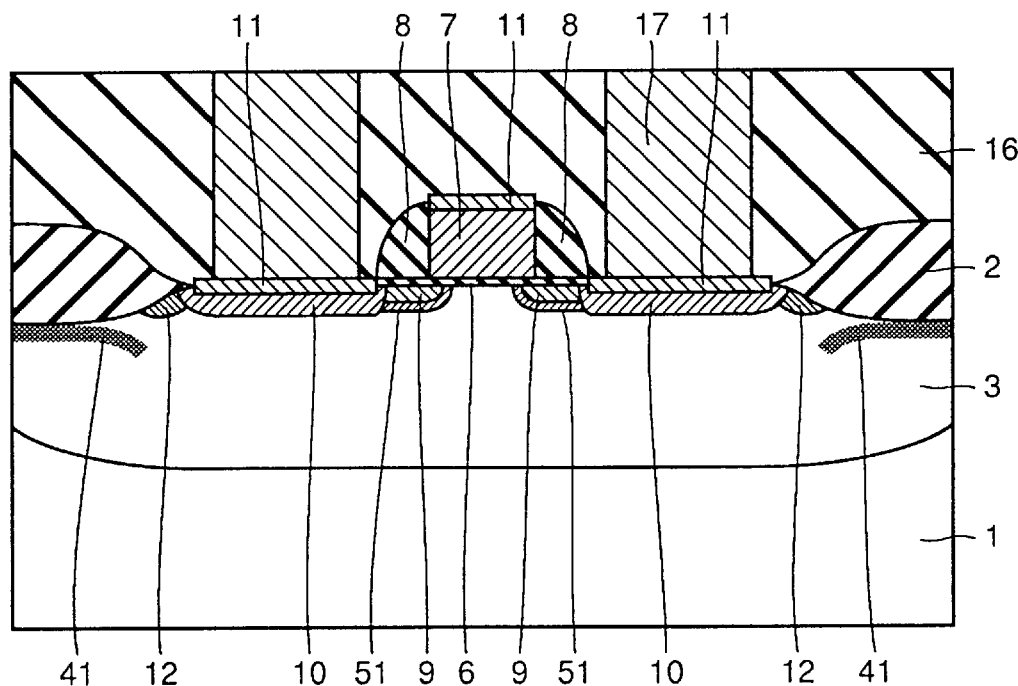
FIG. 40 is a sectional view showing an element of a semiconductor device according to an embodiment 6 of the present invention.

FIG. 40 shows an nMOS transistor element. This semiconductor device is different from that shown in FIG. 33 in a point that a channel cut injection layer 41 is formed not in an active region but only under a field oxide film 2. The boron peak concentration of this channel cut injection layer 41 is about $1 \times 10^{17}$ to $1 \times 10^{18}/cm^3$.

Also in case of a pMOS transistor, the semiconductor device is different from that of the embodiment 1 in a point that a channel cut injection layer 41 is formed not in an active region but only under a field oxide film 2, and a channel cut injection layer 41 has an arsenic peak concentration of about $1 \times 10^{17}$ to $1 \times 10^{18}/cm^3$.

Each of the nMOS and pMOS transistors may be provided with a channel injection layer having an impurity concentration about half that in the embodiment 1.

According to this semiconductor device, n-type impurity layers 12 or p-type impurity layers 121 are formed on the boundary portions between sources/drains 10 and the field oxide film 2 in portions deeper than the sources/drains 10. Even if metal silicide layers such as Co silicide layers 11 extend into portions under the field oxide film 2 or end portions of the field oxide film 2 are eroded, therefore, the metal silicide layers 11 are not directly connected to a p well 3 or an n well 31 or the channel cut injection layer 41, and the distances between pn junctions formed by the sources/ drains 10 and the p well 3 or the n well 31 and end portions of the metal silicide layers 11 are not reduced, whereby the reliability of an element operation is improved such that the leakage current is suppressed while maintaining the depths of the sources/drains 10.

Further, the area of the channel cut injection layer 41 which is formed only under the field oxide film 2 is reduced to reduce the junction capacity, whereby it is possible to attain a high-speed operation. In addition, the channel cut injection layer 41 is prevented from influencing a threshold voltage, whereby reliability of the element is further improved.

Further, p-type impurity layers 51 or n-type impurity layers 52 are formed to enclose n-type extension layers 9 or p-type extension layers 91, whereby punch-through is suppressed, and the semiconductor device may be provided with no or only a low-concentration channel injection layer. Thus, increase of the junction capacity and the junction leakage current is suppressed and the load is reduced, to effectively enable a high-speed circuit operation.

Figure 41:
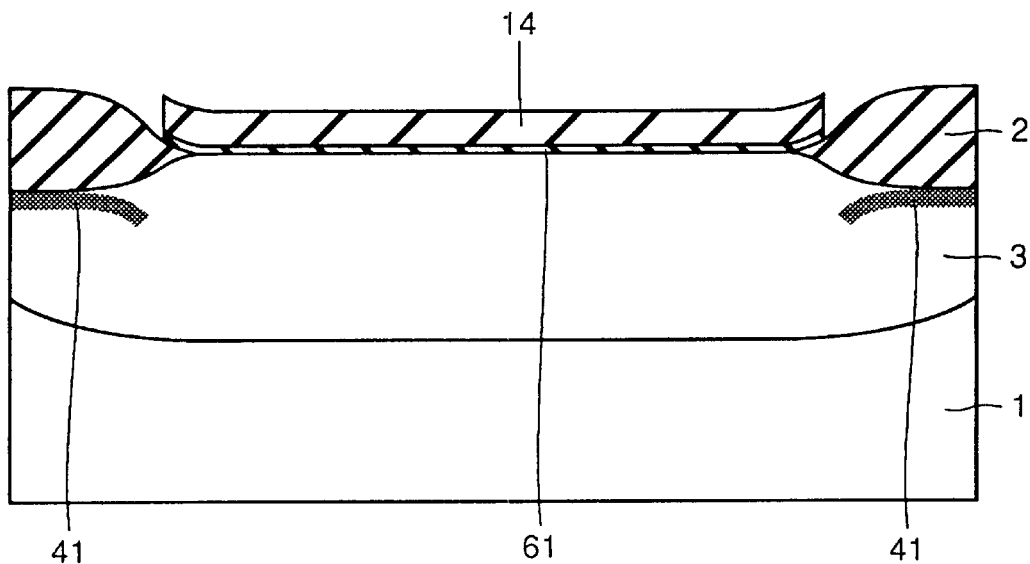
FIGS. 41 and 42 are sectional views of the element showing steps of a method of fabricating the semiconductor device according to the embodiment 6 of the present invention.
Figure 42:
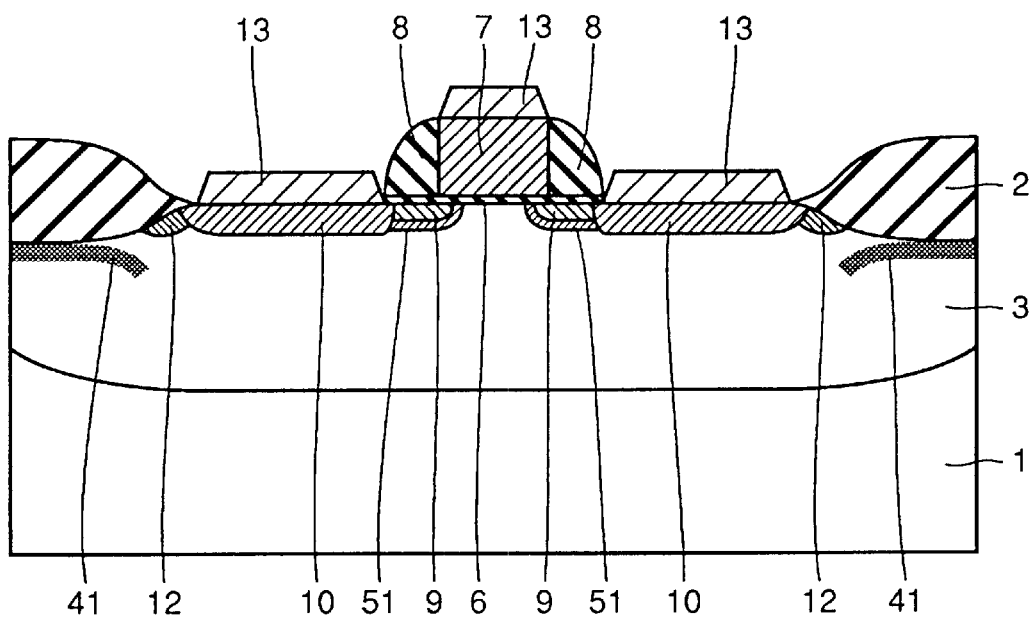

FIGS. 41 and 42 are sectional views showing steps of a method of fabricating the semiconductor device according to the embodiment 6.

Similarly to the embodiment 5, the field oxide film 2 is formed through masks of an oxide film 61 of about 200 Å and a silicon nitride film 14 of about 1000 Å, and thereafter boron is vertically ion-implanted into the overall surface at about 100 keV and in about $1\times10^{12}$ to $1\times10^{13}/cm^2$ in case of the nMOS transistor for forming the channel cut injection layer 41, as shown in FIG. 41.

Thereafter the oxide film 61 and the silicon nitride film 14 are removed, and the p well 3, a gate insulator film 6, a gate electrode 7, the n-type extension layers 9, the p-type impurity layers 51, side walls 8 and the sources/drains 10 are formed similarly to the embodiment 5.

Similarly to the embodiment 5, silicon layers 13 of about 1000 Å are formed by selective epitaxial growth on the gate electrode 7 and the sources/drains 10 exposing silicon on surfaces thereof, and employed as masks for forming the n-type impurity layers 12, as shown in FIG. 42. Then the silicon layers 13 are removed by etching, and thereafter the Co silicide layers 11 are formed.

Also in case of the pMOS transistor, the semiconductor device is fabricated similarly to the nMOS transistor. In this case, the channel cut injection layer 41 is formed by vertically ion-implanting phosphorus at about 350 keV and in about $1\times10^{12}$ to $1\times10^{13}/cm^2$.

Similarly to the embodiment 5, the sources/drains 10 may be formed after removing the silicon layers 13 by etching. Further, the silicon layers 13 may be left unremoved if the thicknesses thereof are about 300 Å. In this case, the ion implantation for forming the sources/drains 10 is performed after formation of the silicon layers 13. Thus, the silicon layers 13 formed on the surfaces of the sources/drains 10 define parts of the sources/drains 10, and that on the surface of the gate electrode 7 defines a part of the gate electrode 7.

Each of the nMOS and PMOS transistors may be provided with a channel injection layer 5 having an impurity concentration about half that in the embodiment 1 in an injection concentration about half that in the embodiment 1, and the impurity concentrations of the channel injection layer 5 and the channel cut injection layer 41 have peaks with respect to the direction of depth from the surface of the substrate 1.

According to this method of fabricating a semiconductor device, the n-type impurity layers 12 or the p-type impurity layers 121 are formed in a self-aligned manner on the surface of the semiconductor substrate 1 under the end portions of the field oxide film 2 by the silicon layers 13 formed in a self-aligned manner on the surfaces of the gate electrode 7 and the sources/drains 10 and the field oxide film 2 having a large thickness on its central portion and a small thickness on its end portions. Thus, it is possible to obtain a method of fabricating a semiconductor device which is improved in reliability of its element operation through simplified steps.

Further, the n-type impurity layers 12 or the p-type impurity layers 121 are formed on the boundary portions between the sources/drains 10 and the field oxide film 2 in portions deeper than the sources/drains 10. Even if the metal silicide layers such as the Co silicide layers 11 extend into portions under the field oxide film 2 or end portions of the field oxide film 2 are eroded, therefore, the metal silicide layers 11 are not directly connected to the p well 3 or the n well 31 or the channel cut injection layer 41, and the distances between pn junctions formed by the sources/drains 10 and the p well 3 or the n well 31 and end portions of the metal silicide layers 11 are not reduced, whereby it is possible to obtain a method of fabricating a semiconductor device which is improved in reliability of its element operation such that the leakage current is suppressed while maintaining the depths of the sources/drains 10.

In addition, the p-type impurity layers 51 or the n-type impurity layers 52 are formed to enclose the n-type extension layers 9 or the p-type extension layers 91, whereby punch-through is suppressed, and the semiconductor device may be provided with no or only a low-concentration channel injection layer. Thus, increase of the junction capacity and the junction leakage current is suppressed and the load is reduced, whereby it is possible to obtain a method of fabricating a semiconductor device enabling a high-speed circuit operation.

Further, the area of the channel cut injection layer 41 is reduced to reduce the junction capacity, whereby it is possible to obtain a method of fabricating a semiconductor device which can attain a high-speed operation. In addition, the channel cut injection layer 41 is prevented from influencing a threshold voltage, whereby it is possible to obtain a method of fabricating a semiconductor device further improved in element reliability.

Figure 43:
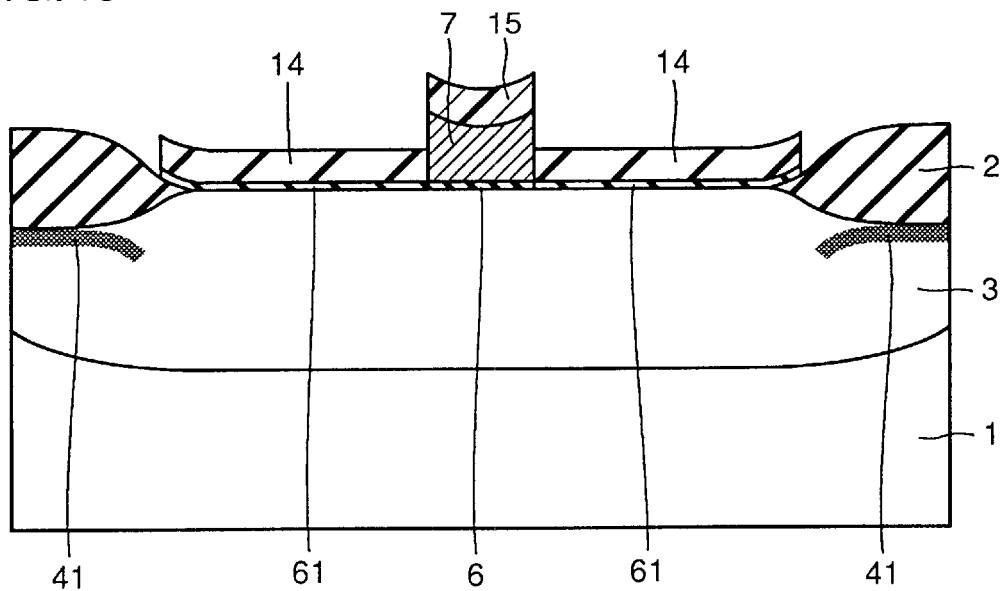
FIG. 43 is a sectional view of the element showing a step of another method of fabricating the semiconductor device according to the embodiment 6 of the present invention.

FIG. 43 is a sectional view showing the element in a step of another method of fabricating the semiconductor device according to the embodiment 6.

First, the field oxide film 2 is formed similarly to the embodiment 5, and thereafter boron is vertically ion-implanted into the overall surface through masks of an oxide film 61 of about 200 Å and a silicon nitride film 14 of about 3000 Å at about 100 keV and in about $1\times10^{12}$ to $1\times10^{13}/cm^2$ in case of the nMOS transistor, for forming the channel cut injection layer 41.

Then, the silicon nitride film 14 is anisotropically etched to about 1000 Å at a sufficient selection ratio to the oxide film 61, and the p well 3 is formed in the active region enclosed with the field oxide film 2, similarly to the embodiment 5.

As shown in FIG. 43, the silicon nitride film 14 and the oxide film 61 are partially removed from a gate electrode forming region similarly to the embodiment 1, the gate insulator film 6 is formed by thermal oxidation, and a polysilicon layer 71 is formed on the overall surface. Thereafter the polysilicon layer 71 is etched through a resist film 15 serving as a mask formed on the gate electrode forming region, for forming the gate electrode 7.

The resist film 15 is removed, and thereafter the n-type impurity layers 12 are formed on the boundary portions between the active region and the field oxide film 2 except portions under the gate electrode 7. Thereafter the silicon nitride film 14 is removed by etching.

Then, the n-type extension layers 9, the p-type impurity layers 51, the side walls 8, the sources/drains 10 and the Co silicide layers 11 are formed similarly to the embodiment 5.

Also in case of the pMOS transistor, the semiconductor device is fabricated similarly to the nMOS transistor. In this case, the channel cut injection layer 41 is formed by vertically ion-implanting phosphorus at about 350 keV and in about $1\times10^{12}$ to $1\times10^{13}$/cm$^2$.

Each of the nMOS and pMOS transistors may be provided with a channel injection layer 5 having an impurity concentration about half that in the embodiment 1 in an injection concentration about half that in the embodiment 1, and the impurity concentrations of the channel injection layer 5 and the channel cut injection layer 41 have peaks with respect to the direction of depth from the surface of the substrate 1.

According to this method of fabricating a semiconductor device, the n-type impurity layers 12 or the p-type impurity layers 121 are formed in a self-aligned manner on the surface of the semiconductor substrate 1 under the end portions of the field oxide film 2 by the silicon nitride film 14 formed for forming the field oxide film 2. Thus, it is possible to obtain a method of fabricating a semiconductor device which is improved in reliability of its element operation through simplified steps.

Further, the n-type impurity layers 12 or the p-type impurity layers 121 are formed on the boundary portions between the sources/drains 10 and the field oxide film 2 in portions deeper than the sources/drains 10. Even if the metal silicide layers such as the Co silicide layers 11 extend into portions under the field oxide film 2 or end portions of the field oxide film 2 are eroded, therefore, the metal silicide layers 11 are not directly connected to the p well 3 or the n well 31 or the channel cut injection layer 41, and the distances between pn junctions formed by the sources/drains 10 and the p well 3 or the n well 31 and end portions of the metal silicide layers 11 are not reduced, whereby it is possible to obtain a method of fabricating a semiconductor device which is improved in reliability of its element operation such that the leakage current is suppressed while maintaining the depths of the sources/drains 10.

In addition, the p-type impurity layers 51 or the n-type impurity layers 52 are formed to enclose the n-type extension layers 9 or the p-type extension layers 91, whereby punch-through is suppressed, and the semiconductor device may be provided with no or only a low-concentration channel injection layer. Thus, increase of the junction capacity and the junction leakage current is suppressed and the load is reduced, whereby it is possible to obtain a method of fabricating a semiconductor device enabling a high-speed circuit operation.

Further, the area of the channel cut injection layer 41 is reduced to reduce the junction capacity, whereby it is possible to obtain a method of fabricating a semiconductor device which can attain a high-speed operation. In addition, the channel cut injection layer 41 is prevented from influencing a threshold voltage, whereby it is possible to obtain a method of fabricating a semiconductor device further improved in element reliability.

While each transistor is enclosed with the isolation insulator film in the embodiment 6, a plurality of transistors may alternatively be present in the active region enclosed with the isolation region.

Embodiment 7

Figure 44:
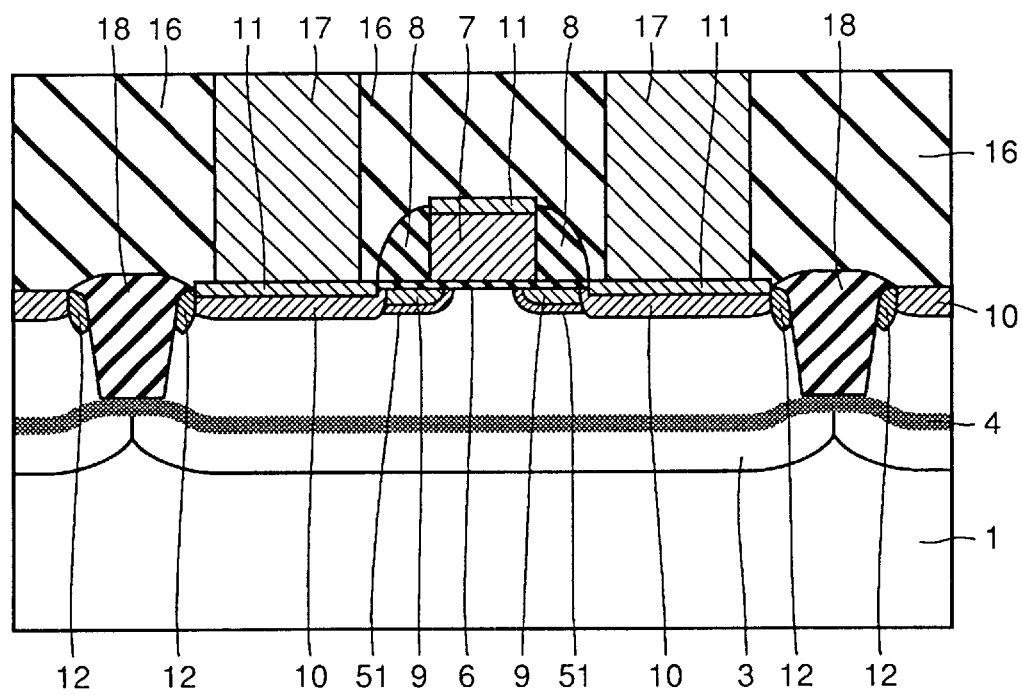
FIG. 44 is a sectional view showing an element of a semiconductor device according to an embodiment 7 of the present invention.

FIG. 44 shows an nMOS transistor element, and the boron concentration of a p well 3 is about $1\times10^{17}$ to $1\times10^{18}$/cm$^3$, the boron peak concentration of a channel cut injection layer 4 is about $1\times10^{17}$ to $1\times10^{18}$/cm$^3$, the boron concentration of p-type impurity layers 51 is about $1\times10^{17}$ to $1\times10^{18}$/cm$^3$, the arsenic concentrations of n-type extension layers 9 and sources/drains 10 are about $1\times10^{18}$ to $1\times10^{19}$/cm$^3$ and about $1\times10^{21}$ to $1\times10^{22}$/cm$^3$ respectively, and the phosphorus concentration of n-type impurity layers 12 is about $1\times10^{18}$ to $1\times10^{19}$/cm$^3$.

A gate voltage, a source voltage, a drain voltage and a substrate voltage are applied to a gate electrode 7, the first and second ones of the sources/drains 10 and the p well 3 respectively, thereby forming a channel between the sources/drains 10 to feed a current. While depletion layers extend between the sources/drains 10 and the n-type impurity layers 12 and the p well 3 at this time, these depletion layers are not connected to Co silicide layers 11 due to the n-type impurity layers 12 formed on end portions of the Co silicide layers 11 closer to an isolation region.

The silicide layers 11 may be prepared from Ni, Ti, W or Pt, in place of Co. While the n-type impurities may be prepared from any of arsenic, phosphorus and antimony, the sources/drains 10 and the n-type extension layers 9 are prepared from arsenic which is hard to diffuse, and the n-type impurity layers 12 are prepared from phosphorus which is easy to diffuse. Thus, the sources/drains 10 and the n-type extension layers 9 can be shallowly formed for suppressing punch-through, while the n-type impurity layers 12 can be deeply formed for further suppressing a leakage current.

Figure 45:
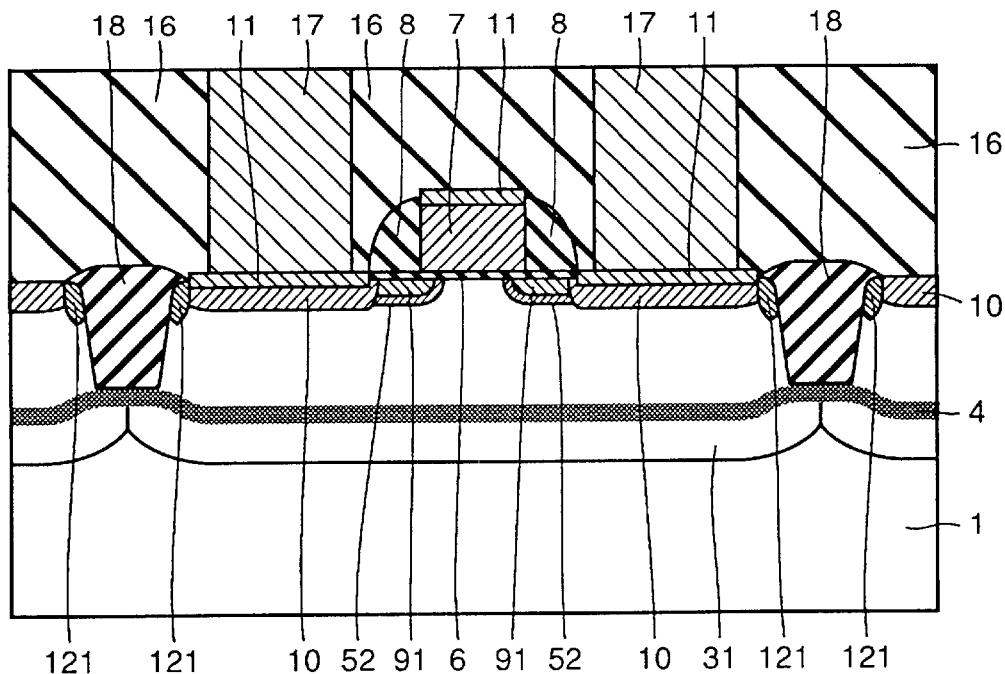
FIG. 45 is a sectional view showing another element of the semiconductor device according to the embodiment 7 of the present invention.

FIG. 45 shows a pMOS transistor element, and the arsenic concentration of an n well 31 is about $1\times10^{17}$ to $1\times10^{18}$/cm$^3$, the arsenic peak concentration of a channel cut injection layer 4 is about $1\times10^{17}$ to $1\times10^{18}$/cm$^3$, the arsenic concentration of n-type impurity layers 52 is about $1\times10^{17}$ to $1\times10^{18}$/cm$^3$, the boron concentrations of p-type extension layers 91 and sources/drains 10 are about $1\times10^{18}$ to $1\times10^{19}$/cm$^3$ and about $1\times10^{21}$ to $1\times10^{22}$/cm$^3$ respectively, and the boron concentration of p-type impurity layers 121 is about $1\times10^{18}$ to $1\times10^{19}$/cm$^3$.

The material for Co silicide layers 11 may be prepared from Ni, Ti, W or Pt in place of Co, while the p-type impurities may be prepared from any of boron, boron fluoride and indium.

Also in the pMOS transistor, voltages are applied to form a channel between the sources/drains 10 for feeding a current, similarly to the nMOS transistor. In this case, depletion layers extend between the sources/drains 10 and the p-type impurity layers 121 and the n well 31. On end portions of the Co silicide layers 11 closer to an isolation region, however, the depletion layers are not connected to the Co silicide layers 11, due to the formation of the p-type impurity layers 121.

Each of the nMOS and pMOS transistors may be provided with a channel injection layer having an impurity concentration about half that in the embodiment 1.

According to this semiconductor device, the n-type impurity layers 12 or the p-type impurity layers 121 are formed on the boundary portions between the sources/drains 10 and a buried oxide film 18 in portions deeper than the sources/drains 10. Even if the metal silicide layers such as the Co silicide layers 11 extend into portions under the buried oxide film 18 or end portions of the buried oxide film 18 are eroded, therefore, the metal silicide layers 11 are not directly connected to the p well 3 or the n well 31, and the distances between pn junctions formed by the sources/drains 10 and the p well 3 or the n well 31 and end portions of the metal silicide layers 11 are not reduced, whereby the reliability of an element operation is improved such that the leakage current is suppressed while maintaining the depths of the sources/drains 10.

Further, the p-type impurity layers 51 or the n-type impurity layers 52 are formed to enclose the n-type extension layers 9 or the p-type extension layers 91, whereby punch-through is suppressed, and the semiconductor device may be provided with no or only a low-concentration channel injection layer. Thus, increase of the junction capacity and the junction leakage current is suppressed and the load is reduced, to effectively enable a high-speed circuit operation.

Figure 46:
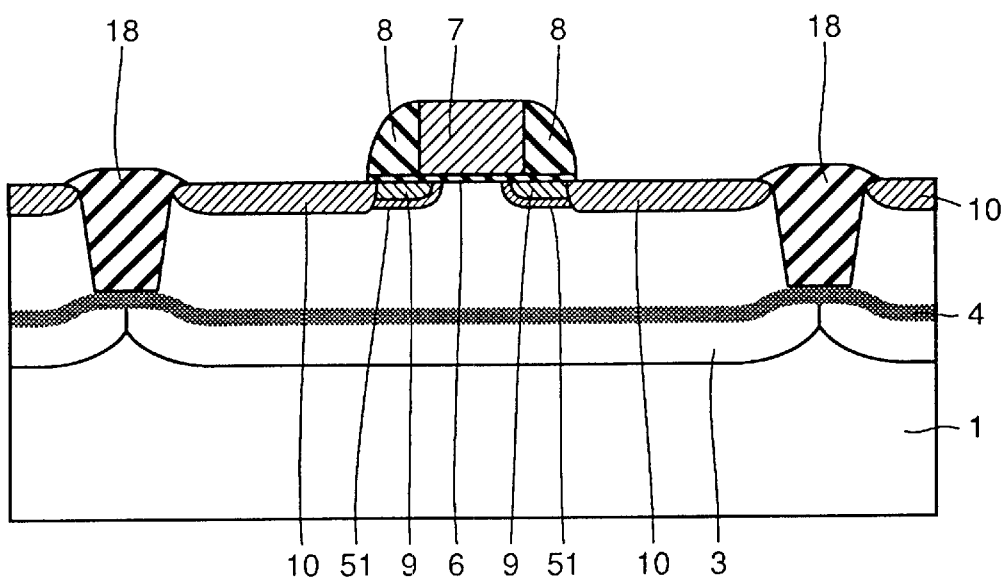
FIGS. 46 and 47 are sectional views of the element showing steps of a method of fabricating the semiconductor device according to the embodiment 7 of the present invention.
Figure 47:
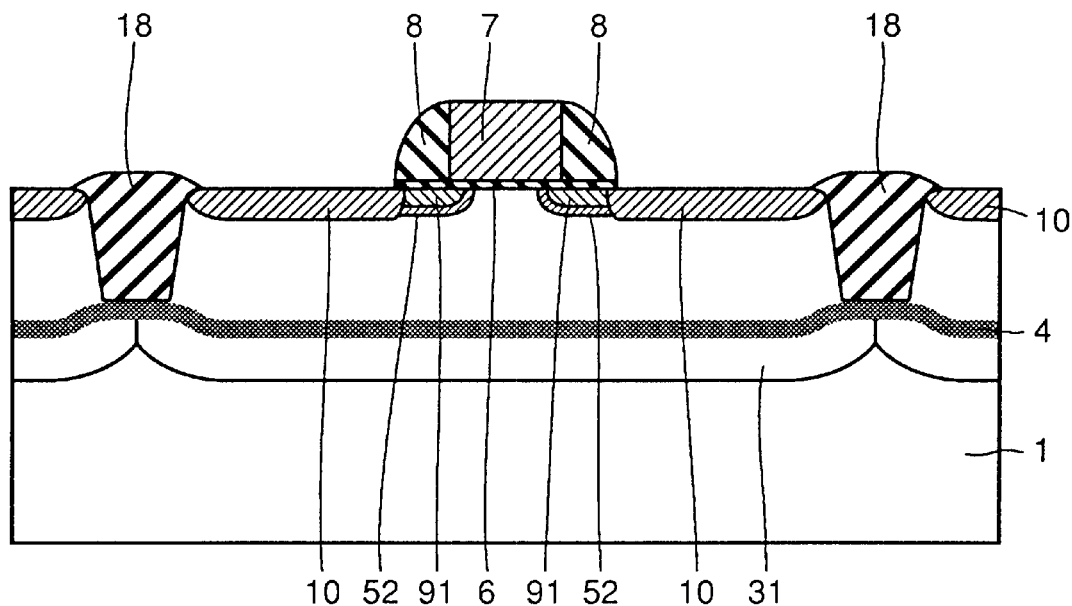

FIGS. 46 and 47 are sectional views showing steps of a method of fabricating the semiconductor device according to the embodiment 7.

Similarly to the embodiment 3, a trench of 3000 Å in depth is formed on a surface of an active region of the semiconductor substrate 1, and filled up with a TEOS oxide film 181, for forming the buried oxide film 18.

Then, the p well 3, a gate insulator film 6, a gate electrode 7 and the n-type extension layers 9 are formed similarly to the embodiment 3, and boron is rotationally ion-implanted at 45° at about 5 to 30 keV and in about $1\times10^{13}$ to $1\times10^{14}/cm^2$ for forming the p-type impurity layers 51, and thereafter side walls 8 and the sources/drains 10 are formed as shown in FIG. 46. The p-type impurity layers 51 and the n-type extension layers 9 may be formed in reversed order.

Similarly to the embodiment 3, silicon layers 13 of about 1000 Å are formed by selective epitaxial growth on the gate electrode 7 and the sources/drains 10 exposing silicon on surfaces thereof, and employed as masks for forming the n-type impurity layers 12. Then the silicon layers 13 are removed by etching, and thereafter the Co silicide layers 11 are formed.

Also in case of the PMOS transistor, the field oxide film 2 and the n well 31 are formed similarly to the embodiment 3. Then the gate insulator film 6, the gate electrode 7 and the p-type extension layers 91 are formed, phosphorus is rotationally ion-implanted at 7° at about 5 to 60 keV and in about $1\times10^{13}$ to $1\times10^{14}/cm^2$ for forming the n-type impurity layers 52, and thereafter the side walls 8 and the sources/drains 10 are formed. The n-type impurity layers 52 and the p-type extension layers 91 may be formed in reversed order.

Similarly to the embodiment 3, the sources/drains 10 may be formed after removing the silicon layers 13 by etching. Further, the silicon layers 13 may be left unremoved if the thicknesses thereof are about 300 Å. In this case, the ion implantation for forming the sources/drains 10 is performed after formation of the silicon layers 13. Thus, the silicon layers 13 formed on the surfaces of the sources/drains 10 define parts of the sources/drains 10, and that on the surface of the gate electrode 7 defines a part of the gate electrode 7.

Each of the nMOS and pMOS transistors may be provided with a channel injection layer 5 having an impurity concentration about half that in the embodiment 1 in an injection concentration about half that in the embodiment 1, and the impurity concentrations of the channel injection layer 5 and the channel cut injection layer 4 have peaks with respect to the direction of depth from the surface of the substrate 1.

According to this method of fabricating a semiconductor device, the n-type impurity layers 12 or the p-type impurity layers 121 are formed in a self-aligned manner on the surface of the semiconductor substrate 1 under the end portions of the buried oxide film 18 by the silicon layers 13 formed in a self-aligned manner on the surfaces of the gate electrode 7 and the sources/drains 10 and the buried oxide film 18 having a large thickness on its central portion and a small thickness on its end portions. Thus, it is possible to obtain a method of fabricating a semiconductor device which is improved in reliability of its element operation through simplified steps.

Further, the n-type impurity layers 12 or the p-type impurity layers 121 are formed on the boundary portions between the sources/drains 10 and the buried oxide film 18 in portions deeper than the sources/drains 10. Even if the metal silicide layers such as the Co silicide layers 11 extend into portions under the buried oxide film 18 or end portions of the buried oxide film 18 are eroded, therefore, the metal silicide layers 11 are not directly connected to the p well 3 or the n well 31, and the distances between pn junctions formed by the sources/drains 10 and the p well 3 or the n well 31 and end portions of the metal silicide layers 11 are not reduced, whereby it is possible to obtain a method of fabricating a semiconductor device which is improved in reliability of its element operation such that the leakage current is suppressed while maintaining the depths of the sources/drains 10.

In addition, the p-type impurity layers 51 or the n-type impurity layers 52 are formed to enclose the n-type extension layers 9 or the p-type extension layers 91, whereby punch-through is suppressed, and the semiconductor device may be provided with no or only a low-concentration channel injection layer. Thus, increase of the junction capacity and the junction leakage current is suppressed and the load is reduced, whereby it is possible to effectively obtain a method of fabricating a semiconductor device enabling a high-speed circuit operation.

Figure 48:
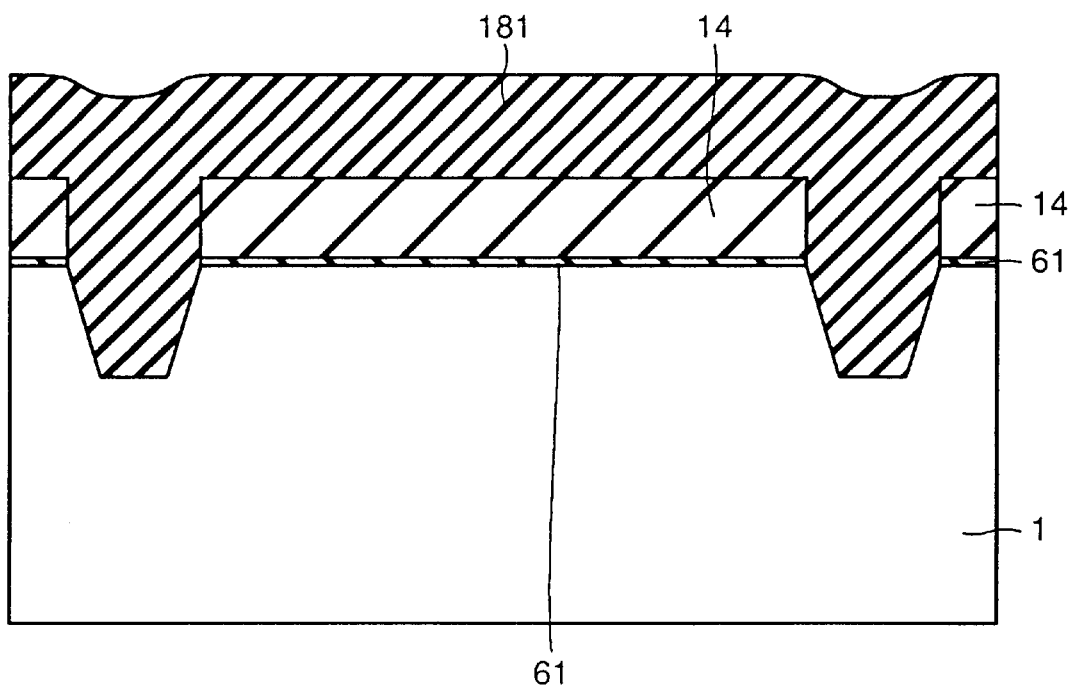
FIGS. 48 and 49 are sectional views of the element showing steps of another method of fabricating the semiconductor device according, to the embodiment 7 of the present invention.
Figure 49:
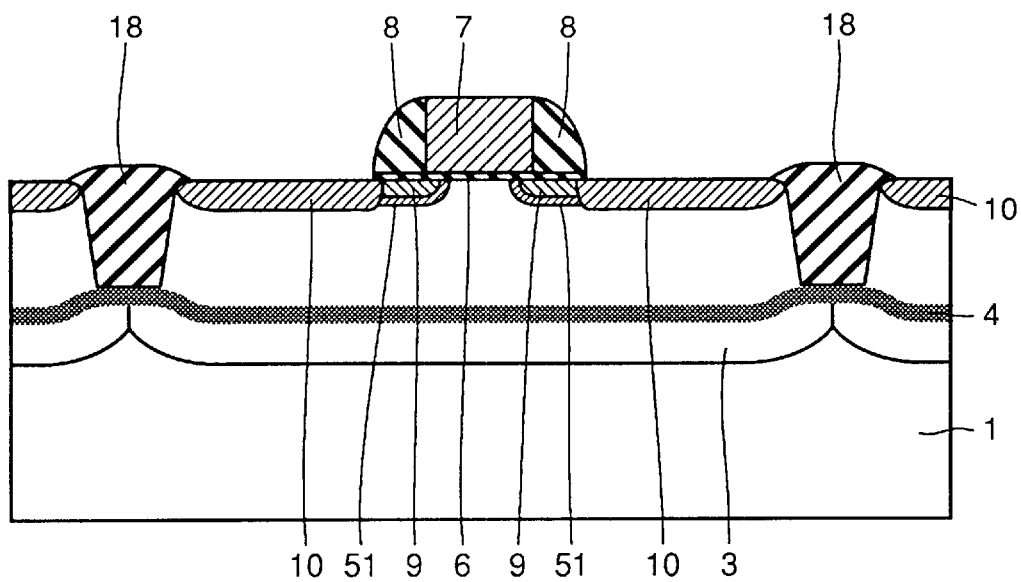

FIGS. 48 and 49 are sectional views showing the element in steps of another method of fabricating the semiconductor device according to the embodiment 7.

As shown in FIG. 48, an oxide film 61 of about 300 Å and a silicon nitride film 14 of about 2000 Å are formed on the surface of the active region of the semiconductor substrate 1 and partially removed by dry etching through a mask for opening an isolation region. An exposed part of the semiconductor substrate 1 is dry-etched from its surface, for forming a trench of 3000 Å in depth. Thereafter a TEOS oxide film 181 is formed on the overall surface in a thickness of about 7000 Å.

Similarly to the embodiment 3, the TEOS oxide film 181 is etched back to expose a surface of the silicon nitride film 14, thereafter the p well 3 and the channel cut injection layer 4 are formed, the silicon nitride film 14 and the oxide film 61 are partially removed from the gate electrode forming region through a mask, and the mask is removed. Thereafter the gate insulator film 6 is formed by thermal oxidation, a polysilicon layer 71 is formed on the overall surface, and etched through a resist film 15 serving as a mask formed on the gate electrode forming region, for forming the gate electrode 7. Thereafter the resist film 15 is removed.

Similarly to the embodiment 3, the oxide film 61 is etched with a material having a high selection ratio to the silicon nitride film 14, for forming the n-type impurity layers 12 on the boundary portions between the active region and the buried oxide film 18 except portions under the gate electrode 7. The silicon nitride film 14 is removed, and thereafter the oxide film 61 and an upper portion of the TEOS oxide film 181 are removed by etching, for forming the buried oxide film 18.

Then, the gate insulator film 6, the gate electrode 7 and the n-type extension layers 9 are formed similarly to the embodiment 3, thereafter the side walls 8 and the sources/drains 10 are formed, and the Co silicide layers 11 are formed, as shown in FIG. 49. The p-type impurity layers 51 and the n-type extension layers 9 may be formed in reversed order.

Also in case of the pMOS transistor, the p-type extension layers 91 are formed similarly to the nMOS transistor and thereafter phosphorus is rotationally ion-implanted at 7° at about 5 to 60 keV and in about $1 \times 10^{13}$ to $1 \times 10^{14}/cm^2$ for forming the n-type impurity layers 52, similarly to the embodiment 5. The n-type impurity layers 52 and the p-type extension layers 91 may be formed in reversed order.

Each of the nMOS and pMOS transistors may be provided with a channel injection layer 5 having an impurity concentration about half that in the embodiment 1 in an impurity concentration about half that in the embodiment 1, and the impurity concentrations of the channel injection layer 5 and the channel cut injection layer 4 have peaks with respect to the direction of depth from the surface of the substrate 1.

According to this method of fabricating a semiconductor device, the n-type impurity layers 12 or the p-type impurity layers 121 are formed on the boundary portions between the sources/drains 10 and the buried oxide film 18 in portions deeper than the sources/drains 10. Even if the metal silicide layers such as the Co silicide layers 11 extend into portions under the buried oxide film 18 or end portions of the buried oxide film 18 are eroded, therefore, the metal silicide layers 11 are not directly connected to the p well 3 or the n well 31, and the distances between pn junctions formed by the sources/drains 10 and the p well 3 or the n well 31 and end portions of the metal silicide layers 11 are not reduced, whereby it is possible to obtain a method of fabricating a semiconductor device which is improved in reliability of its element operation such that the leakage current is suppressed while maintaining the depths of the sources/drains 10.

Further, the p-type impurity layers 51 or the n-type impurity layers 52 are formed to enclose the n-type extension layers 9 or the p-type extension layers 91, whereby punch-through is suppressed, and the semiconductor device may be provided with no or only a low-concentration channel injection layer. Thus, increase of the junction capacity and the junction leakage current is suppressed and the load is reduced, whereby it is possible to effectively obtain a method of fabricating a semiconductor device enabling a high-speed circuit operation.

While each transistor is enclosed with the isolation insulator film in the embodiment 7, a plurality of transistors may alternatively be present in the active region enclosed with the isolation region.

Embodiment 8

Figure 50:
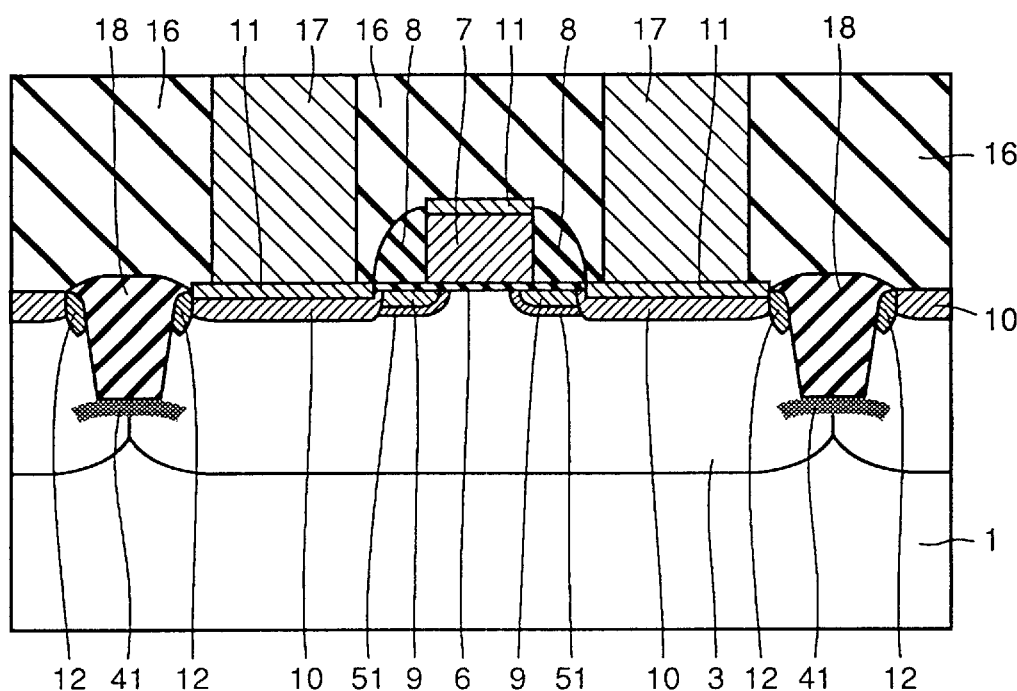
FIG. 50 is a sectional view showing an element of a semiconductor device according to an embodiment 8 of the present invention.

FIG. 50 shows an nMOS transistor element. This semiconductor device is different from that shown in FIG. 44 in a point that a channel cut injection layer 41 is formed not in an active region but only under a buried oxide film 18. The boron peak concentration of this channel cut injection layer 41 is about $1 \times 10^{17}$ to $1 \times 10^{18}/cm^3$.

Also in case of a PMOS transistor, the semiconductor device is different from that of the embodiment 7 in a point that a channel cut injection layer 41 is formed not in an active region but only under a buried oxide film 18, and the channel cut injection layer 41 has an arsenic peak concentration of about $1 \times 10^{17}$ to $1 \times 10^{18}/cm^3$.

Each of the nMOS and pMOS transistors may be provided with a channel injection layer having an impurity concentration about half that in the embodiment 1.

According to this semiconductor device, n-type impurity layers 12 or p-type impurity layers 121 are formed on the boundary portions between sources/drains 10 and the buried oxide film 18 in portions deeper than the sources/drains 10. Even if metal silicide layers such as Co silicide layers 11 extend into portions under the buried oxide film 18 or end portions of the buried oxide film 18 are eroded, therefore, the metal silicide layers 11 are not directly connected to a p well 3 or an n well 31, the distances between pn junctions formed by the sources/drains 10 and the p well 3 or the n well 31 and end portions of the metal silicide layers 11 are not reduced, and the reliability of an element operation is improved such that the leakage current is suppressed while maintaining the depths of the sources/drains 10.

Further, the area of the channel cut injection layer 41 formed only under the buried oxide film 18 is further reduced to reduce the junction capacity, whereby a high-speed operation can be effectively attained. In addition, the channel cut injection layer 41 is prevented from influencing a threshold voltage, whereby the reliability of the element is further improved.

In addition, p-type impurity layers 51 or n-type impurity layers 52 are formed to enclose n-type extension layers 9 or p-type extension layers 91, whereby punch-through is suppressed, and the semiconductor device may be provided with no or only a low-concentration channel injection layer. Thus, increase of the junction capacity and the junction leakage current is suppressed and the load is reduced, to enable a high-speed circuit operation.

Figure 51:
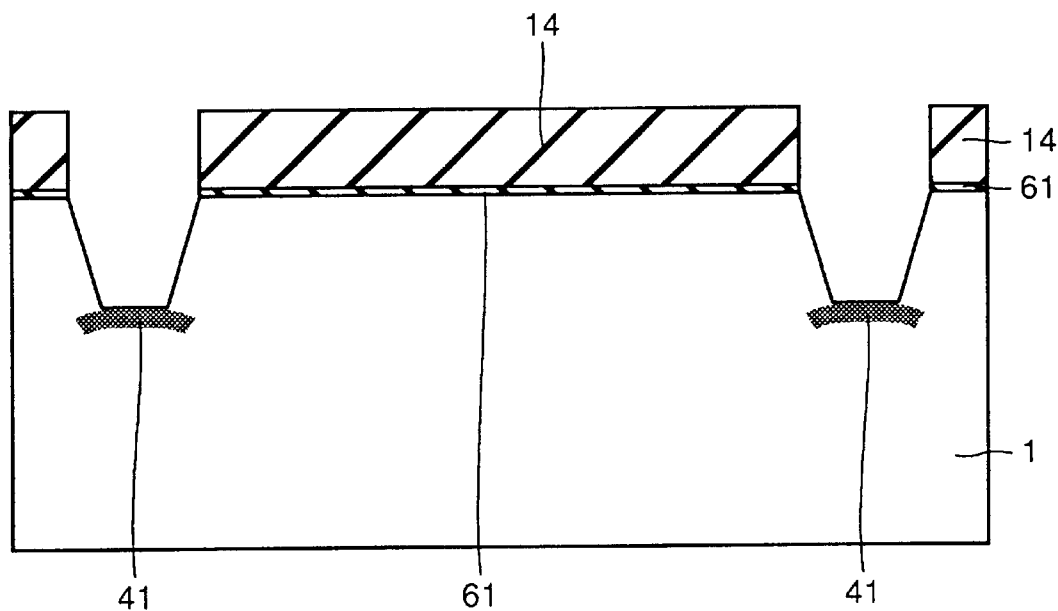
FIGS. 51 and 52 are sectional views of the element showing steps of a method of fabricating the semiconductor device according to the embodiment 8 of the present invention.
Figure 52:
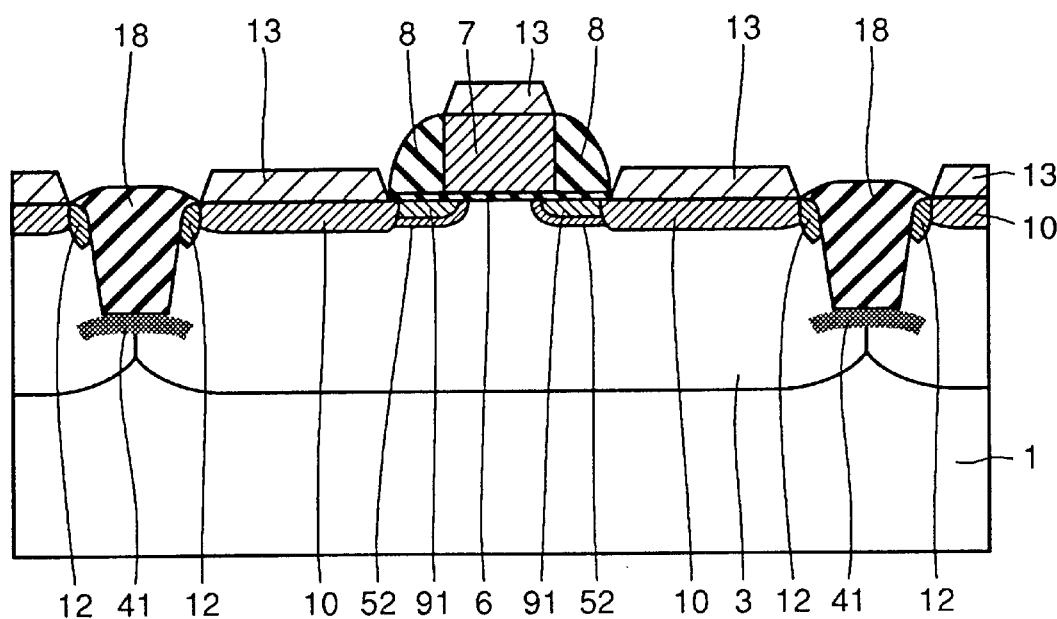

FIGS. 51 and 52 are sectional views showing the element in steps of a method of fabricating the semiconductor device according to the embodiment 8.

First, an oxide film 61 of about 300 Å and a silicon nitride film 14 of about 2000 Å are formed on a surface of an active region of a semiconductor substrate 1, and partially removed by dry etching through a mask for opening an isolation region, and thereafter an exposed part of the semiconductor substrate 1 is dry-etched from its surface, for forming a trench of 3000 Å in depth, similarly to the embodiment 3.

Then, boron is vertically ion-implanted into the overall surface at about 5 to 10 keV and in about $1 \times 10^{12}$ to $1 \times 10^{13}/cm^2$ in case of the nMOS transistor for forming the channel cut injection layer 41, as shown in FIG. 51. Thereafter the buried oxide film 18 is formed similarly to the embodiment 3.

The p well 3, a gate insulator film 6, a gate electrode 7 and the n-type extension layers 9 are formed similarly to the embodiment 3, thereafter the p-type impurity layers 51 are formed similarly to the embodiment 7, and side walls 8 and the sources/drains 10 are formed. The p-type impurity layers 51 and the n-type extension layers 9 may be formed in reversed order.

Similarly to the embodiment 3, silicon layers 13 of about 1000 Å are formed by selective epitaxial growth on the gate electrode 7 and the sources/drains 10 exposing silicon on surfaces thereof, and employed as masks for forming the n-type impurity layers 12, as shown in FIG. 52. Then the silicon layers 13 are removed by etching, and thereafter the Co silicide layers 11 are formed.

Also in case of the pMOS transistor, a gate insulating film 6, a gate electrode and the p-type extension layers 91 are formed similarly to the nMOS transistor, thereafter phosphorus is rotationally ion-implanted at 7° at about 5 to 60 keV and in about $1 \times 10^{13}$ to $1 \times 10^{14}/cm^2$ for forming the n-type impurity layers 52, and side walls 8 and the sources/drains 10 are formed. The n-type impurity layers 52 and the p-type extension layers 91 may be formed in reversed order.

Similarly to the embodiment 3, the sources/drains 10 may be formed after removing the silicon layers 13 by etching.

Further, the silicon layers 13 may be left unremoved if the thicknesses thereof are about 300 Å. In this case, the ion implantation for forming the sources/drains 10 is performed after formation of the silicon layers 13. Thus, the silicon layers 13 formed on the surfaces of the sources/drains 10 define parts of the sources/drains 10, and that on the surface of the gate electrode 7 defines a part of the gate electrode 7.

Each of the nMOS and pMOS transistors may be provided with a channel injection layer 5 having an impurity concentration about half that in the embodiment 1 in an injection concentration about half that in the embodiment 1, and the impurity concentrations of the channel injection layer 5 and the channel cut injection layer 41 have peaks with respect to the direction of depth from the surface of the substrate 1.

According to this method of fabricating a semiconductor device, the n-type impurity layers 12 or the p-type impurity layers 121 are formed in a self-aligned manner on the surface of the semiconductor substrate 1 under end portions of the buried oxide film 18 by the silicon layers 13 formed on the surfaces of the gate electrode 7 and the sources/drains 10 in a self-aligned manner and the buried oxide film 18 having a large thickness on its central portion and small thicknesses on end portions. Therefore, a method of fabricating a semiconductor device improved in reliability of its element operation can be obtained through simplified steps.

Further, the n-type impurity layers 12 or the p-type impurity layers 121 are formed on the boundary portions between the sources/drains 10 and the buried oxide film 18 in portions deeper than the sources/drains 10. Even if the metal silicide layers such as the Co silicide layers 11 extend into portions under the buried oxide film 18 or end portions of the buried oxide film 18 are eroded, therefore, the metal silicide layers 11 are not directly connected to the p well 3 or the n well 31, and the distances between pn junctions formed by the sources/drains 10 and the p well 3 or the n well 31 and end portions of the metal silicide layers 11 are not reduced, whereby it is possible to obtain a method of fabricating a semiconductor device which is improved in reliability of its element operation such that the leakage current is suppressed while maintaining the depths of the sources/drains 10.

In addition, the p-type impurity layers 51 or the n-type impurity layers 52 are formed to enclose the n-type extension layers 9 or the p-type extension layers 91, whereby punch-through is suppressed, and the semiconductor device may be provided with no or only a low-concentration channel injection layer. Thus, increase-of the junction capacity and the junction leakage current is suppressed and the load is reduced, whereby it is possible to obtain a method of fabricating a semiconductor device which is further improved in element reliability.

Further, the area of the channel cut injection layer 41 is reduced to reduce the junction capacity, whereby it is possible to obtain a method of fabricating a semiconductor device which can attain a high-speed operation. In addition, the channel cut injection layer 41 is prevented from influencing a threshold voltage, whereby it is possible to obtain a method of fabricating a semiconductor device which is further improved in element reliability.

Figure 53:
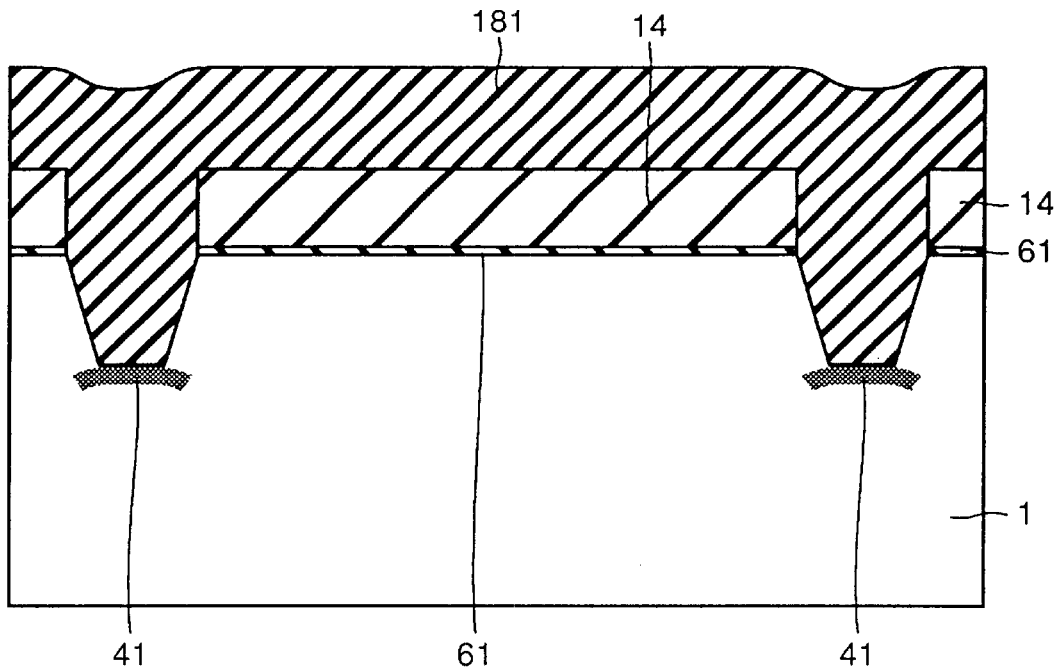
FIGS. 53 and 54 are sectional views of the element showing steps of another method of fabricating the semiconductor device according to the embodiment 8 of the present invention.
Figure 54:
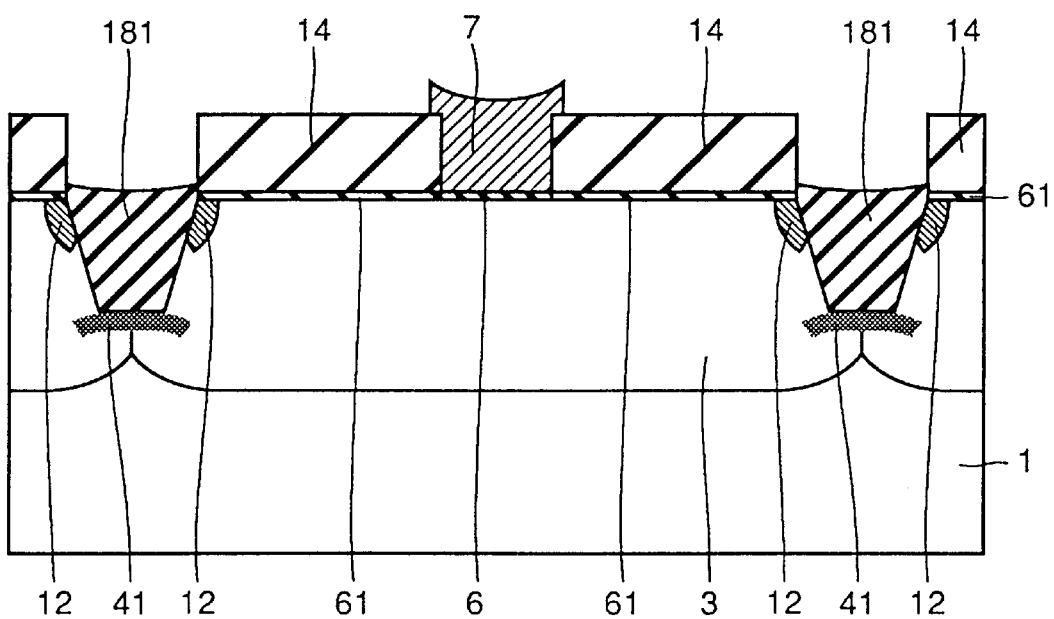
Figure 55:
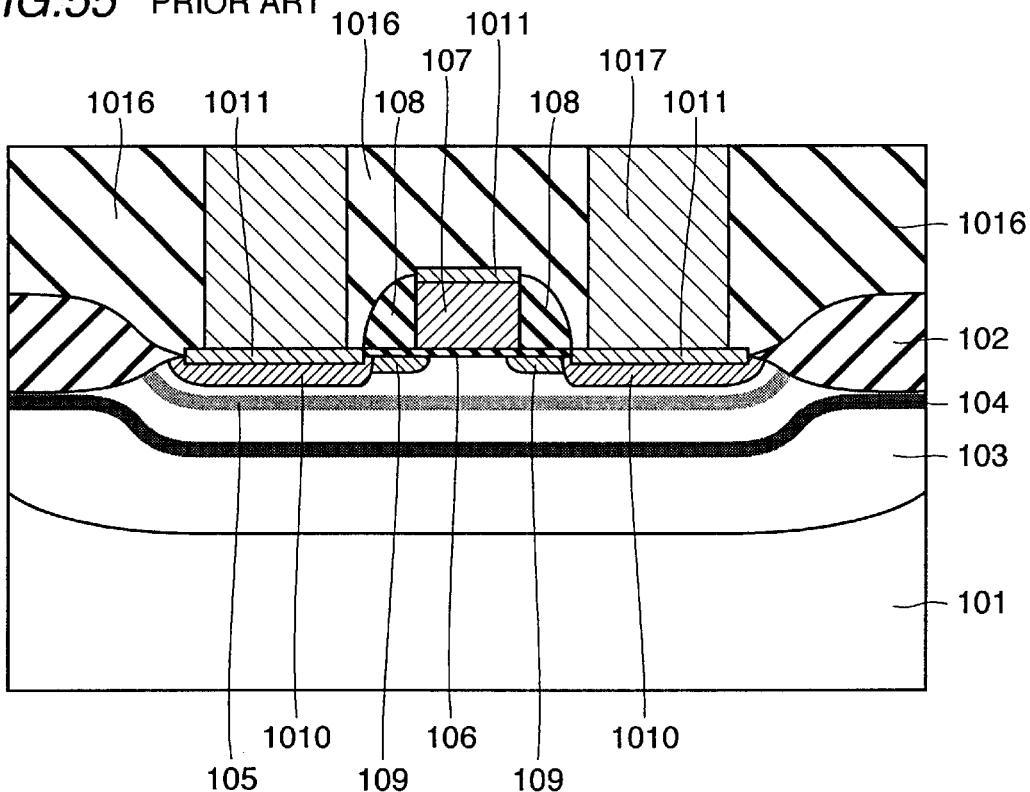
FIG. 55 is a sectional view showing an element of a conventional semiconductor device.
Figure 56:
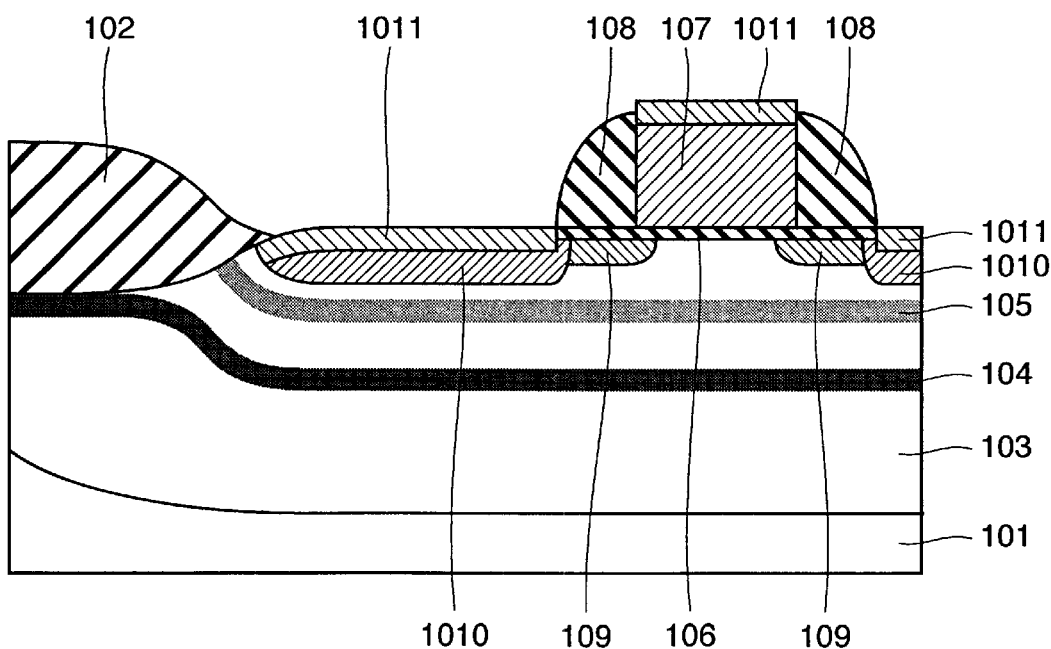
FIG. 56 is a sectional view showing the element of the conventional semiconductor device.
Figure 57:
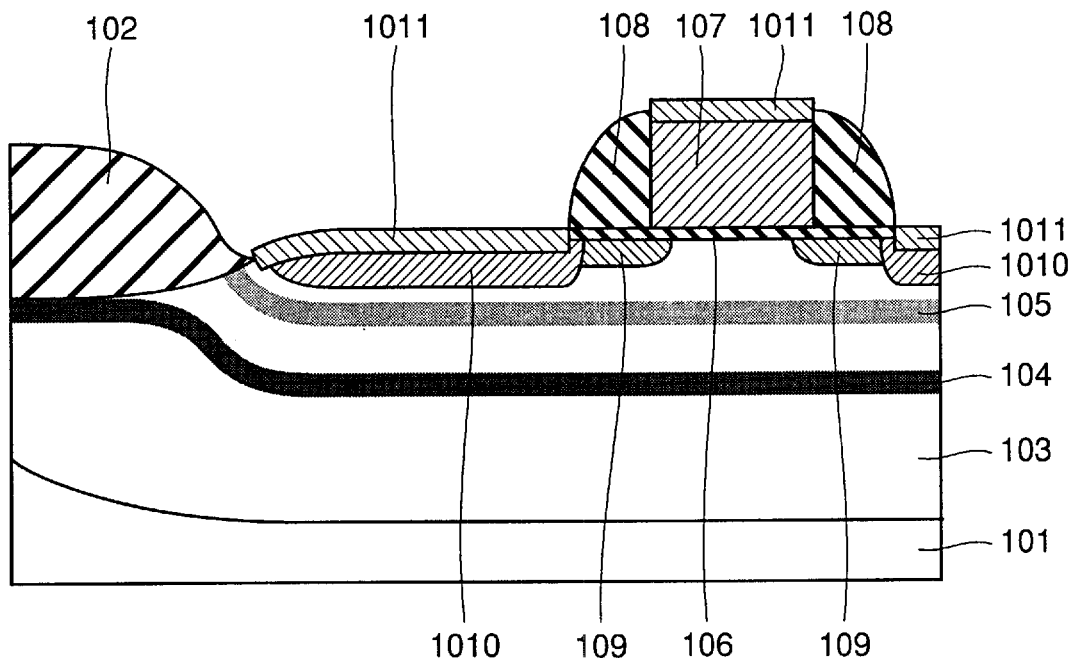
FIG. 57 is a sectional view showing the element of the conventional semiconductor device.
Figure 58:
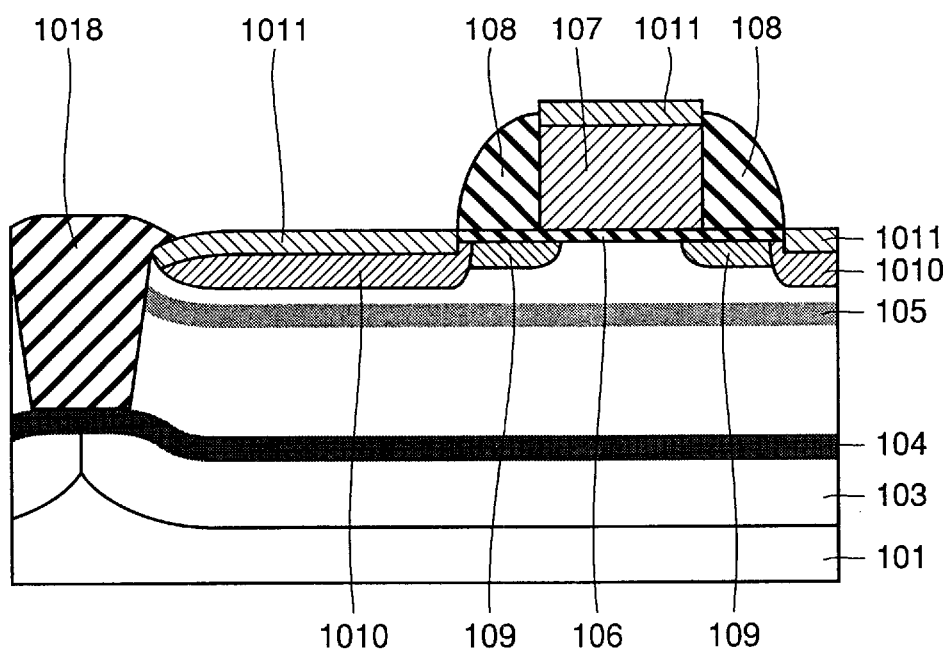
FIG. 58 is a sectional view showing an element of another conventional semiconductor device.
Figure 59:
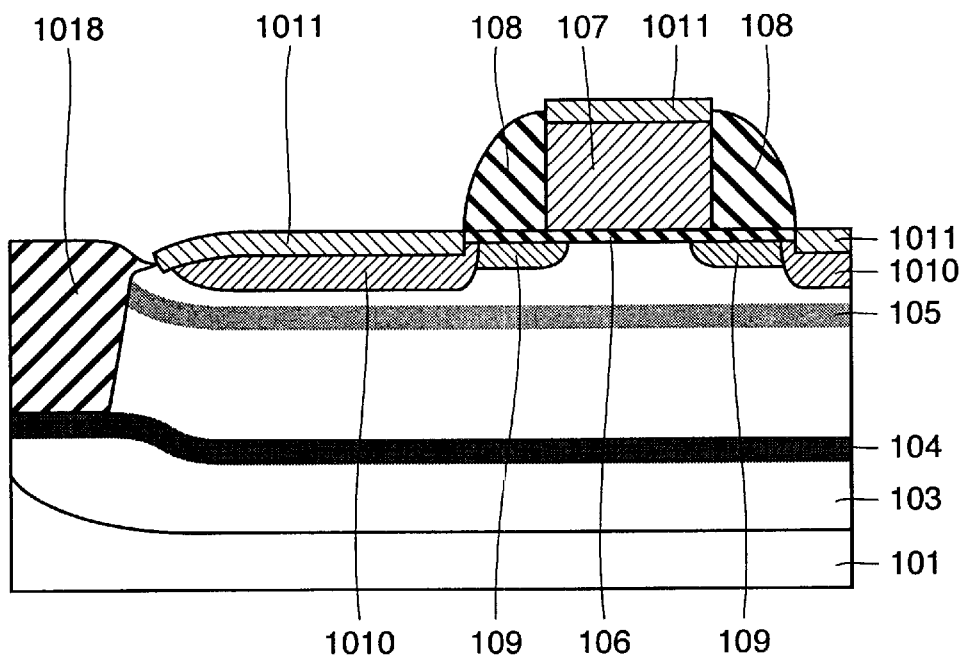
FIG. 59 is a sectional view showing the element of the conventional semiconductor device.
Figure 60:
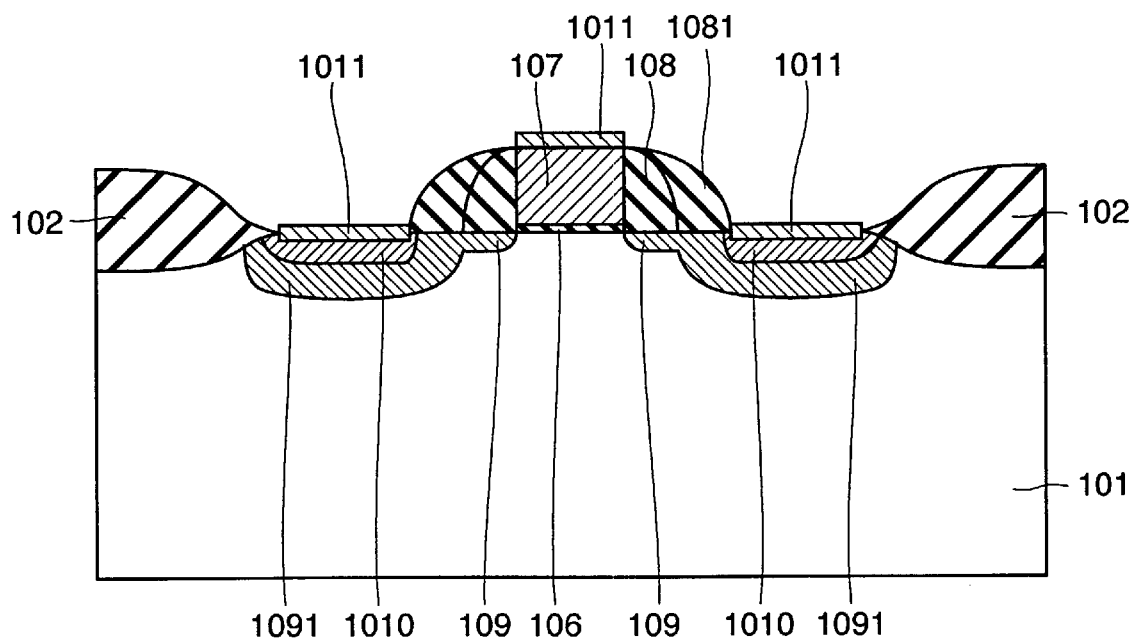
FIG. 60 is a sectional view showing an element of still another conventional semiconductor device.

FIGS. 53 and 54 are sectional views showing the element in steps of another method of fabricating the semiconductor device according to the embodiment 8.

As shown in FIG. 53, an oxide film 61 of about 300 Å and a silicon nitride film 14 of about 2000 Å are formed on the surface of the active region of the semiconductor substrate 1 and partially removed by dry etching through a mask for opening an isolation region. Thereafter an exposed part of the semiconductor substrate 1 is dry-etched from its surface, for forming a trench of 3000 Å in depth. Thereafter boron is vertically ion-implanted into the overall surface at about 5 to 10 keV and in about $1 \times 10^{12}$ to $1 \times 10^{13}/cm^2$ for forming the channel cut injection layer 41. A TEOS oxide film 181 is formed on the overall surface in a thickness of about 7000 Å.

Similarly to the embodiment 3, the TEOS oxide film 181 is etched back to expose a surface of the silicon nitride film 14, and thereafter the p well 3 is formed.

Similarly to the embodiment 3, the silicon nitride film 14 and the oxide film 61 are partially removed from the gate electrode forming region through a mask, the mask is removed, and the gate insulator film 6 is formed by thermal oxidation, a polysilicon layer 71 is formed on the overall surface, and etched through a resist film 15 serving as a mask formed on the gate electrode forming region, for forming the gate electrode 7. Thereafter the resist film 15 is removed.

As shown in FIG. 54, the oxide film 61 is etched with a material having a high selection ratio to the silicon nitride film 14, for forming the n-type impurity layers 12 on the boundary portions between the active region and the buried oxide film 18 except portions under the gate electrode 7. The silicon nitride film 14 is removed, and thereafter the oxide film 61 and an upper portion of the TEOS oxide film 181 are removed by etching, for forming the buried oxide film 18.

Then, the gate insulator film 6, the gate electrode 7, the n-type extension layers 9, the p-type impurity layers 51, the side walls 8 and the sources/drains 10 are formed, and thereafter the Co silicide layers 11 are formed, similarly to the embodiment 3.

Also in case of the pMOS transistor, the gate insulator film 6, the gate electrode 7, the p-type extension layers 91 and the n-type impurity layers 52 are formed similarly to the nMOS transistor, and the side walls 8 and the sources/drains 10 are formed.

Each of the nMOS and PMOS transistors may be provided with a channel injection layer 5 having an impurity concentration about half that in the embodiment 1 in an injection concentration about half that in the embodiment 1, and the impurity concentrations of the channel injection layer 5 and the channel cut injection layer 4 have peaks with respect to the direction of depth from the surface of the substrate 1.

According to this method of fabricating a semiconductor device, the n-type impurity layers 12 or the p-type impurity layers 121 are formed in a self-aligned manner on the surface of the semiconductor substrate 1 under end portions of the buried oxide film 18 by the silicon nitride film 14 formed for forming the buried oxide film 18. Therefore, a method of fabricating a semiconductor device improved in reliability of its element operation can be obtained through simplified steps.

Further, the n-type impurity layers 12 or the p-type impurity layers 121 are formed on the boundary portions between the sources/drains 10 and the buried oxide film 18 in portions deeper than the sources/drains 10. Even if the metal silicide layers such as the Co silicide layers 11 extend into portions under the buried oxide film 18 or end portions of the buried oxide film 18 are eroded, therefore, the metal silicide layers 11 are not directly connected to the p well 3 or the n well 31, and the distances between pn junctions formed by the sources/drains 10 and the p well 3 or the n well 31 and end portions of the metal silicide layers 11 are not reduced, whereby it is possible to obtain a method of fabricating a semiconductor device which is improved in reliability of its element operation such that the leakage current is suppressed while maintaining the depths of the sources/drains 10.

In addition, the p-type impurity layers 51 or the n-type impurity layers 52 are formed to enclose the n-type extension layers 9 or the p-type extension layers 91, whereby punch-through is suppressed, and the semiconductor device may be provided with no or only a low-concentration channel injection layer. Thus, increase of the junction capacity and the junction leakage current is suppressed and the load is reduced, whereby it is possible to obtain a method of fabricating a semiconductor device enabling a high-speed circuit operation.

Further, the area of the channel cut injection layer 41 is reduced to reduce the junction capacity, whereby it is possible to obtain a method of fabricating a semiconductor device which can attain a high-speed operation. In addition, the channel cut injection layer 41 is prevented from influencing a threshold voltage, whereby it is possible to obtain a method of fabricating a semiconductor device further improved in element reliability.

While each transistor is enclosed with the isolation insulator film in the embodiment 8, a plurality of transistors may alternatively be present in the active region enclosed with the isolation region.

Due to the aforementioned structure, the semiconductor device according to the present invention has the following effects:

In the semiconductor device according to the present invention, the first impurity layers of the same conductivity type as the sources/drains are formed on the boundary portions between the sources/drains and the field oxide film in portions deeper than the sources/drains. Even if the metal compound layers extend into portions under the isolation insulator film or end portions of the isolation insulator film are eroded, therefore, the metal compound layers are not connected to the semiconductor substrate. Thus, reliability of the element operation is improved such that the leakage current is suppressed while maintaining the depths of the sources/drains.

Further, the second impurity layer of the same conductivity type as the semiconductor substrate is formed to be in contact with the bottom surface of the isolation insulator film, whereby formation of a parasitic transistor can be prevented.

In addition, the second impurity layer is formed only under the isolation insulator film, whereby the area of the second impurity layer is reduced to reduce the junction capacity, a high-speed operation can be attained, and the second impurity layer is prevented from influencing the threshold voltage. Thus, the element reliability is further improved.

Further, the first conductivity type fourth impurity layers are formed to enclose the second conductivity type third impurity layers, whereby punch-through is suppressed, increase of the junction capacity and the junction leakage current is suppressed and the load is reduced, to enable a high-speed circuit operation.

Further, the impurity layers of the same conductivity type as the sources/drains are formed on the boundary portions between the sources/drains and the isolation insulator film in portions deeper than the sources/drains. Even if the metal silicide layers such as Co silicide layers or Ni silicide layers extend into portions under the field oxide film or the buried oxide film, therefore, the metal silicide layers are not connected to the semiconductor substrate. Thus, reliability of the element operation is improved such that the leakage current is suppressed while maintaining the depths of the sources/drains.

Further, the n-type impurity layers are deeply formed by phosphorus which is easy to diffuse for further suppressing the leakage current, while the sources/drains and the n-type extension layers are shallowly formed by arsenic which is hard to diffuse, for suppressing punch-through.

The first impurity layers are formed in a self-aligned manner under end portions of the isolation insulator film by the silicon layers formed on the surfaces of the gate electrode and the sources/drains in a self-aligned manner and the isolation insulator film having a large thickness on its central portion and small thicknesses on end portions, whereby it is possible to obtain a method of fabricating a semiconductor device which is improved in reliability of its element operation through simplified steps.

Further, the second impurity layer of the same conductivity type as the semiconductor substrate is formed in a self-aligned manner to be in contact with the bottom surface of the isolation insulator film, whereby it is possible to obtain a method of fabricating a semiconductor device suppressing formation of a parasitic transistor through simplified steps.

Further, the area of the second impurity layer is reduced to reduce the junction capacity, whereby a method of fabricating a semiconductor device which can attain a high-speed operation can be obtained. In addition, the second impurity layer is prevented from influencing the threshold voltage, whereby it is possible to obtain a method of fabricating a semiconductor device which is further improved in element reliability.

The first conductivity type third impurity layers are formed to enclose the second conductivity type second impurity layers, whereby punch-through is suppressed, increase of the junction capacity and the junction leakage current is suppressed and the load is reduced. Thus, it is possible to obtain a method of fabricating a semiconductor device enabling a high-speed circuit operation.

The first impurity layers are formed in a self-aligned manner under the end portions of the isolation insulator film by the silicon nitride film formed for forming the isolation insulator film, whereby it is possible to obtain a method of fabricating a semiconductor device which is improved in reliability of its element operation through simplified steps.

Further, the second impurity layer of the same conductivity type as the semiconductor substrate is formed in a self-aligned manner to be in contact-with the bottom surface of the isolation insulator film, whereby a method of fabricating a semiconductor device suppressing formation of a parasitic transistor can be obtained through simplified steps.

Further, the area of the second impurity layer is reduced to reduce the junction capacity, whereby a method of fabricating a semiconductor device which can attain a high-speed operation can be obtained. In addition, the second impurity layer is prevented from influencing the threshold voltage, whereby it is possible to obtain a method of fabricating a semiconductor device which is further improved in element reliability.

The first conductivity type third impurity layers are formed to enclose the second conductivity type second impurity layers, whereby punch-through is suppressed, increase of the junction capacity and the junction leakage current is suppressed and the load is reduced. Thus, it is possible to obtain a method of fabricating a semiconductor device enabling a high-speed circuit operation.

Further, the channel injection layer is formed not under the sources/drains but only under the gate electrode in a self-aligned manner, whereby increase of the junction capacity and the junction leakage current is suppressed and the load is reduced. Thus, a high-speed circuit operation is enabled.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
a first conductivity type semiconductor substrate:
   an isolation insulator film formed on an isolation region of a major surface of said semiconductor substrate;
   a second conductivity type source and a second conductivity type drain formed at an active region being enclosed with said isolation region on said major surface of said semiconductor substrate;
   a gate electrode formed on a major surface of said active region through a gate insulator film;
   metal compound layers formed on surfaces of said source and said drain and that of said gate electrode respectively; and
   second conductivity type first impurity layers formed on boundary portions between said source and said drain and said isolation region to be deeper than said source and said drain wherein the first impurity layers have an impurity concentration lower than that of the source and the drain.

2. The semiconductor device in accordance with claim 1, further comprising a first conductivity type second impurity layer being formed to be deeper than said first impurity layers and to be in contact with the bottom surface of said isolation insulator film and having an impurity concentration peak.

3. The semiconductor device in accordance with claim 2, wherein said second impurity layer is formed only under said isolation region.

4. The semiconductor device in accordance with claim 2, further comprising:
   side wall insulator films formed on side surfaces of said gate electrode;
   a pair of second conductivity type third impurity layers formed under said side wall insulator films at said major surface of said active region respectively to be shallower than said source and said drain, and
   first conductivity type fourth impurity layers formed to enclose said third impurity layers respectively.

5. The semiconductor device in accordance with claim 1, wherein said isolation insulator film is at least either a field oxide film or a buried oxide film filling up a trench provided at said major surface of said semiconductor substrate, and said metal compound layers are at least either Co silicide layers or Ni silicide layers.

6. The semiconductor device in accordance with claim 4, wherein said second conductivity type is an n type, said first conductivity type is a p type, said source, said drain and said third impurity layers are made of arsenic, and said first impurity layers are made of phosphorus.

7. The semiconductor device according to claim 1, wherein the metal compound layers are not in direct contact with said region of the first conductivity type of the semiconductor substrate.

* * * * *